（12）United States Patent
Molaire

(10) Patent No.: US 9,859,505 B2
(45) Date of Patent: Jan. 2, 2018

(54) CHARGE-TRANSPORTING MOLECULAR GLASS MIXTURES, LUMINESCENT MOLECULAR GLASS MIXTURES, OR COMBINATIONS THEREOF OR ORGANIC LIGHT EMITTING DIODES AND OTHER ORGANIC ELECTRONICS AND PHOTONICS APPLICATIONS

(71) Applicant: MOLECULAR GLASSES, INC., Rochester, NY (US)

(72) Inventor: Michel Frantz Molaire, Rochester, NY (US)

(73) Assignee: Molecular Glasses, Inc., Rochester, NY (US)

( * ) Notice: Subject to any disclaimer, the term of this patent is extended or adjusted under 35 U.S.C. 154(b) by 272 days.

(21) Appl. No.: 14/467,143

(22) Filed: Aug. 25, 2014

(65) Prior Publication Data

US 2015/0053894 A1    Feb. 26, 2015

Related U.S. Application Data

(60) Provisional application No. 61/869,742, filed on Aug. 25, 2013, provisional application No. 61/869,745, (Continued)

(51) Int. Cl.
*H01L 51/00* (2006.01)
*C09K 11/00* (2006.01)
(Continued)

(52) U.S. Cl.
CPC ............ *H01L 51/007* (2013.01); *C09K 11/06* (2013.01); *H01L 51/0053* (2013.01); (Continued)

(58) Field of Classification Search
CPC .......... C09K 11/00; C09K 11/06; C09K 11/09; H01L 27/00; H01L 27/14; H01L 51/0071; (Continued)

(56) References Cited

U.S. PATENT DOCUMENTS 3,725,070 A    4/1973  Hamb et al.
3,779,750 A    12/1973 Merrill et al.
(Continued)

FOREIGN PATENT DOCUMENTS

WO    WO 2015117100 A1 *  8/2015  ......... H01L 51/5012

OTHER PUBLICATIONS

International Search Report and Written Opinion pertaining to PCT/US2014/052493 dated Jan. 29, 2015.
(Continued)

*Primary Examiner* — Khanh Tuan Nguyen
*Assistant Examiner* — Haidung Nguyen
(74) *Attorney, Agent, or Firm* — Dinsmore & Shohl LLP

(57) ABSTRACT

The present invention provides charge transporting molecular glass mixtures, luminescent molecular glass mixtures, or combinations thereof comprising at least two nonpolymeric compounds each independently corresponding to the structure $(R^1Y^1)_p[(Z^1Y^2)_mR^2Y^3J_nZ^2Y^4R^3$ wherein m is zero or one; n is zero up to an integer at which said compound starts to become a polymer; p is an integer of from one to eight; each $R^1$ and $R^3$ is independently a monovalent aliphatic or cycloaliphatic hydrocarbon group having 1 to 20 carbon atoms, an aromatic group or a multicyclic aromatic nucleus; $R^2$, $Z^1$, and $Z^2$ each independently represent multivalent aliphatic or cycloaliphatic hydrocarbon groups having 1 to 20 carbon atoms or an aromatic group; and $Y^1$, $Y^2$, $Y^3$, and $Y^4$ each independently represent one or more linking groups.

28 Claims, 7 Drawing Sheets

Related U.S. Application Data filed on Aug. 25, 2013, provisional application No. 61/869,747, filed on Aug. 25, 2013.

(51) Int. Cl.
*C09K 11/06* (2006.01)
*H01L 51/50* (2006.01)

(52) U.S. Cl.
CPC .... *H01L 51/0072* (2013.01); *C09K 2211/181* (2013.01); *C09K 2211/186* (2013.01); *H01L 51/5012* (2013.01); *H01L 51/5056* (2013.01); *Y02E 10/549* (2013.01); *Y02P 70/521* (2015.11)

(58) Field of Classification Search
CPC ... H01L 51/0072; H01L 27/142; H01L 27/32; H01L 51/005; H01L 51/006; H01L 51/0062
See application file for complete search history.

(56) References Cited

U.S. PATENT DOCUMENTS

| | | |
|---|---|---|
| 3,803,096 A | 4/1974 | Wilson et al. |
| 3,856,751 A | 12/1974 | Wilson |
| 3,859,097 A | 1/1975 | Hamb et al. |
| 3,859,254 A | 1/1975 | Hamb et al. |
| 3,859,364 A | 1/1975 | Wilson |
| 3,886,124 A | 5/1975 | Wilson |
| 3,897,253 A | 7/1975 | Wilson |
| 3,902,904 A | 9/1975 | Hamb et al. |
| 3,915,939 A | 10/1975 | Wilson |
| 4,395,475 A | 7/1983 | Noonan et al. |
| 4,416,890 A | 11/1983 | Woltersdorf, Jr. |
| 4,499,165 A * | 2/1985 | Molaire ............... C07F 15/045 346/135.1 |
| 4,588,666 A | 5/1986 | Stolka et al. |
| 4,609,606 A | 9/1986 | Noonan et al. |
| 4,626,361 A * | 12/1986 | Molaire ............... C07F 15/045 252/1 |
| 4,992,349 A | 2/1991 | Chen et al. |
| 5,011,939 A | 4/1991 | Limburg et al. |
| 5,176,977 A * | 1/1993 | Molaire ............... C07C 69/017 430/109.4 |
| 5,262,512 A | 11/1993 | Yanus et al. |
| 5,747,204 A | 5/1998 | Anzai et al. |
| 5,976,744 A | 11/1999 | Fuller et al. |
| 7,579,127 B2 | 8/2009 | Molaire |
| 7,629,097 B2 | 12/2009 | Molaire |
| 7,776,500 B2 | 8/2010 | Molaire |
| 2007/0080634 A1 | 4/2007 | Wolk |
| 2007/0292796 A1* | 12/2007 | Molaire ............... G03G 5/142 430/64 |
| 2007/0292799 A1* | 12/2007 | Molaire ............ G03G 9/09307 430/110.2 |
| 2009/0136859 A1* | 5/2009 | Molaire ............ G03G 5/14704 430/58.05 |
| 2010/0104967 A1 | 4/2010 | Ikeda et al. |
| 2011/0129951 A1* | 6/2011 | Kondo ............... H01L 51/0017 438/26 |
| 2011/0279020 A1* | 11/2011 | Inoue ............... C07D 209/82 313/504 |
| 2012/0189347 A1 | 7/2012 | Tong |
| 2015/0069303 A1* | 3/2015 | Eckes ............... C08G 61/12 252/500 |

OTHER PUBLICATIONS

European Search Report pertaining to EP14840140.9 dated May 2, 2017.
Braun et al., "Visible Light Emission from Semiconducting Polymer Diodes", Appl. Phys. Lett., 1991, 58(18), p. 1982, Ameican Institute of Physics.
Cho et al., "Diversification of Carbazoles by LiCl-Mediated Catalytic CuI Reaction", Bull. Korean Chem. Soc., 2011, 32 (7), p. 2461.
Damaceanu et al., "Polymers Containing 1,3,4-Oxadiazole Rings for Advanced Materials", Memoirs of the Scientific Sections of the Romanian Academy, 2011.
Foguth, Alexandra Lee, "Novel Oxadiazole Containing Monomers for Polymeric Light Emitting Devices", Dissertation, 2011, Graduate School of Clemson University.
Gagnon et al., "Triarylamines Designed to Form Molecular Glasses. Derivative of Tris(p-terphenyl-4-yl)amine with Multiple Contiguous Phenyl Substituents", Organic Letters, 2010, 12(3), 404-407, American Chemical Society.
Greczmiel et al., "Polymethacrylates with Pendant Oxadiazole Units Synthesis and Application in Organic LEDs", Macromolecules, 1997, 30, 6042-6046, American Chemical Society.
Kim et al., "Electroluminescenece of Devices Fabricated Using a Soluble Alq3 Pendent Polymer", Journal of Korean Physical Society, 2008, 53, 3563-3567.
Kohle et al., J. Phys. Chem. B, 2010, 114, 16694-16704, American Chemical Society.
Kraft et al., "Electroluminescent Conjugated Polymers —Seeing Polymers in a New Light", Angew. Chem. Int. Ed., 1998, 37, 402-428, Wiley-VCH Verlag GmbH.
Kulkarni et al., "Electron Transport Materials for Organic Light-Emitting Diodes", Chem. Mater., 2004, 16, 4556-4573, American Chemical Society.
Molaire et al., "Organic Monomeric Glasses: A Novel Class of Materials", Journal of Polymer Science: Part A: Polymer Chemistry, 1989, 27, 2569-2592, John Wiley & Sons, Inc.
Molaire, Michel F., "Influence of Melt Viscosity on the Writing Sensitivity of Organic Dye-Binder Optical-Disk Recording Media", Applied Optics, 1988, 27(4), p. 743.
Polikarpov et al., "Achieving High Efficiency in Organic Light-Emitting Devices", Material Matters, vol. 2, Art. 3.
Shirota et al., "Charge Carrier Transporting Molecular Materials and Their Applications in Devices", Chem. Rev., 2007, 107, 953-1010, American Chemical Society.
Zhu et al., "Blue Fluorescent Emitters: Design Tactics and Applications in Organic Light-Emitting Diodes", Chem. Soc. Rev., 2013, 42, 4963-4976, The Royal Society of Chemistry.
Zuniga, Carlos A., "Solution-Processable Charge Transport Layers for Phosphorescent Oleds", 2011, Dissertation, Georgia Institute of Technology.

\* cited by examiner

US 9,859,505 B2

CHARGE-TRANSPORTING MOLECULAR GLASS MIXTURES, LUMINESCENT MOLECULAR GLASS MIXTURES, OR COMBINATIONS THEREOF OR ORGANIC LIGHT EMITTING DIODES AND OTHER ORGANIC ELECTRONICS AND PHOTONICS APPLICATIONS

This non-provisional patent application is being filed by Michel Frantz Molaire of Rochester, N.Y.

CROSS-REFERENCE TO RELATED PATENT APPLICATIONS

Priority for this patent application is based upon provisional patent applications 61/869,742 (filed on Aug. 25, 2013), 61/869,745 (filed on Aug. 25, 2013), and 61/869,747 (filed on Aug. 25, 2013). The disclosure of these United States patent applications are hereby incorporated by reference into this specification.

BACKGROUND OF THE INVENTION

Recently there has been increased interest into molecular glasses that can be coated into amorphous films for applications such as photoresist or molecular optoelectronic devices, including light-emitting diodes, field-effect transistors, and solar cells, as well as in advanced materials for xerography, two-photo absorption, luminescent devices, and photorefraction. One technique that is used in the art is a reverse of the principles of crystal engineering to devise molecules that resist crystallization. Examples of this technique are described in the publications by Eric Gagnon et al: "*Triarylamines Designed to Form Molecular Glasses. Derivatives of Tris (p-terphenyl-4-yl) amine with multiple Contiguous Phenyl Substituents.*" Organic Letters 201, Vol. 12, No. 3, p 404-407.

These molecular glasses produced via reverse crystallization engineering are defined as "amorphous materials in the state of thermodynamic non-equilibrium, and hence, they tend to undergo structural relaxation, exhibiting well-defined glass temperature (Tg's). However they also tend to crystallize on heating above their Tg's, frequently exhibiting polymorphism" (Hari Singh Nalwa, Advanced Functional Molecules and Polymers, Volume 3, CRC Press, 2001— Technology & Engineering; Yashuhiko Shirota and Hiroshi Kageyama, Chem. Rev. 2007, 107, 953-1010). With time, equilibrium will lead to crystallization of these non-equilibrium molecular glasses. Therefore crystallization is still a problem to be solved. When these non-equilibrium molecular glasses crystallize, the performance of a device comprising the non-equilibrium molecular glasses is degraded, limiting device longevity. An additional problem with current small molecule organic light emitting diode (OLED) materials is their solubility; either solubility is limited or requires non-green solvents.

A further issue with molecular glass usage involves fluorescent emitters, particularly blue fluorescent emitters aggregation quenching. To suppress fluorescent quenching, blue fluorescent dyes have been doped in a host matrix. The blending system may intrinsically suffer from the limitation of efficiency and stability, aggregation of dopants and potential phase separation (M. Zhu and C Yang, Chem. Soc. Rev., 2013, 42, 4963). Another method used for blue fluorescent organic light emitting diodes (OLEDs) is nondoped blue fluorescent emitters. Still charge injection and transportation remain a problem.

Molaire in U.S. Pat. No. 4,499,165 disclosed nonpolymeric amorphous mixture of compounds which is useful as a binder in optical recording layers. These mixtures were further used in nonpolymeric amorphous composition and developing processes (U.S. Pat. No. 5,176,977). Monomeric glass mixtures incorporating tetracarbonylbisimide groups were disclosed in U.S. Pat. No. 7,776,500. In U.S. Pat. No. 7,629,097 these mixtures found use in encapsulated toner compositions incorporating organic monomeric glasses. The entire disclosure of each of these United States patents is hereby incorporated by reference into this specification.

There is a need for charge-transporting molecular glasses, luminescent molecular glasses, and combinations thereof that are truly non-crystallizable. There is further need for charge-transporting molecular glasses, luminescent molecular glasses, and combinations thereof with controllable thermal properties, independent of the structure of the charge transport moiety. There are specific needs for charge-transporting molecular glasses, luminescent molecular glasses, and combinations thereof that are relatively inexpensive to manufacture. There is a need to develop host matrix that will prevent phase separation of the guest emitter materials. There is also a need to develop luminescent emitters that will not aggregate in the first place. There is a need for charge-transporting molecular glasses, luminescent molecular glasses, and combinations thereof that are truly non-crystallizable. There is further need for charge-transporting molecular glasses, luminescent molecular glasses, and combinations thereof with large entropy of mixing to allow for complete compatibility of guest emitter materials. There is a further need for charge-transporting molecular glasses, luminescent molecular glasses, and combinations thereof where the polarity of transport can be easily modulated. There is still need for charge-transporting molecular glasses, luminescent molecular glasses, and the like that are bipolar and truly non-crystallizable.

The present invention provides solutions for the above problems.

It is an object of this invention to provide charge-transporting molecular glass mixtures, luminescent molecular glass mixtures, and combinations thereof with the many of the advantages illustrated herein. It is also an object of this invention to provide charge-transporting molecular glass mixtures, luminescent molecular glass mixtures, and combinations thereof that can be purified by simple and economic techniques. In another object of this invention there are provided charge-transporting molecular glass mixtures, luminescent molecular glass mixtures, and combinations thereof that can be easily dissolved in simple organic solvents. It is yet another object of this invention to provide charge-transporting molecular glass mixtures, luminescent molecular glass mixtures, and combinations thereof volatile and stable enough for vacuum deposition coatings. It is a further object of this invention to provide charge-transporting molecular glass mixtures, luminescent molecular glass mixtures, and combinations thereof with both sufficient electron-transporting and hole-transporting properties to support monolayer or simple device configuration.

SUMMARY OF THE INVENTION

Various embodiments of the present invention provide for charge-transporting molecular glass mixtures, luminescent molecular glass mixtures, and combinations thereof with thermal properties that can be controlled independent of the structure of the core charge-transporting group, the luminescent group, or a combination thereof.

The various embodiments used to describe the principles of the present invention are by way of illustration only and should not be construed in any way to limit the scope of the invention. Those skilled in the art will understand that the principles of the present invention may be implemented in any suitably arranged device.

The charge-transporting molecular glass mixtures, the luminescent molecular glass mixtures, and combinations thereof of this invention can be used particularly in light-emitting diodes, organic photovoltaic cells, filed-effect transistors, organic light emitting transistors, organic light emitting chemical cells, electrophotography, and many other applications.

Each of the charge-transporting molecular glass mixture, the luminescent molecular glass mixture, and combinations thereof of this invention are defined as a mixture of compatible organic monomeric molecules with an infinitely low crystallization rate under the most favorable conditions. These mixtures can be formed in a one-part reaction of a multifunctional nucleus with a mixture of substituents. The "non-crystallizability" of the mixture is controlled by the structural dissymmetry of the nucleus, the substituents, or a combination thereof, and the number of components making up the mixture. In cases, where the nucleus is highly symmetric and rigid, the components with similar (nondistinct) substituents might crystallize out under the right conditions. Thus it is advantageous when possible to avoid those components, by designing an asymmetric glass mixture, whereas, all the components of the mixture have distinct substituents. Without being bound to theory, we predict that the asymmetric mixtures are more likely to be fully non-crystallizable.

Increasing the number of components of the glass mixture, by adding more substituents, is another way to enhance the non-crystallizability of glass mixtures having highly symmetric and rigid nuclei.

Finally a glass mixture with partial component crystallization can be stabilized by mixing it with a non-crystallizable glass mixture in the right proportion. The mixing non-crystallizable glass mixture can be charge-transporting, luminescent, or even an inert non-crystallizable glass mixture.

Examples of highly symmetric and rigid nuclei include:

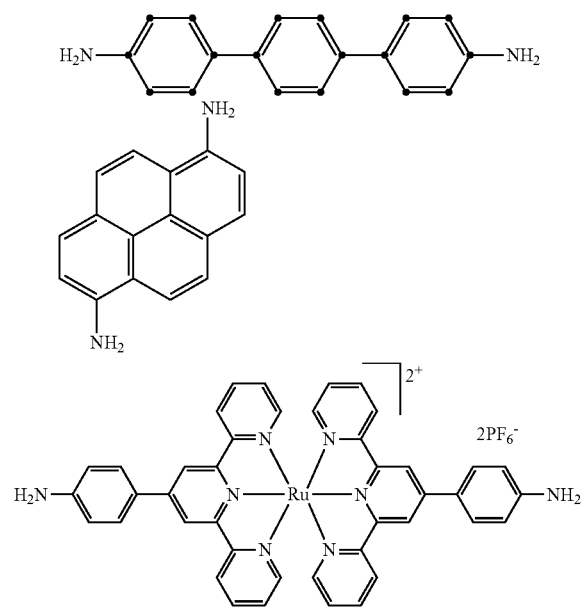

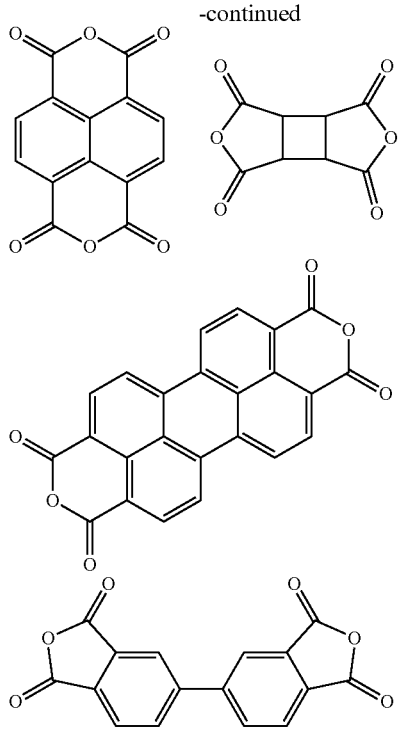

The charge-transporting molecular glass mixtures, luminescent molecular glass mixtures, and combinations thereof like amorphous polymers, have good film-forming properties. However, unlike polymers, they display extremely low melt-viscosities, large positive entropy-of-mixing values, relatively high vapor pressure, and can be ground easily into extremely small particles. These properties make them ideal for certain applications where compatibility, defect-free film forming, melt-flow, vapor deposition coating, and small particle size are important.

The charge-transporting molecular glass mixtures, the luminescent molecular glass mixtures, and combinations thereof of this invention are prepared according to the technique described in M. F. Molaire and Roger Johnson in "Organic Monomeric Glasses: A Novel Class of Materials," Journal Polymer Science, Part A, Polymer Chemistry, Vol. 27, 2569-2592 (1989). These materials are used and described in U.S. Pat. Nos. 4,416,890 and 4,499,165, "Binder-Mixtures for optical Recording Layers and Elements," by Molaire, U.S. Pat. Nos. 7,776,500, 7,629,097, 7,579,127, and 5,176,977, all by Molaire. The entire disclosure of each of these United States patents is hereby incorporated by reference into this specification. Their melt viscosity properties are demonstrated in "Influence of melt viscosity on the Writing Sensitivity of Organic dye-Binder Optical-Disk Recording Media," M. F. Molaire, Applied Optics, Vol. 27 page 743, Feb. 15, 1988.

Charge-transporting molecular glass mixtures, luminescent molecular glass mixtures, and combinations thereof of the invention when properly designed are truly non-crystallizable. Their thermal and other physical properties are tunable independent of the charge transport or luminescent moiety.

BRIEF DESCRIPTION OF THE DRAWINGS

The invention will be described in more details by reference to the drawings, of which

DETAILED DESCRIPTION OF THE INVENTION

Figure 1:
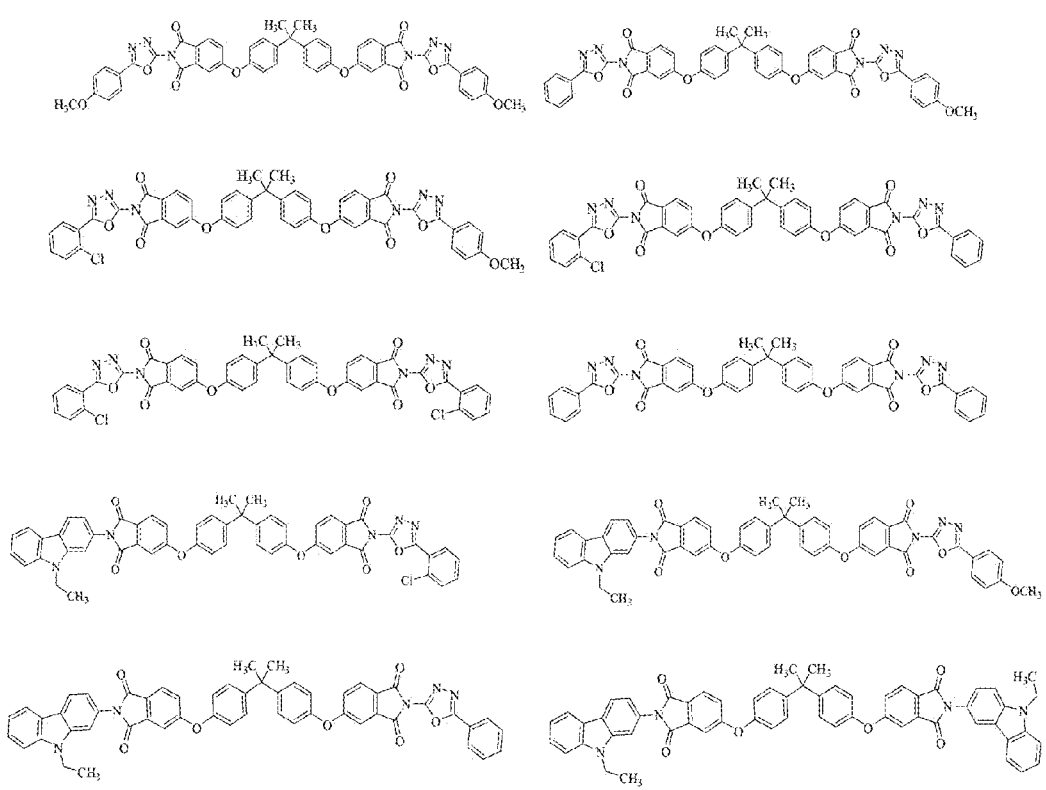
FIG. 1 depicts an example of a non-crystallizable molecular glass mixture of the invention.

Various embodiments of the present invention provide for charge-transporting molecular glass mixtures, luminescent molecular glass mixtures, and combinations thereof with thermal properties that can be controlled independent of the structure of the core charge-transporting group, the luminescent group, or a combination thereof. The various embodiments used to describe the principles of the present invention are by way of illustration only and should not be construed in any way to limit the scope of the invention. Those skilled in the art will understand that the principles of the present invention may be implemented in any suitably arranged device.

DEFINITIONS OF TERMS USED IN THIS APPLICATION

Throughout this document, the following terms will have the following meanings.

The term "amorphous" means that the mixture is non-crystalline. That is, the mixture has no molecular lattice structure.

A "non-equilibrium molecular glass" is a glass forming material that is crystallizable under certain conditions, for example above their glass transition temperature, or in contact with certain solvents.

A "non-crystallizable molecular glass" will never crystallize under any circumstances and is always amorphous.

An "asymmetric glass mixture" is a glass mixture where all the components are asymmetric, i.e. have all distinct substituents.

A "multicyclic aromatic nucleus" is a nucleus comprising at least two cyclic groups one of which is aromatic, including aromatic heterocyclic ring groups. The cyclic group may be substituted with substituents such as aliphatic hydrocarbons, including cycloaliphatic hydrocarbons, other aromatic ring groups such as aryl, and heterocyclic ring groups such as substituted or fused thiazole, oxazole, imide, pyrazole, triazole, oxadiazole, pyridine, pyrimidine, pyrazine, triazine, tetrazine and quinoline groups. The substituents are fused or non-fused and mono or polycyclic. Examples of multicyclic aromatic nuclei include 9,9-bis(4-hydroxy-3,5-dichlorophenyl)fluorene, 4,4'-hexahydro-4,7-methanoindan-5-ylidenebis(2,6-dichlorophenol); 9,9-bis(4-hydroxy-3,5-dibromophenyl(fluorene, 4,4'-hexahydro-4,7-methanoindan-5-ylidenebis(2,6-dibromophenol); 3',3''',5',5'''-tetrabromophenolphthalein, 9,9-bis(4-aminophenyl) fluorene, phenylindandiols; 1,1'-spirobiindandiols, 1,1'-spirobiindandiamines, 2,2'-spirobichromans; 7,7-dimethyl-7H-dibenzo[c,h]xanthenediol; xanthylium salt diols; 9,9-dimethylxanthene-3,6-bis(oxyacetic acids); 4,4'(3-phenyl-1-indanylidene)diphenol and other bisphenols; 3',3''-dibromo-5',5''-dinitro-2',2''-oxaphenolphthalein; 9-phenyl-3-oxo-2,6,7-trihydroxyxanthene; and the like.

"Aliphatic hydrocarbon group" refers to monovalent or divalent, alkanes, alkenes, alkadienes and alkynes having from 1 to 20 carbon atoms. The groups are straight or branched chain and include carbohydrate, carboxylic acid, alcohol, ether aldehyde and ketone functions.

"Cycloaliphatic" refers to cyclic aliphatic hydrocarbon groups. The groups may be substituted with halogen, alkoxy, amide, nitro, esters and aromatic groups.

Exemplary aliphatic groups include methyl, ethyl, propyl, isopropyl, butyl, hexyl, 2-ethylhexyl, methoxyethyl, ethoxycarbonylpropyl, 3-oxobutyl, 3-thiapentyl, furfuryl, 2-thiazolylmethyl, cyclohexylmethyl, benzyl, phenethyl, phenoxyethyl, vinyl (—CH=CH—), 2-methylvinyl, allyl, allylidene, butadienyl, butenylidene, propargyl, and the like.

"Aromatic" and "aromatic heterocyclic" group refers to organic groups which undergo the same type of substitution reaction as benzene. In benzene, substitution reactions are preferred over addition reactions. Such groups preferably have from 6 to about 40 nuclear atoms and are mono- and polycyclic.

Exemplary aromatic groups include quinolinyl, pyrimidinyl, pyridyl, phenyl, tolyl, xylyl, naphthyl, anthryl, triptycenyl, p-chlorophenyl, p-nitrophenyl, p-bromophenyl, 2,4-dichlorophenyl, 2-chlorophenyl, 3,5-dinitrophenyl, p-(tetrabromophthalimido)phenyl, p-(tetrachlorophthalimido)phenyl, p-tetraphenylphthalimido)phenyl, p-naphthalimidophenyl, p-(4-nitrophthalimido)phenyl, p-phthalimidophenyl, 1-hydroxy-2-naphthyl, 3,5-dibromo-4-(4-bromobenzoyloxy)phenyl, 3,5-dibromo-4-(3,5-dinitrobenzoyloxy)phenyl, 3,5-dibromo-4-(1-naphthoyloxy) phenyl, thiazolyl, oxazolyl, imidazolyl, pyrazolyl, triazolyl, oxadiazolyl, pyrazinyl, etc and their corresponding multi-valent and fused ring configurations.

"Green solvents" are non-toxic and benign to environment. A good guide of green solvents can be found in "Green chemistry tools to influence a medicinal chemistry and research chemistry based organization by K. Alfonsi, et al, Green Chem., 2008, 10, 31-36, DOI: 10.1039/b711717e. A list of "preferred", "usable", and undesirable solvents are shown in Table 1. The preferred solvents are considered "greener". The undesirable solvents are to be avoided.

TABLE 1

| Preferred | Usable | Unudesirable |
|---|---|---|
| Water | cyclohexane | pentane |
| acetone | methylcyclohexane | hexane |
| ethanol | toluene | di-isopropyl ether |
| 2-propanol | heptane | diethyl ether |
| 1-propanol | acetonitrile | dichloromethane |
| ethyl acetate | 2-methyltetrahydrofuran | dichloroethane |
| isopropyl acetatete | tetrahydrofuran | dimethyl formamide |
| methanol | xylenes | N-methylpyrrolidone |
| 1-butanol | dimethylsulfoxide | pyridine |
| t-butanol | acetic acis | dimetyl acetamide |
| | ethylene glycol | diaxane |
| | | dimetoxyethane |
| | | benzene |
| | | carbon tetrachloride |

An "electronic device" is any device that uses electrons in its function, input or output. A photonic device is any device that uses photons in its function, input or output.

The present invention provides charge-transporting molecular glass mixtures, luminescent molecular glass mixtures, and combinations thereof comprising at least two nonpolymeric compounds each independently corresponding to the structure of Formula (I), given as $$(R^1Y^1)p[(Z^1Y^2)_m R^2Y_3]_n Z^2Y^4R^3; \quad (I)$$

Wherein m is zero or one, n is zero up to an integer at which said compound starts to become a polymer and p is an integer of from one to eight.

In one embodiment of the invention, each $R^1$ and $R^3$ is independently a monovalent aliphatic or cycloaliphatic hydrocarbon group having 1 to 20 carbon atoms, an aromatic group or a multicyclic aromatic nucleus;

$R^2$, $Z^1$, and $Z^2$ each independently represent multivalent aliphatic or cycloaliphatic hydrocarbon groups having 1 to 20 carbon atoms or an aromatic group where at least one of each $R^2$, $Z^1$ and $Z^2$ is independently a charge transporting moiety, a luminescent moiety, or a combination thereof.

$Y^1$, $Y^2$, $Y^3$, and $Y^4$ each independently represent one or more linking groups such as

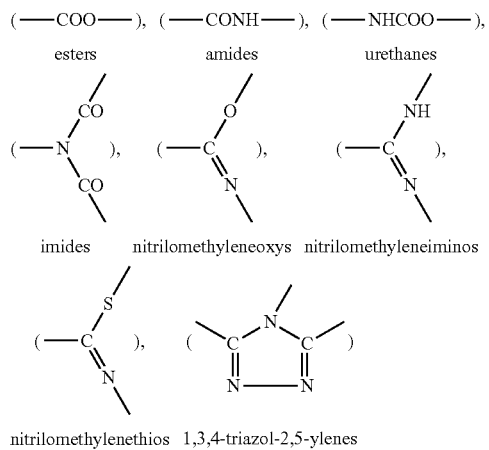

nitrilomethylenethios 1,3,4-triazol-2,5-ylenes wherein R represents alkyl of 1-6 carbon atoms, hydroxyl, amino or aryl such as phenyl and 1,3,4-oxadiazol-2,5-ylenes

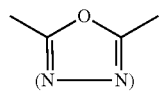

provided that the glass transition temperature (Tg) of the molecular glass mixture is above 20° C.

In a second embodiment of the invention each $R^1$ and $R^3$ is independently a monovalent aliphatic or cycloaliphatic hydrocarbon group having 1 to 20 carbon atoms, an aromatic group or a multicyclic aromatic nucleus where at least one of each $R^1$ and $R^3$ is independently a monovalent charge-transporting moiety, a luminescent moiety, or a combination thereof;

$R^2$, $Z^1$, and $Z^2$ each independently represent multivalent aliphatic or cycloaliphatic hydrocarbon groups having 1 to 20 carbon atoms or an aromatic group; and $Y^1$, $Y^2$, $Y^3$, and $Y^4$ as described in the first embodiment above.

In a third embodiment of the invention each $R^1$ and $R^3$ is independently a monovalent aliphatic or cycloaliphatic hydrocarbon group having 1 to 20 carbon atoms, an aromatic group or a multicyclic aromatic nucleus where at least one of each $R^1$ and $R^3$ is independently a monovalent charge-transporting moiety, a luminescent moiety, or a combination thereof;

$R^2$, $Z^1$, and $Z^2$ each independently represent multivalent aliphatic or cycloaliphatic hydrocarbon groups having 1 to 20 carbon atoms or an aromatic group where at least one of each $R^2$, $Z^1$ and $Z^2$ is independently a charge-transporting moiety, a luminescent moiety, or a combination thereof.

$Y^1$, $Y^2$, $Y^3$, and $Y^4$ are as described in the first embodiment above.

In a fourth embodiment of the invention, each $R^1$ and $R^3$ is independently a monovalent aliphatic or cycloaliphatic hydrocarbon group having 1 to 20 carbon atoms, an aromatic group or a multicyclic aromatic nucleus where at least one of $R^1$ and $R^3$ is independently a monovalent hole-transporting moiety, a luminescent moiety, or a combination thereof;

$R^2$, $Z^1$, and $Z^2$ each independently represent multivalent aliphatic or cycloaliphatic hydrocarbon groups having 1 to 20 carbon atoms or an aromatic group where at least one of each $R^2$, $Z^1$ and $Z^2$ is independently a multivalent electron-transporting moiety, a luminescent moiety, or a combination thereof; and $Y^1$, $Y^2$, $Y^3$, and $Y^4$, are as described in the first embodiment above.

In a fifth embodiment of the invention, each $R^1$ and $R^3$ is independently a monovalent aliphatic or cycloaliphatic hydrocarbon group having 1 to 20 carbon atoms, an aromatic group or a multicyclic aromatic nucleus where at least one of each $R^1$ and $R^3$ is independently a monovalent electron-transporting moiety, a luminescent moiety, or a combination thereof;

$R^2$, $Z^1$, and $Z^2$ each independently represent multivalent aliphatic or cycloaliphatic hydrocarbon groups having 1 to 20 carbon atoms or an aromatic group, where at least one of each $R^2$, $Z^1$ and $Z^2$ is independently a multivalent hole-transporting moiety, a luminescent moiety, or a combination thereof; and $Y^1$, $Y^2$, $Y^3$, and $Y^4$ are as described in the first embodiment above.

In a sixth embodiment of the invention, each $R^1$ and $R^3$ is independently a monovalent aliphatic or cycloaliphatic hydrocarbon group having 1 to 20 carbon atoms, an aromatic group or a multicyclic aromatic nucleus where at least one of each $R^1$ and $R^3$ is independently a monovalent electron-transporting moiety, a luminescent moiety, or a combination thereof; and at least one of each $R^1$ and $R^3$ is independently a monovalent hole-transporting moiety, a luminescent moiety, or a combination thereof;

$R^2$, $Z^1$, and $Z^2$ each independently represent multivalent aliphatic or cycloaliphatic hydrocarbon groups having 1 to 20 carbon atoms or an aromatic group, where at least one of each $R^2$, $Z^1$ and $Z^2$ is independently a multivalent hole-transporting moiety, a luminescent moiety, or a combination thereof; and $Y^1$, $Y^2$, $Y^3$, and $Y^4$ are as described in the first embodiment above.

In a seventh embodiment of the invention each $R^1$ and $R^3$ is independently a monovalent aliphatic or cycloaliphatic hydrocarbon group having 1 to 20 carbon atoms, an aromatic group or a multicyclic aromatic nucleus where at least one of each $R^1$ and $R^3$ is independently a monovalent electron-transporting moiety, a luminescent moiety, or a combination thereof; and at least one of each $R^1$ and $R^3$ is independently a monovalent hole-transporting moiety, a luminescent moiety, or a combination thereof;

$R^2$, $Z^1$, and $Z^2$ each independently represent multivalent aliphatic or cycloaliphatic hydrocarbon groups having 1 to 20 carbon atoms or an aromatic group, where at least one of each $R^2$, $Z^1$ and $Z^2$ is independently a multivalent electron-transporting moiety, a luminescent moiety or a combination thereof; and $Y^1$, $Y^2$, $Y^3$, and $Y^4$ are as described in the first embodiment.

In an eighth embodiment of the invention each $R^1$ and $R^3$ is independently a monovalent aliphatic or cycloaliphatic hydrocarbon group having 1 to 20 carbon atoms, an aromatic group or a multicyclic aromatic nucleus where at least one of each $R^1$ and $R^3$ is independently a monovalent hole-transporting moiety, a luminescent moiety, or a combination thereof; and at least one of each $R^1$ and $R^3$ is independently a monovalent electron-transporting moiety, a luminescent moiety, or a combination thereof;

$R^2$, $Z^1$, and $Z^2$ each independently represent multivalent aliphatic or cycloaliphatic hydrocarbon groups having 1 to 20 carbon atoms or an aromatic group where none of $R^2$, $Z^1$, and $Z^2$ is a charge-transporting moiety, a luminescent moiety, or a combination thereof; and $Y^1$, $Y^2$, $Y^3$, and $Y^4$ are as described in the first embodiment.

In a ninth embodiment of the invention, all the components of the mixture are asymmetric, that is all components of the mixture are asymmetric, i.e. they have all distinct substituents.

Charge-transporting molecular glass mixtures, luminescent molecular glass mixtures, and combinations thereof of the invention when properly designed are truly non-crystallizable. Their thermal and other physical properties are tunable independent of the charge transport or luminescent moiety.

In the first preferred embodiment of the present invention, charge-transporting molecular glass mixtures, luminescent molecular glass mixtures, or combinations thereof comprise at least two nonpolymeric, thermoplastic compounds, each thermoplastic compound independently conforming to the structure of Formula (I) $((R^1Y^1)_p[(Z^1Y^2)_mR^2Y^3]_nZ^2Y^4R^3)$:

wherein m is zero or one;

n is the number of recurring units in the compound, and is zero up to, but not including, an integer at which said compound starts to become a polymer;

p is an integer of from one to eight;

each $R^1$ and $R^3$ is independently a monovalent aliphatic or cycloaliphatic hydrocarbon group having 1 to 20 carbon atoms, an aromatic group or a multicyclic aromatic nucleus; and $R^2$, $Z^1$ and $Z^2$ each independently represent multivalent aliphatic or cycloaliphatic hydrocarbon groups having 1 to 20 carbon atoms or an aromatic group where at least one of each $R^2$, $Z^1$ and $Z^2$ is independently a multivalent charge transporting moiety, a multivalent luminescent moiety, or a combination thereof.

The multivalent charge-transporting moiety, the multivalent luminescent moiety, and combinations thereof of this invention can be hole-transporting, electron-transporting, luminescent, or combinations thereof. Examples of hole-transporting moieties include triarylamines, N-substituted-carbazole, arylalkanes, hydrazones, pyrazolines and others known in the art. Electron-transporting moieties include diphenoquinones, bisimides, oxadiazoles, triazoles, imidazoles, oxazoles, thiazoles, thiadiazoles, triazines, quinolones, quinoxalines, anthrazolines, phenanthrolines, siloles, and others known in the art.

Specific examples of hole-transporting triarylamines include 1,1-bis(4-di-p-tolylaminophenyl)cyclohexane;
1,1-bis(4-di-p-tolylaminophenyl)-4-phenylcyclohexane;
1,5-bis[N-(1-naphthyl)-N-phenylamino]naphthalene;
2,6-bis(di-p-tolylamino)naphthalene;
2,6-bis[di-(1-naphthyl)amino]naphthalene;
2,6-bis[N-(1-naphthyl)-N-(2-naphthyl)amino]naphthalene;
2,6-bis[N,N-di(2-naphthyl)amine]fluorene;
4-(di-p-tolylamino)-4'-[4(di-p-tolylamino)-styryl]stilbene;
4,4'-bis(diphenylamino)quadriphenyl;
4,4"-bis[N-(1-anthryl)-N-phenylamino]-p-terphenyl;
4,4'-bis[N-(1-coronenyl)-N-phenylamino]biphenyl;
4,4'-bis[N-(1-naphthyl)-N-phenylamino]biphenyl (NPB);
4,4'-bis[N-(1-naphthyl)-N-(2-naphthyl)amino]biphenyl (TNB);
4,4"-bis[N-(1-naphthyl)-N-phenylamino]p-terphenyl;
4,4'-bis[N-(2-naphthacenyl)-N-phenylamino]biphenyl;
4,4'-bis[N-(2-naphthyl)-N-phenylamino]biphenyl;
4,4'-bis[N-(2-perylenyl)-N-phenylamino]biphenyl;
4,4'-bis[N-(2-phenanthryl)-N-phenylamino]biphenyl;
4,4'-bis[N-(2-pyrenyl)-N-phenylamino]biphenyl;
4,4'-bis[N-(3-acenaphthenyl)-N-phenylamino]biphenyl;
4,4'-bis[N-(3-methylphenyl)-N-phenylamino]biphenyl (TPD);
4,4'-bis[N-(8-fluoranthenyl)-N-phenylamino]biphenyl;
4,4'-bis[N-(9-anthryl)-N-phenylamino]biphenyl;
4,4'-bis{N-phenyl-N-[4-(1-naphthyl)-phenyl]amino}biphenyl;
4,4'-bis[N-phenyl-N-(2-pyrenyl)amino]biphenyl;
4,4',4"-tris[(3-methylphenyl)phenylamino]triphenylamine (m-TDATA);
Bis(4-dimethylamino-2-methylphenyl)-phenylmethane;
N-phenylcarbazole;
N,N'-bis[4-([1,1'-biphenyl]-4-ylphenylamino)phenyl]-N,N'-di-1-napbthalenyl-[1,1'-biphenyl]-4,4'-diamine;
N,N'-bis[4-(di-1-naphtbalenylamino)phenyl]-N,N-di-1-naphthalenyl-[1,1'-biphenyl]-4,4'-diamine;
N,N'-bis[4-[(3-methylphenyl)phenylamino]phenyl]-N,N'-diphenyl-[1,1'-bipbenyl]-4,4'-diamine;
N,N-bis[4-(diphenylamino)phenyl]-N',N'-dipheny-[1,1'-biphenyl]-4,4'-diamine;
N,N'-di-1-naphthalenyl-N,N'-bis[4-(1-naphthalenylphenylamino)phenyl]-[1,1'-biphenyl]-4,4'-diamine;
N,N'-di-1-naphthalenyl-N,N'-bis[4-(2-naphthalenylphenylamino)phenyl]-[1,1'-biphenyl]-4,4'-diamine;
N,N,N-tri(p-tolyl)amine;
N,N,N',N'-tetra-p-tolyl-4-4'-diaminobiphenyl;
N,N,N',N'-tetraphenyl-4,4'-diaminobiphenyl;
N,N,N',N'-tetra-1-naphthyl-4,4'-diaminobiphenyl;
N,N,N',N'-tetra-2-naphthyl-4,4'-diaminobiphenyl; and
N,N,N',N'-tetra(2-naphthyl)-4,4'"-diamino-p-terphenyl.

Representative starting materials having a hole-transporting moiety and at least two functional (reactive) groups are selected from the following materials (listed A through E).

A. The arylamine-containing organic diol and the arylamine-containing organic diacid of Noonan, U.S. Pat. No. 4,395,475, the entire disclosure of which is hereby incorporated by reference into this specification,

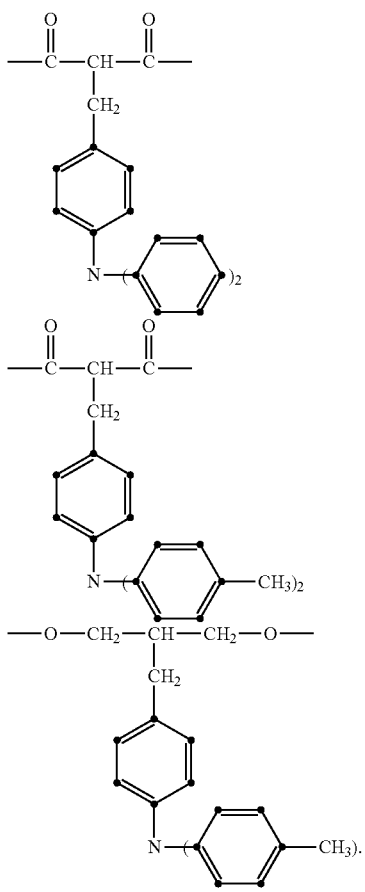

B. The hydroxyl functionalized arylamines of Limberg et. al. U.S. Pat. No. 5,011,939, the entire disclosure of which is hereby incorporated by reference into this specification, represented by the formula:

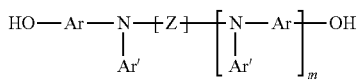

wherein:
m is 0 or 1;
Z is selected from the group consisting of:

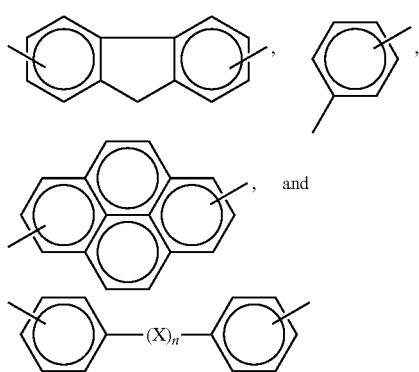

N is 0 or 1;

Ar is selected from the group consisting of:

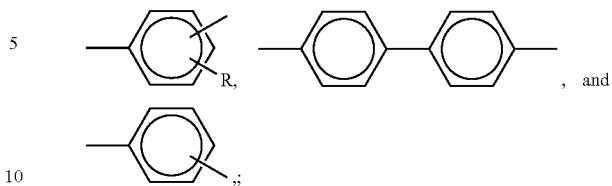

R is selected from the group consisting of —CH3, —C2H5, —C3H7, and —C4H9;
Ar' is selected from the group consisting of:

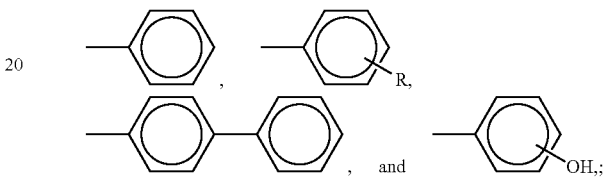

and
X is selected from the group consisting of:

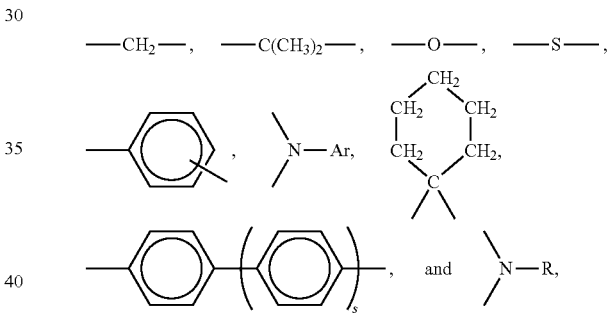

and
s is 0, 1 or 2, preferably the dihydroxy arylamine compound being free of any direct conjugation between the —OH groups and the nearest nitrogen atom through one or more aromatic rings.

The expression "direct conjugation" is defined as the presence of a segment having the formula: —(C=C)$_n$ C=C— where n=0 or 1 in one or more aromatic rings directly between an —OH group and the nearest nitrogen atom. Examples of direct conjugation between the —OH groups and the nearest nitrogen atom through one or more aromatic rings include a compound containing a phenylene group having an —OH group in the ortho or para position (or 2 or 4 position) on the phenylene group relative to a nitrogen atom attached to the phenylene group or a compound containing a polyphenylene group having an —OH group in the ortho or para position on the terminal phenylene group relative to a nitrogen atom attached to an associated phenylene group.

The following two structures are illustrative examples of specific compounds in which the hydroxyl group is in direct conjugation with the nitrogen through a phenylene ring system:

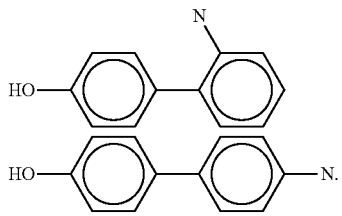

Generally, these hydroxy arylamine compounds are prepared, for example, by hydrolyzing an dialkoxy arylamine. A typical process for preparing alkoxy arylamines is disclosed in Example I of U.S. Pat. No. 4,588,666 issued to Stolka et. al., the entire disclosure of this patent being incorporated herein by reference. Preferably, the dihydroxy arylamine compound of this invention should be free of any direct conjugation between the —OH groups and the nearest nitrogen atom through one or more aromatic rings because layers containing compounds having such direct conjugation fail to support transport of electrical charges.

Typical hydroxy arylamine compounds of U.S. Pat. No. 5,011,939 include, for example:
N,N'-diphenyl-N,N'-bis(3-hydroxyphenyl)-[1,1'-biphenyl]-4,4'-diamine;
N,N,N',N',-tetra(3-hydroxyphenyl)-[1,1'-biphenyl]-4,4'-diamine;
N,N-di(3-hydroxyphenyl)-m-toluidine;
1,1-bis-[4-(di-N,N-m-hydroxpyphenyl)-aminophenyl]-cyclohexane;
1,1-bis[4-(N-m-hydroxyphenyl)-4-(N-phenyl)-aminophenyl]-cyclohexane;
Bis-(N-(3-hydroxyphenyl)-N-phenyl-4-aminophenyl)-methane;
Bis[(N-(3-hydroxyphenyl)-N-phenyl)-4-aminophenyl]-isopropylidene;
N,N'-diphenyl-N,N'-bis(3-hydroxyphenyl)-[1,1':4',1"-terphenyl]-4,4"-diamine;
9-ethyl-3.6-bis[N-phenyl-N-3(3-hydroxyphenyl)-amino]-carbazole;
2,7-bis[N,N-di(3-hydroxyphenyl)-amino]-fluorene;
1,6-bis[N,N-di(3-hydroxyphenyl)-amino]-pyrene; and
1,4-bis[N-phenyl-N-(3-hydroxyphenyl)]-phenylenediamine.

Typical hydroxy arylamine compounds containing direct conjugation between the —OH groups and the nearest nitrogen atom through one or more aromatic rings include, for example:
N,N'-diphenyl-N—N'-bis(4-hydroxyphenyl)[1,1'-biphenyl]-4,4'-diamine;
N,N,N',N',-tetra(4-hydroxyphenyl)-[1,1'-biphenyl]-4,4'-diamine;
N,N-di(4-hydroxyphenyl)-m-toluidine;
1,1-bis-[4-(di-N,N-p-hydroxpyphenyl)-aminophenyl]-cyclohexane;
1,1-bis[4(N-o-hydroxyphenyl)-4-(N-phenyl)-aminophenyl]-cyclohexane;
Bis-(N—(N4-hydroxyphenyl)-N-phenyl-4-aminophenyl)-methane;
Bis[(N-(4-hydroxyphenyl)-N-phenyl)-4-aminophenyl]-isopropylidene;
Bis-N,N—[(N4'-hydroxy-4-(1,1'-biphenyl)]-aniline; and
Bis-N,N-[(2'-hydroxy-4(1,1'-biphenyl)]-aniline.

C. The hydroxy arylamine compounds of Yanus et al, disclosed in U.S. Pat. No. 5,262,512 hereby incorporated by reference in its entirely; a few examples are shown below:

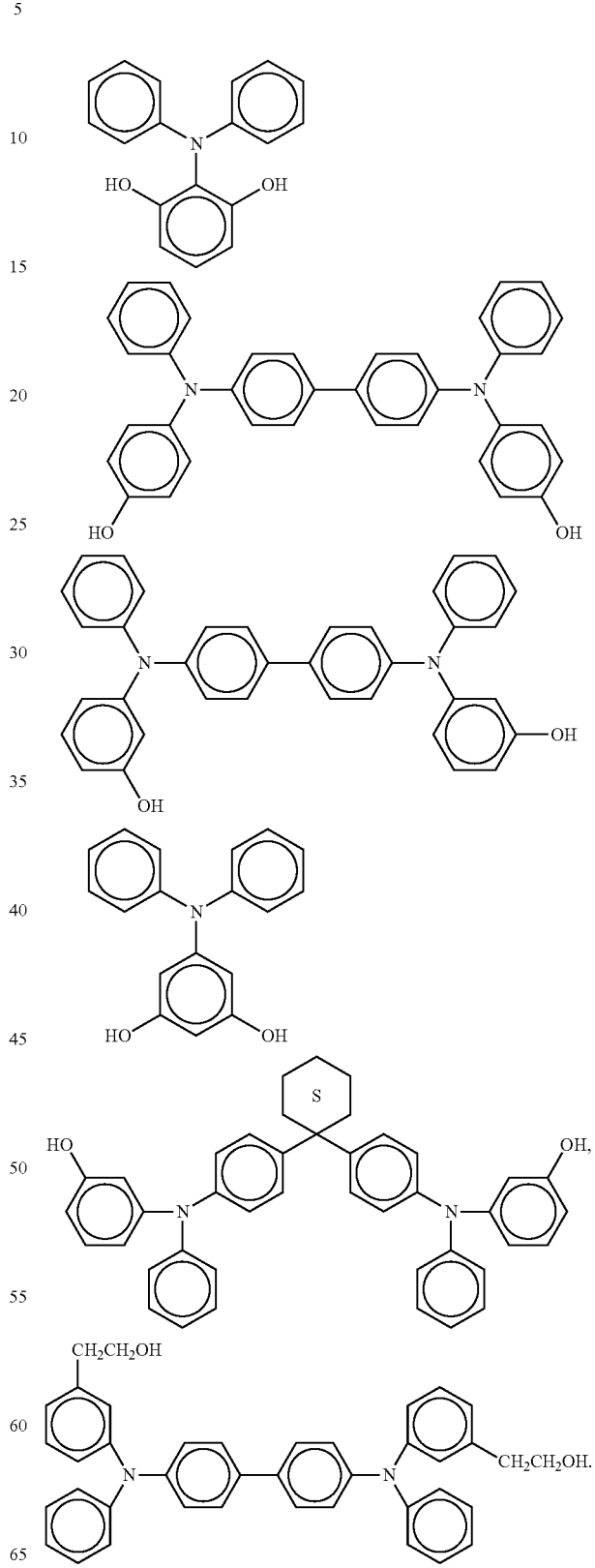

D. The diphenol compound having a tertiary amino group of Anzai et al, disclosed in U.S. Pat. No. 5,747,204 hereby incorporated by reference in its entirely represented by formula (II):

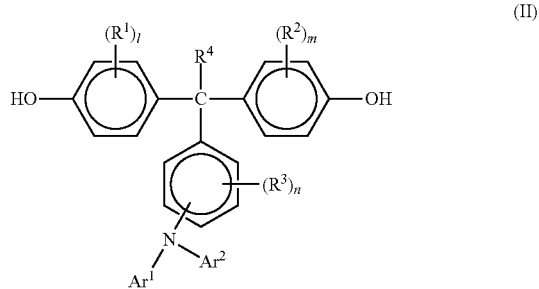

wherein $R^1$, $R^2$ and $R^3$ each is an alkyl group which may have a substituent, or a halogen atom; $R^4$ is a hydrogen atom, or an alkyl group which may have a substituent; $Ar^1$ and $Ar^2$ each is an aromatic hydrocarbon group which may have a substituent; l, m and n each is an integer of 0 to 4;

specific examples of the halogen atom represented by $R^1$, $R^2$, $R^3$, $R^5$, or $R^6$ are fluorine, chlorine, iodine and bromine;

specific examples of the alkyl group represented by $R^1$, $R^2$, $R^3$, $R^4$, $R^5$, or $R^6$ include straight-chain or branched alkyl groups having 1 to 12 carbon atoms, preferably 1 to 8 carbon atoms, and more preferably 1 to 4 carbon atoms; the above alkyl group may have a substituent such as a fluorine atom, hydroxyl group, cyano group, an alkoxyl group having 1 to 4 carbon atoms, or a phenyl group which may have a substituent selected from the group consisting of a halogen atom, an alkyl group having 1 to 4 carbon atoms and an alkoxyl group having 1 to 4 carbon atoms;

specific examples of the above alkyl group include methyl group, ethyl group, n-propyl group, i-propyl group, tert-butyl group, sec-butyl group, n-butyl group, i-butyl group, trifluoromethyl group, 2-hydroxyethyl group, 2-cyanoethyl group, 2-ethoxyethyl group, 2-methoxyethyl group, benzyl group, 4-chlorobenzyl group, 4-methylbenzyl group, 4-methoxybenzyl group and 4-phenylbenzyl group;

as the aromatic hydrocarbon group represented by $Ar^1$, $Ar^2$, $R^5$ or $R^6$ in formula (II), there can be employed phenyl group, a non-fused hydrocarbon group, or a fused polycyclic hydrocarbon group;

examples of the non-fused hydrocarbon group include biphenylyl group, and terphenylyl group;

as the fused polycyclic hydrocarbon group, a group having 18 or less carbon atoms for forming a ring is preferable. For example, there can be employed pentalenyl group, indenyl group, naphthyl group, azulenyl group, heptalenyl group, biphenylenyl group, as-indacenyl group, fluorenyl group, 9,9-dimethyl-2-fluorenyl group, s-indacenyl group, acenaphthylenyl group, pleiadenyl group, acenaphthenyl group, phenalenyl group, phenanthryl group, anthryl group, fluoranthenyl group, acephenanthrylenyl group, aceanthrylenyl group, triphenylenyl group, pyrenyl group, chrysenyl group and naphthacenyl group;

specific examples of the substituent of the aromatic hydrocarbon group represented by $Ar^1$ or $Ar^2$ are a halogen atom such as fluorine, chlorine, bromine or iodine; and a straight-chain or branched alkyl group having 1 to 5 carbon atoms which may have a substituent such as a fluorine atom, cyano group, or a phenyl group which may have a substituent selected from the group consisting of a halogen atom and an alkyl group having 1 to 5 carbon atoms;

specific examples of the bisphenol-arylamine moieties from U.S. Pat. No. 5,747,204 are shown below:

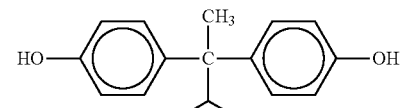

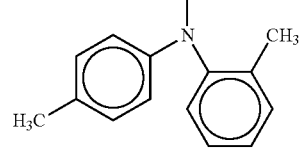

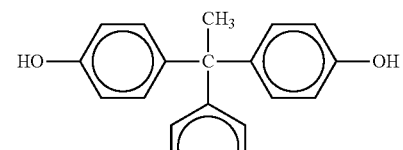

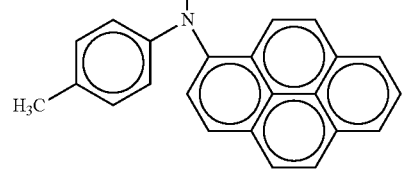

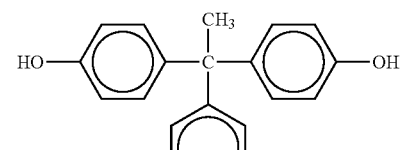

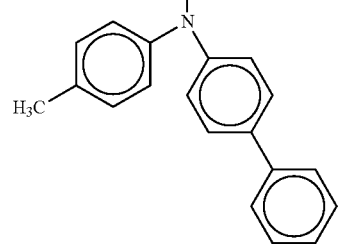

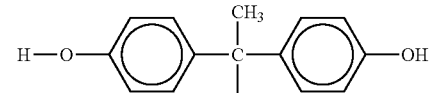

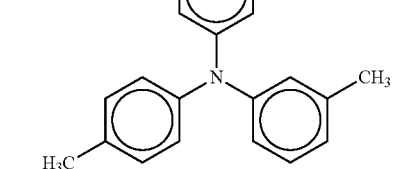

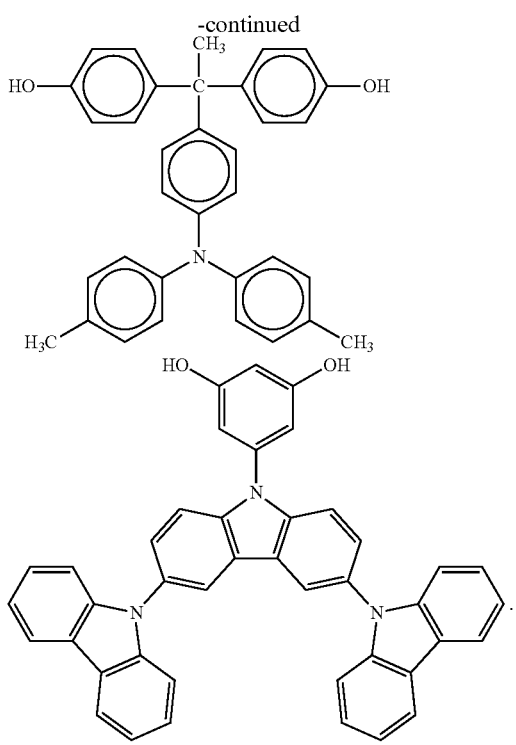

E. The dicarboxylic acids containing pendant arylamine of Noonan et al, U.S. Pat. No. 4,609,606, the entire disclosure of which is hereby incorporated by reference into this specification; specific examples include 2-{4-[bis(4-diethylamino-o-tolyl)methyl]-benzyl}malonic acid; 2-(4-anilinobenzyl)malonic acid; 2-{4-[bis(4-dibenzylamino-o-tolyl)methyl]-benzyl}malonic acid; 2-{4-[bis(4-dicyclohexylamino-o-tolyl)methyl]benzyl}malonic acid; 2-{{4-{bis[4-(N-ethyl-N-benzyl)amino-o-tolyl]-methyl}benzyl}}malonic acid; 2-{4-[(4-diethylaminophenyldiphenyl)methyl]benzyl}malonic acid; 2-{4-[1-(4-dimethylaminophenyl)-1-phenyl-ethyl]-benzyl}malonic acid; 2-[4-(2-naphthylamino)-benzyl]malonic acid; 2-{4-[3,3-bis(4-diethylamino-o-tolyl)-1-(2-thienyl)-1-propen-1-yl]-benzyl)malonic acid; 2-{4-[di(p-tolyl)amino]-benzyl]malonic acid and 2-(p-dimethylaminobenzyl)malonic acid.

The above dicarboxylic acids containing pendant arylamine can be chemically reduced to yield the corresponding diol containing pendant arylamines.

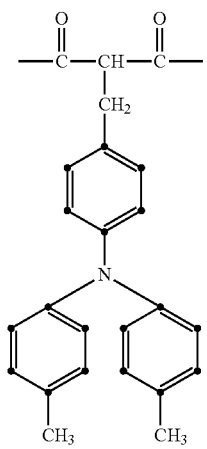

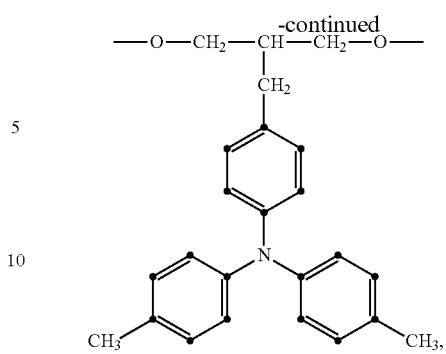

representative starting materials having multivalent electron-transporting moiety and at least two functional groups are selected from the following materials:

examples of multivalent electron-transporting moieties include the bisimides represented by the formula

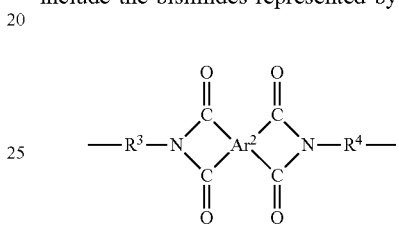

wherein $Ar^2$ represents a tetravalent aromatic group having 6 to about 20 carbon atoms that may be the same as or different from; $R^3$ and $R^4$ each independently represents an alkylene group having 2 to about 12 carbon atoms as described in U.S. Pat. No. 5,266,429;

specific examples of bisimides include

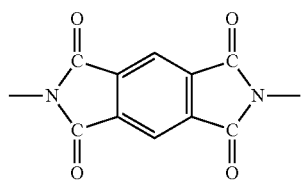

1,2,4,5 benzenetetracarbonyl-diimides;

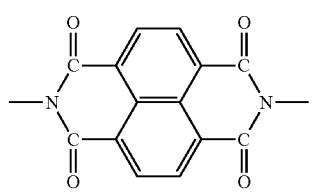

1,4,5,8-naphtalenetetracarbonyl-diimides; and

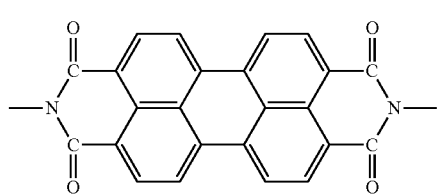

3,4,9,10-perylenetetracarbonyl-diimides;

examples of specific multivalent bisimides include:
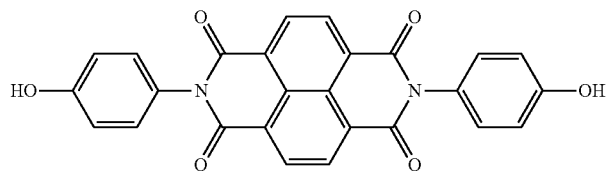
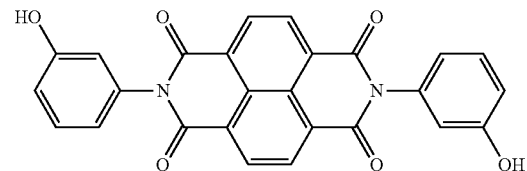
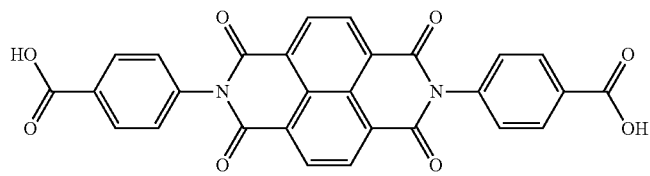
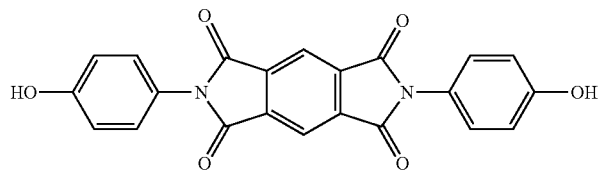
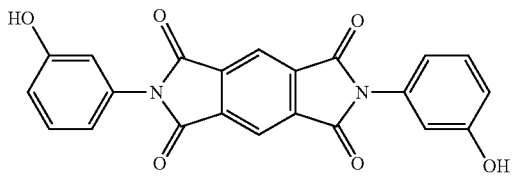
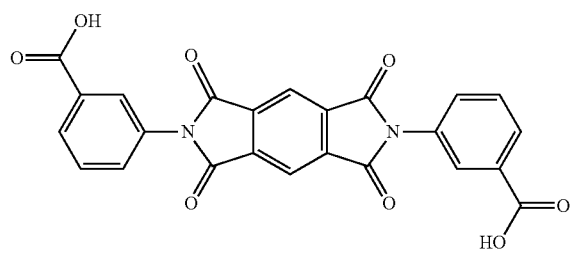
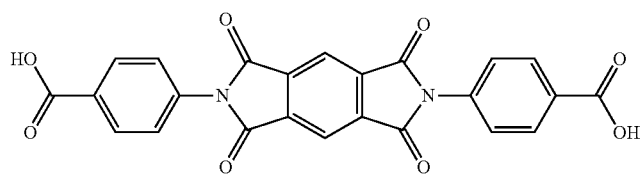
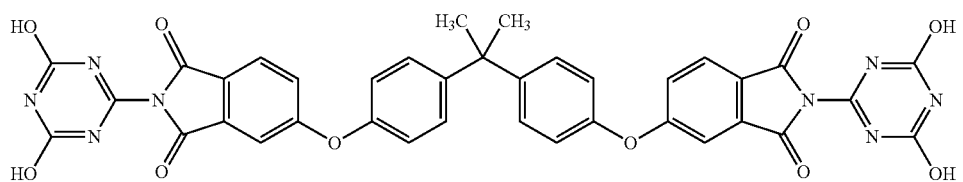
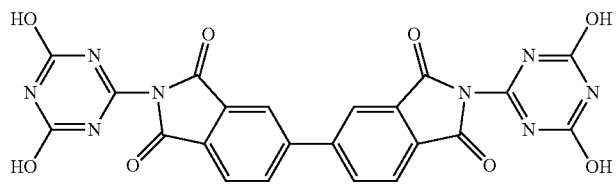

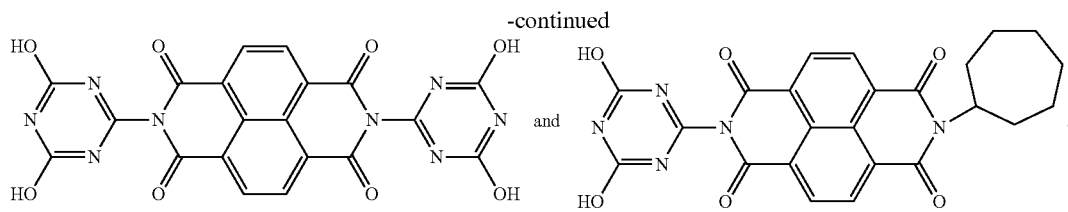

Specific examples of oxadiazoles include 2,5-bis(4-naph-thyl)-1,3,4-oxadiazole (BND) reported in Kraft, A et al, *Angnew. Chem., Int. Ed.* 1998, 37, 402; 2-(4-biphenyl)-5-(4-tetr-butylphenyl)-a,3,4-oxadiazole (PBD) reported in Braun, D; Heeger, A. *J. Appl. Phys. Lett.* 1991, 58, 1982.

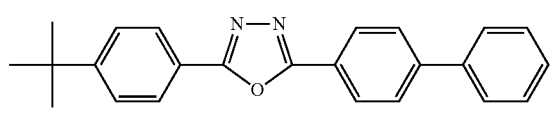

PBD

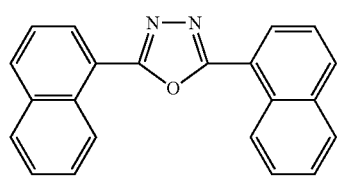

BND

Specific examples of triazoles include

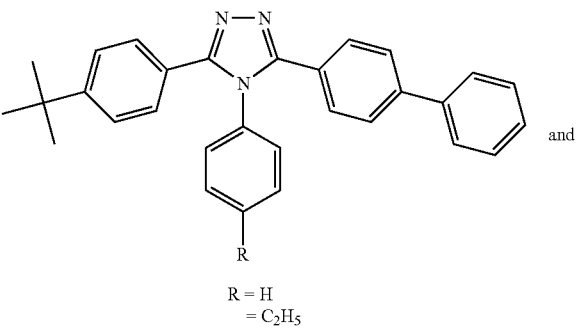

R = H
= $C_2H_5$ (Kido, J. et al, *Jpn J. Appl. Phys.* 1993, 32, L917)

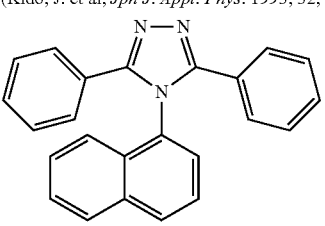

(Adachi, C. et al *Appl. Phys. Lett.* 2000, 77, 904)

Examples of triazines include:

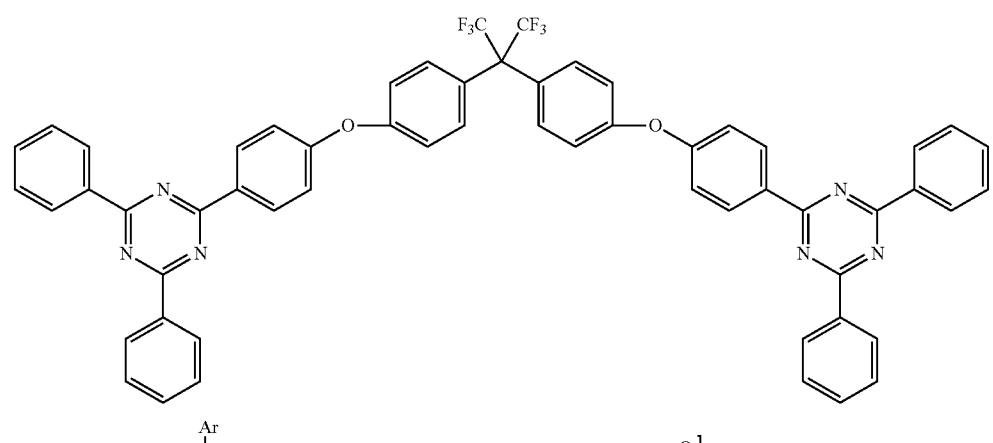

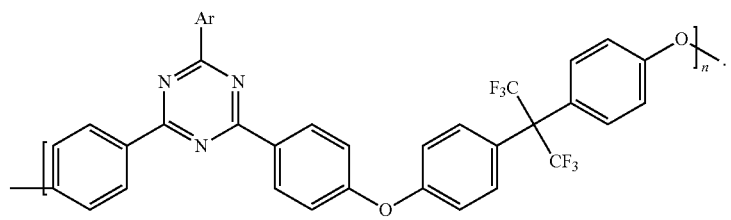

(Fink, R. et all *Chem. Mater.* 1998, 10, 3620)

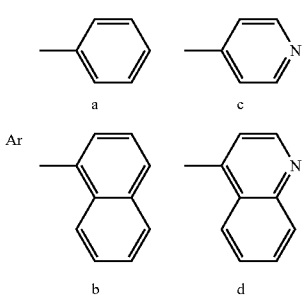

Specific examples of multivalent electron-transporting starting materials include: The diamino oxadiazoles reported in "Polymers Containing 1,3,4-Oxadiazole Rings for Advanced Materials" by Mariana-Dana Dămăceanu et al., *Chemistry*, 2010

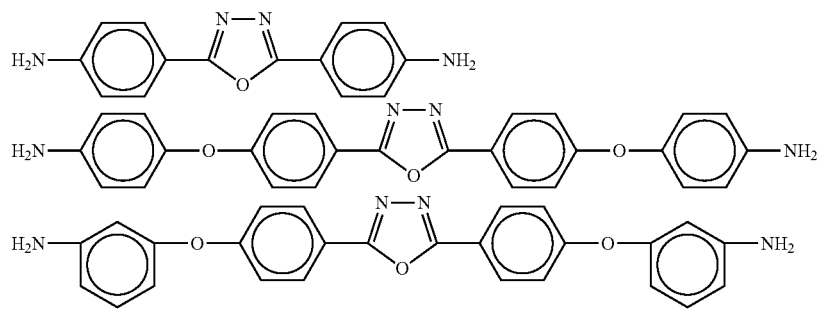

and

The bisoxazole diamino reported in Kolhe et al. in J. Phys. Chem. B. Vol. 114, No. 50, 2010.

The multivalent luminescent moiety of this invention can be any luminescent, fluorescent, or phosphorescent. Specific examples of multivalent luminescent starting materials include but are not limited to:

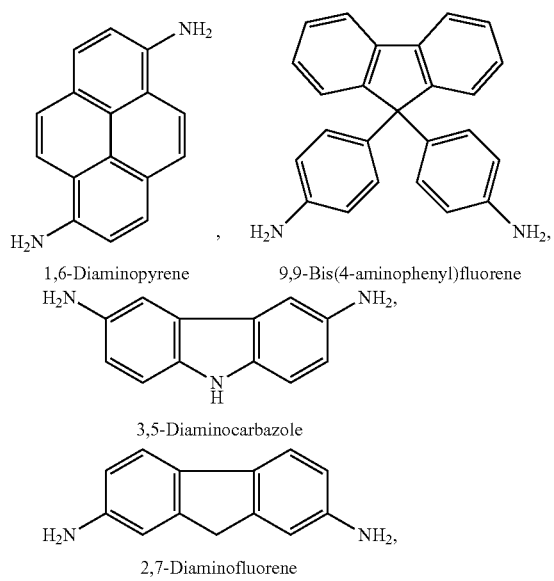

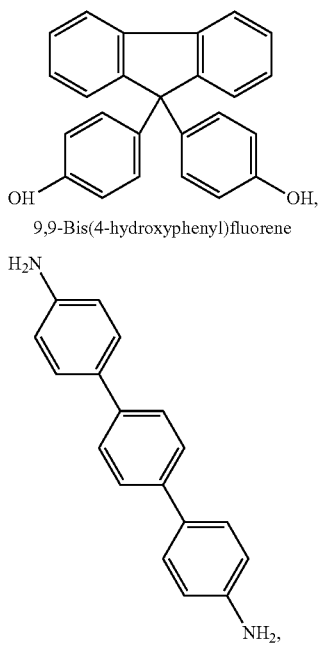

the Bis[4'-(4-aminophenyl)-2,2':6',2"-terpyridyl)]ruthenium(II) Hexafluorophosphate reported in Wai Yue Ng and al, in Chem. Mater. 1999, 11, 1165-1170;

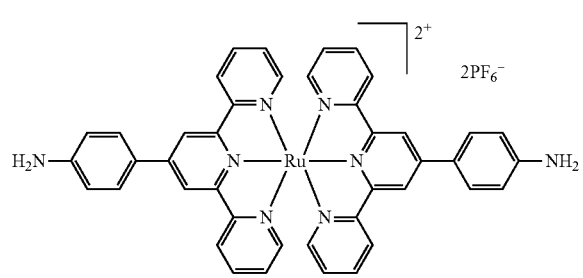

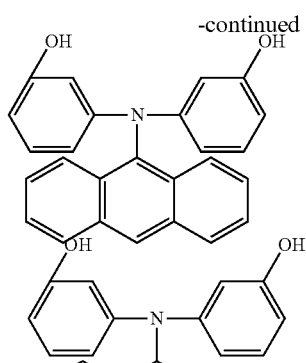

and similar multifunctional metal complexes, and any other known luminescent materials known in the art that are multivalent or can be modified to provide multivalency.

Other examples of multi-hydroxy luminescent intermediates useful in the preparation of the luminescent molecular glass mixtures of this invention include those materials prepared from a poly-metoxy substituted primary or secondary aromatic amines, such as, o-Dianisidine, 4,4'-Dimethoxydiphenylamine, 3,3'-Dimethoxybenzidine,

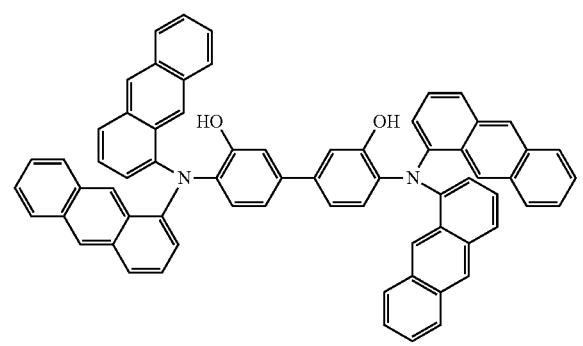

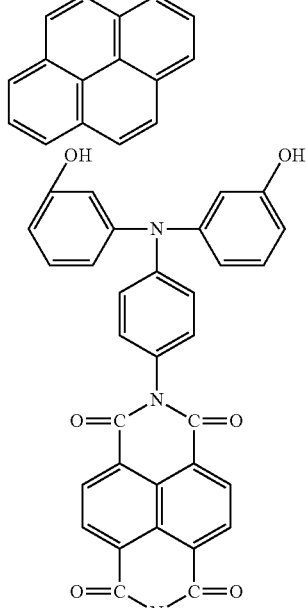

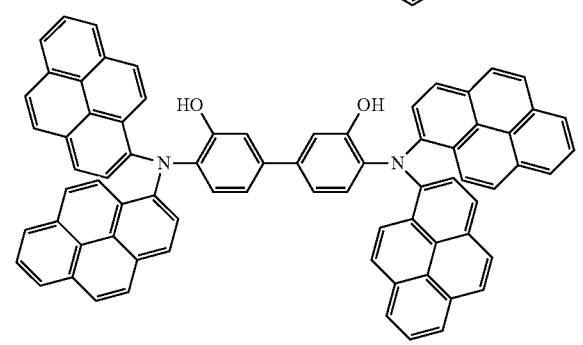

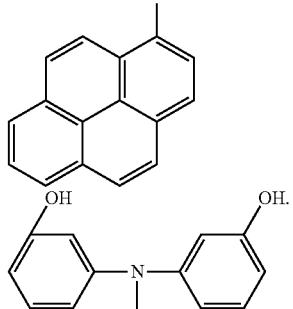

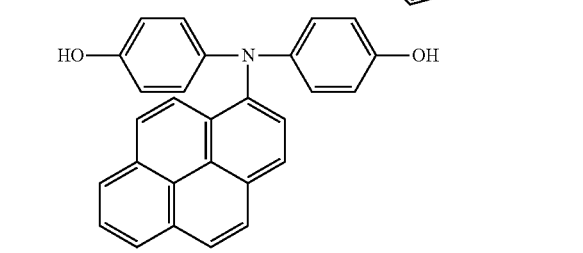

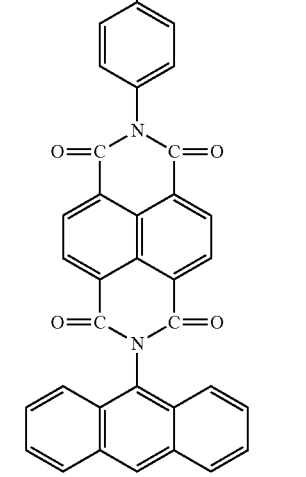

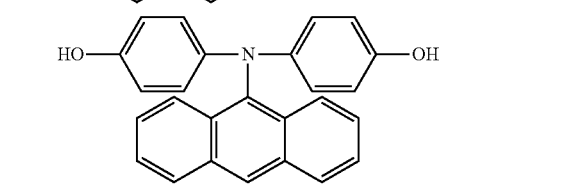

Referring back to the structure in Formula (I), $Y^1$, $Y^2$, $Y^3$ and $Y^4$ each independently represents one or more linking groups such as

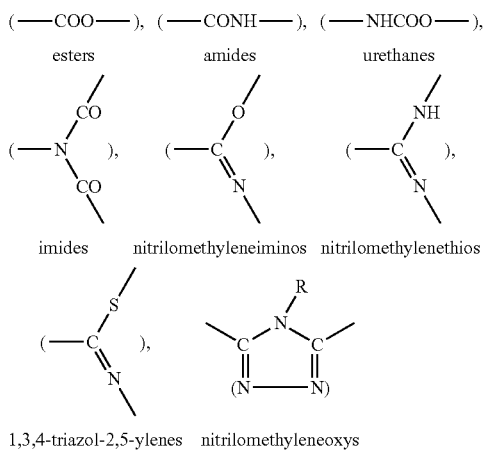

esters, amides, urethanes, imides, nitrilomethyleneiminos, nitrilomethylenethios 1,3,4-triazol-2,5-ylenes nitrilomethyleneoxys wherein R' represents alkyl of 1-6 carbon atoms, hydroxyl, amino or aryl such as phenyl and 1,3,4-oxadiazol-2,5-ylenes

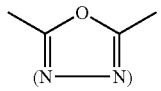

provided that at least one of $R^1$, $Z^1$, $R^2$, $R^3$ and $Z^2$ of Formula (I) is a charge-transporting moiety and the glass transition temperature (Tg) of the mixture is above 20° C.

In the structural Formula (I), the expression "$[(Z^1Y^2)_m R^2Y_3]_n$" describes nonpolymeric compounds which are oligomers. Oligomers are usually formed when either $Z^1$ or $R^2$ are at least bivalent. The $(Z^1Y^2)_m$ moiety describes oligomers in which $Z^1$ repeats itself such as when $Z^1$ is derived from p-hydroxybenzoic acid. When n is one or more, p in the structural formula is preferably one to avoid significant crosslinking of the compound due to the multivalent nature of $Z^1$. However, some crosslinking can be tolerated in charge transport-mixtures of the invention.

In the second embodiment of the invention each $R^1$ and $R^3$ of Formula (I) is independently a monovalent aliphatic or cycloaliphatic hydrocarbon group having 1 to 20 carbon atoms, an aromatic group or a multicyclic aromatic nucleus where at least one of each $R^1$ and $R^3$ is independently a monovalent charge-transporting moiety, a monovalent luminescent moiety, or a combination thereof;

$R^2$, $Z^1$ and $Z^2$ of Formula (I) each independently represent multivalent aliphatic or cycloaliphatic hydrocarbon groups having 1 to 20 carbon atoms or an aromatic group as described above; The monovalent charge transporting moiety of this invention can be hole-transporting or electron-transporting. Examples of hole-transporting moieties include triarylamines, N-substituted-carbazole, arylalkanes, hydrazones, pyrazolines and others known in the art. Electron-transporting moieties include diphenoquinones, bisimides, and others known in the art. Examples of luminescent moieties of this invention include polycyclic aromatic hydrocarbons (PAHs) such as pyrenes, naphthalenes, anthracenes, perylenes, fluorenes, carbazoles, dibenzothiophenes, metal complexes such as 2,4-Pentanedionato)bis[2-(2-quinolinyl)phenyl]iridium(III), Tris-(8-hydroxyquinoline)aluminum (Alq3), 8-Hydroxyquinoline zinc, Tris[2-phenylpyridinato-$C^2$,N]iridium(III) (Ir(ppy)$_3$), Tris[2-(4,6-difluorophenyl)pyridinato-$C^2$,N]iridium(III) (Ir(Fppy)$_3$), and others known in the art.

Y1, Y2, Y3 and Y4 as described in the first embodiment above.

Monovalent charge-transporting moieties include any charge transport moiety that is monovalently functionalized with one of an hydroxy, carboxy, amino, or isocyanate group.

Examples of monovalent hole-transporting moieties include:
1. those represented by the hydroxyl-functionalized triarylamine formula described in United States patent application 2012/0189347, hereby incorporated by reference in its entirety:

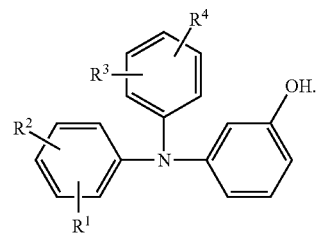

wherein $R^1$, $R^2$, $R^3$, and $R^4$ can be the same or different, and wherein each of $R^1$, $R^2$, $R^3$, and $R^4$ are independently selected from (i) hydrogen, (ii) an alkyl group, which can be linear or branched, saturated or unsaturated, cyclic or acyclic, substituted or unsubstituted alkyl, and wherein hetero atoms may optionally be present in the alky group, (iii) an aryl group, which can be substituted or unsubstituted aryl, and wherein hetero atoms may optionally be present in the aryl group, (iv) an arylalkyl group, which can be substituted or unsubstituted arylalkyl, wherein the alkyl portion of the arylalkyl can be linear or branched, saturated or unsaturated, cyclic or acyclic, and substituted or unsubstituted, and wherein hetero atoms may optionally be present in either the aryl portion or the alkyl portion of the arylalkyl, (v) an alkylaryl group, which can be substituted or unsubstituted alkylaryl, wherein the alkyl portion of the alkylaryl can be linear or branched, saturated or unsaturated, cyclic or acyclic, and substituted or unsubstituted, and wherein hetero atoms may optionally be present in either the alkyl portion or the aryl portion of the alkylaryl group, (vi) an alkoxy group, (vii) an aryloxy group, (viii) an arylalkyloxy group, (ix) an alkylaryloxy group;
2. The p-diphenylaminobenzoic and (p-diphenylaminophenyl)propionic acids described in U.S. Pat. No. 3,779,750, hereby incorporated by reference in its entirety;
3. The monovalent hydroxyl-functionalized triarylamine compounds represented by the formula described in U.S. Pat. No. 5,976,744, hereby incorporated by reference in its entirety:

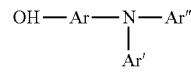

wherein Ar is selected from the group consisting of:

R is selected from the group consisting of

—CH₃, —C₂H₅, —C₃H₇ and —C₄H₉,

Ar' and Ar" being independently selected from the group consisting of:

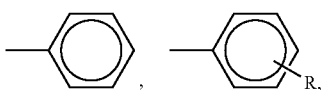

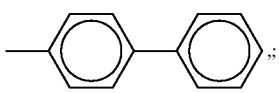

4. The p-diphenylaminobenzoic and (p-diphenylaminophenyl)propionic acids described in U.S. Pat. No. 3,779,750, the entire disclosure of which is hereby incorporated by reference into this specification;
5. The monovalent charge transport materials reported in Carlos A. Zuniga's thesis: https://smartech.gatech.edu/jspui/.../zuniga_carlos_a_201105_phd.pdf)

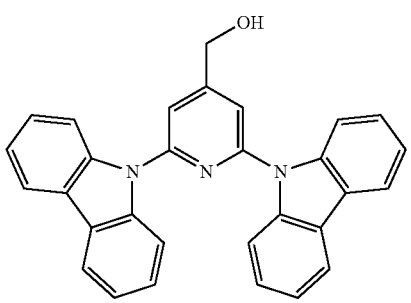

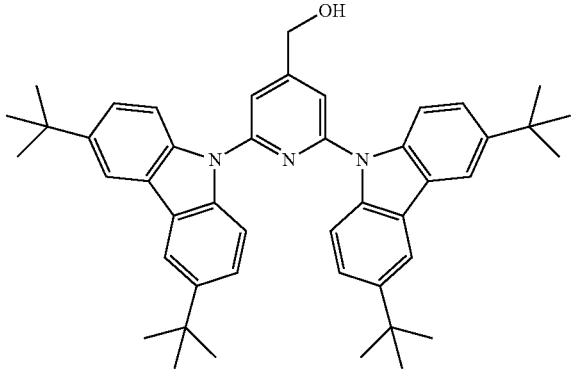

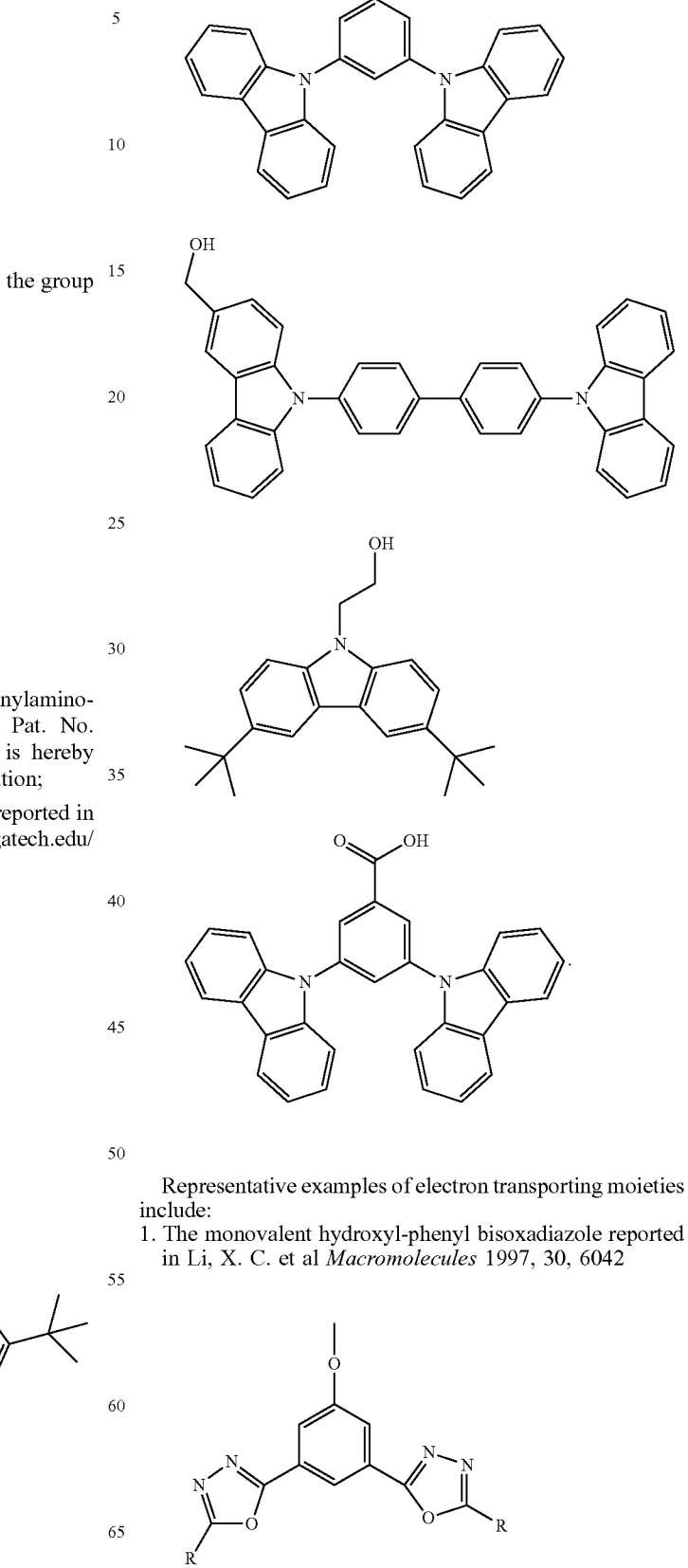

Representative examples of electron transporting moieties include:
1. The monovalent hydroxyl-phenyl bisoxadiazole reported in Li, X. C. et al *Macromolecules* 1997, 30, 6042 where R is

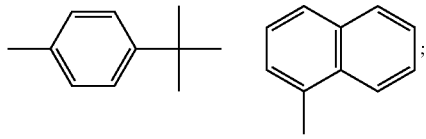

2. The monovalent hydroxyl-oxadiazole reported by Abhishek P. Kulnami et al in Chem. Mater. 2004, 16, 4556-4573

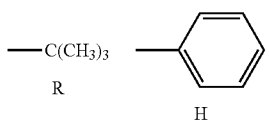

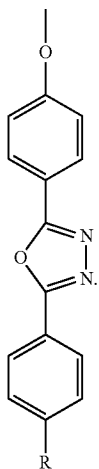

3. The mono-hydroxy-oxadiazole reported in "*Novel Oxadiazole Containing Monomers*", Alexandra Lee Foguth, Clemson University Dissertation, 2011. Clemson University.

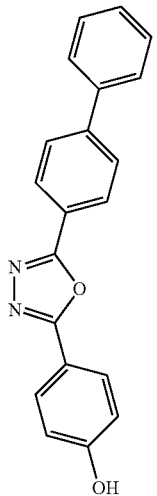 [SMILES: Oc1ccc(-c2nnc(-c3ccc(-c4ccccc4)cc3)o2)cc1]

Representative examples of ambipolar-transporting (hole-transporting and electron-transporting) moieties include:

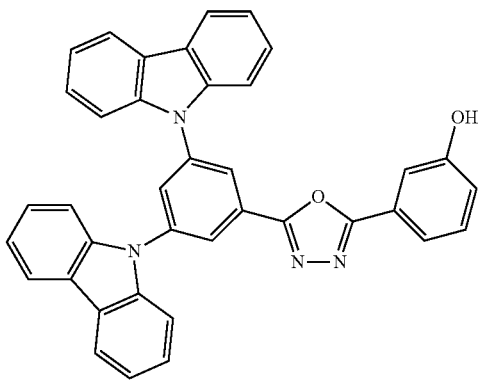

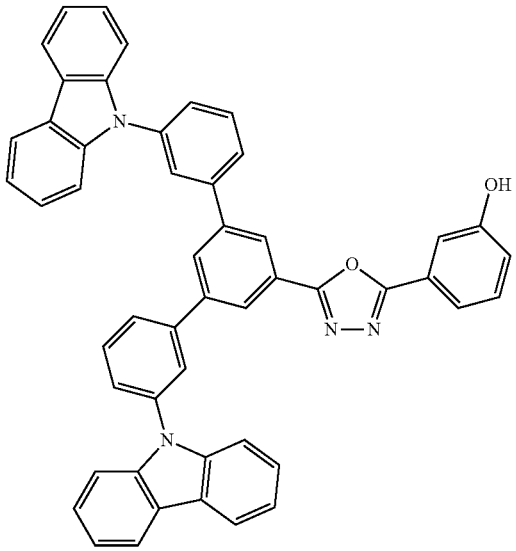

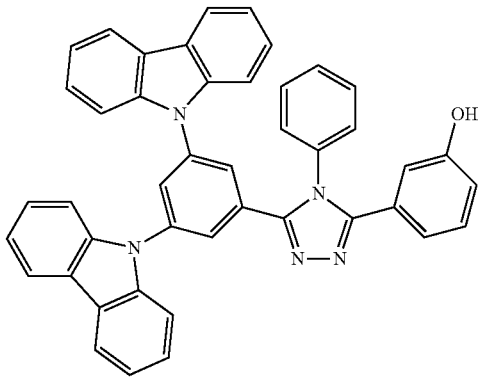

-continued

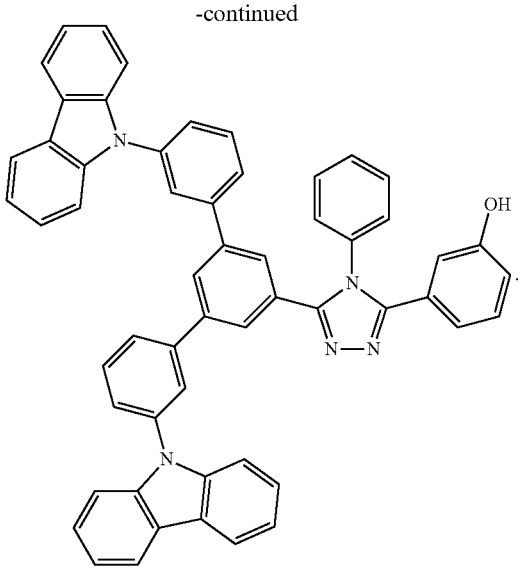

The monovalent luminescent moieties of this invention include polycyclic aromatic hydrocarbons (PAHs) such as pyrenes, naphthalenes, anthracenes, perylenes, fluorenes, carbazoles, dibenzothiophenes, metal complexes such as 2,4-Pentanedionato)bis[2-(2-quinolinyl)phenyl]indium(III), Tris-(8-hydroxyquinoline)aluminum (Alq3), 8-Hydroxyquinoline zinc, Tris[2-phenylpyridinato-$C^2$,N]iridium(III) (Ir(ppy)$_3$), Tris[2-(4,6-difluorophenyl)pyridinato-$C^2$,N]iridium (III)(Ir(Fppy)$_3$), and others known in the art.

Monovalent luminescent moieties include any luminescent moiety, fluorescent or phosphorescent, that is monovalently functionalized with one of an hydroxy, carboxy, amino, anhydride, or isocyanate group and any luminescent materials known in the art that can be modified to provide monovalency.

Examples of monovalent luminescent charge moieties include:

1-pyrenemethanol, 1-pyrenecarboxylic acid, 1-pyrenebutanol, 1-pyrenebutyric acid, 1-aminopyrene, 2-aminofluorene, 2-amino-9-fluorenone, 1-aminoanthracene, 2-aminoanthracene, 9-fluorenol, 2-hydroxy-9-fluorenone, 2-(2-hydroxyphenylbenzoxazole, 2-(2-hydroxyphenyl)-benzothiazole, 8-hydroxyqyuiinaldine, 5-fluoro-8-quinolinol, 5,7-dibromo-8-hydroxy-quinoline, 4,Amino-p-terphenyl, all available from Sigma-Aldrich or TCI America.

In the third embodiment of the invention each $R^1$ and $R^3$ of Formula (I) is independently a monovalent aliphatic or cycloaliphatic hydrocarbon group having 1 to 20 carbon atoms, an aromatic group or a multicyclic aromatic nucleus where at least one of each $R^1$ and $R^3$ is independently a monovalent charge-transporting moiety, a luminescent moiety, or a combination thereof. The monovalent charge-transporting moiety may be any of the charge-transporting moieties provided in the description of the second embodiment of the invention described above and the monovalent luminescent moiety may be any of the luminescent moieties of the second embodiment of the invention described above.

$R^2$, $Z^1$, and $Z^2$ of Formula (I) each independently represent multivalent aliphatic or cycloaliphatic hydrocarbon groups having 1 to 20 carbon atoms or an aromatic group where at least one of each $R^2$, $Z^1$, and $Z^2$ is independently a charge-transporting moiety, a luminescent moiety, or a combination thereof. The multivalent charge-transporting moiety may be any of the charge-transporting moieties provided in the description of the first embodiment of the invention provided above and the multivalent luminescent moiety may be any of the luminescent moieties of the first embodiment of the invention described above.

$Y^1$, $Y^2$, $Y^3$, and $Y^4$ of Formula (I) are as described in the first embodiment of the invention described above.

In the fourth embodiment of the invention each $R^1$ and $R^3$ of Formula (I) is independently a monovalent aliphatic or cycloaliphatic hydrocarbon group having 1 to 20 carbon atoms, an aromatic group or a multicyclic aromatic nucleus where at least one of $R^1$ and $R^3$ is independently a monovalent hole-transporting moiety, a luminescent moiety, or a combination thereof. The monovalent hole-transporting moiety may be any of the hole-transporting moieties provided in the description of the second embodiment of the invention described above and the monovalent luminescent moiety may be any of the luminescent moieties of the second embodiment of the invention described above.

$R^2$, $Z^1$, and $Z^2$ of Formula (I) each independently represent multivalent aliphatic or cycloaliphatic hydrocarbon groups having 1 to 20 carbon atoms or an aromatic group where at least one of each $R^2$, $Z^1$, and $Z^2$ is independently a multivalent electron-transporting moiety, a luminescent moiety, or a combination thereof. The multivalent electron-transporting moiety may be any of the electron-transporting moieties provided in the description of the first embodiment of the invention provided above and the multivalent luminescent moiety may be any of the luminescent moieties of the first embodiment of the invention described above.

$Y^1$, $Y^2$, $Y^3$, and $Y^4$ of Formula (I) are as described in the first embodiment of the invention described above.

In the fifth embodiment of the invention each $R^1$ and $R^3$ of Formula (I) is independently a monovalent aliphatic or cycloaliphatic hydrocarbon group having 1 to 20 carbon atoms, an aromatic group or a multicyclic aromatic nucleus where at least one of each $R^1$ and $R^3$ is independently a monovalent electron-transporting moiety, a luminescent moiety, or a combination thereof. The monovalent electron-transporting moiety may be any of the electron-transporting moieties provided in the description of the second embodiment of the invention above and the monovalent luminescent moiety may be any of the luminescent moieties of the second embodiment of the invention described above.

$R^2$, $Z^1$, and $Z^2$ of Formula (I) each independently represent multivalent aliphatic or cycloaliphatic hydrocarbon groups having 1 to 20 carbon atoms or an aromatic group, where at least one of each $R^2$, $Z^1$, and $Z^2$ is independently a multivalent hole-transporting moiety, a luminescent moiety, or a combination thereof. The multivalent hole-transporting moiety may be any of the hole-transporting moieties provided in the description of the first embodiment of the invention provided above and the multivalent luminescent moiety may be any of the luminescent moieties of the first embodiment of the invention described above.

$Y^1$, $Y^2$, $Y^3$, and $Y^4$ of Formula (I) are as described in the first embodiment of the invention described above.

In the sixth embodiment of the invention each $R^1$ and $R^3$ of Formula (I) is independently a monovalent aliphatic or cycloaliphatic hydrocarbon group having 1 to 20 carbon atoms, an aromatic group or a multicyclic aromatic nucleus where at least one of each $R^1$ and $R^3$ is independently a monovalent electron-transporting moiety, a luminescent moiety, or a combination thereof; and at least one of each R1 and R3 is independently a monovalent hole-transporting moiety, a luminescent moiety, or a combination thereof. The monovalent electron-transporting moiety may be any of the electron-transporting moieties provided in the description of the second embodiment of the invention provided above, the monovalent hole-transporting moiety may be any of the hole-transporting moieties provided in the description of the second embodiment of the invention provided above, and the monovalent luminescent moiety may be any of the luminescent moieties of the second embodiment of the invention described above.

$R^2$, $Z^1$, and $Z^2$ each independently represent multivalent aliphatic or cycloaliphatic hydrocarbon groups having 1 to 20 carbon atoms or an aromatic group, where at least one of each $R^2$, $Z^1$, and $Z^2$ is independently a multivalent hole-transporting moiety, a luminescent moiety, or a combination thereof. The multivalent hole-transporting moiety may be any of the hole-transporting moieties provided in the description of the first embodiment of the invention provided above and the multivalent luminescent moiety may be any of the luminescent moieties of the first embodiment of the invention described above.

$Y^1$, $Y^2$, $Y^3$, and $Y^4$ of Formula (I) are as described in the first embodiment of the invention described above.

In the seventh embodiment of the invention each $R^1$ and $R^3$ of Formula (I) is independently a monovalent aliphatic or cycloaliphatic hydrocarbon group having 1 to 20 carbon atoms, an aromatic group or a multicyclic aromatic nucleus where at least one of each R1 and R3 is independently a monovalent electron-transporting moiety, a luminescent .moiety, or a combination thereof; and at least one of each $R^1$ and $R^3$ is independently a monovalent hole-transporting moiety, a luminescent moiety, or a combination thereof. The monovalent electron-transporting moiety may be any of the electron-transporting moieties provided in the description of the second embodiment of the invention provided above, the monovalent hole-transporting moiety may be any of the hole-transporting moieties provided in the description of the second embodiment of the invention provided above, and the monovalent luminescent moiety may be any of the luminescent moieties of the second embodiment of the invention described above.

$R^2$, $Z^1$, and $Z^2$ each independently represent multivalent aliphatic or cycloaliphatic hydrocarbon groups having 1 to 20 carbon atoms or an aromatic group, where at least one of each $R^2$, $Z^1$, and $Z^2$ is independently a multivalent electron-transporting moiety, a luminescent moiety or a combination thereof. The multivalent electron-transporting moiety may be any of the electron-transporting moieties provided in the description of the first embodiment of the invention provided above and the multivalent luminescent moiety may be any of the luminescent moieties of the first embodiment of the invention described above.

$Y^1$, $Y^2$, $Y^3$, and $Y^4$ of Formula (I) are as described in the first embodiment of the invention described above.

In the eighth embodiment of the invention each $R^1$ and $R^3$ of Formula (I) is independently a monovalent aliphatic or cycloaliphatic hydrocarbon group having 1 to 20 carbon atoms, an aromatic group or a multicyclic aromatic nucleus where at least one of each $R^1$ and $R^3$ is independently a monovalent hole-transporting moiety, a luminescent moiety, or a combination thereof; and at least one of each R1 and R3 is independently a monovalent electron-transporting moiety, a luminescent moiety, or a combination thereof. The monovalent electron-transporting moiety may be any of the electron-transporting moieties provided in the description of the second embodiment of the invention provided above, the monovalent hole-transporting moiety may be any of the hole-transporting moieties provided in the description of the second embodiment of the invention provided above, and the monovalent luminescent moiety may be any of the luminescent moieties of the second embodiment of the invention described above.

$R^2$, $Z^1$, and $Z^2$ of Formula (I) each independently represent multivalent aliphatic or cycloaliphatic hydrocarbon groups having 1 to 20 carbon atoms or an aromatic group where none of $R^2$, $Z^1$, and $Z^2$ is a charge-transporting moiety, a luminescent moiety, or a combination thereof; and $Y^1$, $Y^2$, $Y^3$, and $Y_4$ of Formula (I) are as described in the first embodiment of the invention described above.

One aspect of this invention is to provide luminescent materials with electron-transporting property. This is accomplished by preparing luminescent monovalent moieties according to the bisamide formula:

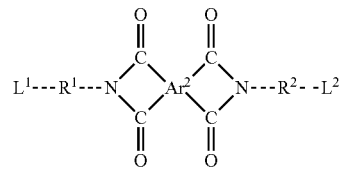

where $L^1$ selected from the group consisting of alkyl, aryl, halogen, alkoxy, or cyano; $R^1$ is selected from the group consisting of pyrene, anthracene, perylene, fluorenone, fluorene, carbazole, imidazole, 1,3,4 oxadiazole, phosphine oxide, rubrene, bathocuproine, dibenzothophene, naphthalene, phenanthroline, benzoxazole, benzothiazole or other luminescent polycyclic aromatic nuclei;

where $L^2$ is either —COOH, anhydrides, or —OH; $R^2$ is selected from the group comprising an aliphatic or cycloaliphatic hydrocarbon group having 1 to 20 carbon atoms, an aromatic group or multicyclic aromatic nucleus; wherein $Ar^2$ represents a tetravalent aromatic group having 6 to about 20 carbon atoms, preferred imides include

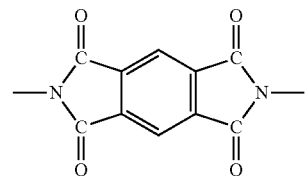

1,2,4,5 benzenetetracarbonyl-diimides;

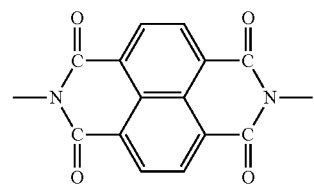

1,4,5,8-naphtalenetetracarbonyl-diimides;

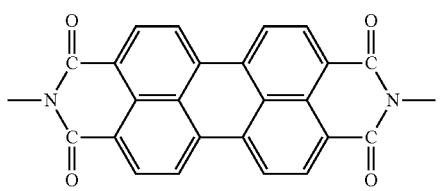

and
3,4,9,10-perylenetetracarbonyl-diimides.

The imide structure should not interfere in any way with the luminescent properties of the luminescent glass mixture.

Monovalent bisimides electron-transporting luminescent moieties can be made by adapting the synthesis of unsymmetrical compounds via methods disclosed in U.S. Pat. No. 4,992,349 which is hereby incorporated by reference. In a first step the synthesis of a mono-anhydride is accomplished by azeotropic refluxing of one equivalent of a monovalent luminescent amine of the formula $L^1$-$R^1$—NH2 with a slight molar excess of a di-anhydride; where $L^1$ is selected from the group independently consisting of alkyl, aryl, halogen, alkoxy, hydrogen, or cyano; $R^1$ is selected from the group consisting of pyrene, anthracene, perylene, fluorenone, fluorene, carbazole, rubrene, bathocuproine, dibenzothophene, naphthalene, phenanthroline, benzoxazole, benzothiazole or polycyclic aromatic nucleus. The refluxing is accomplished in a high boiling solvent, such as diphenyl ether-biphenyl-eutectic (available commercially from Dow Chemical Company as Dowtherm™ A, boiling point (bp) 235° C.)

The mono-anhydrides of this first step are useful monovalent luminescent starting materials of this invention.

They can be further reacted with diamines to form luminescent molecular glass mixtures of this invention. Examples of these luminescent monanhydrides of this invention can be represented by this formula:

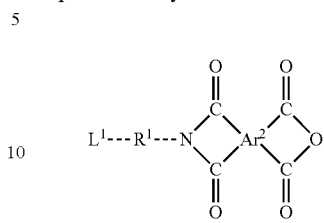

where $L^1$ selected from the group independently consisting of alkyl, aryl, halogen, alkoxy, or cyano or hydrogen; $R^1$ is selected from the group consisting of pyrene, anthracene, perylene, fluorenone, fluorene, carbazole, rubrene, bathocuproine, dibenzothophene, naphthalene, phenanthroline, benzoxazole, benzothiazole or other luminescent polycyclic aromatic nuclei. It is presently preferred to use a slight excess of the dianhydride because the dianhydride is the least soluble of the reactants in the reaction mixture and can be readily removed from the monoanhydride by filtration. Also, in this manner, the formation of the undesirable bis-derivative can be kept to a minimum, although the presence of bis-derivatives is not necessarily detrimental, as long the exact concentration can be measured by technique such as high performance liquid chromatography (HPLC) and be taken into account stochiometricaly in the final molecular glass formation.

Specific examples of the mono-anhydride include and are not limited to:

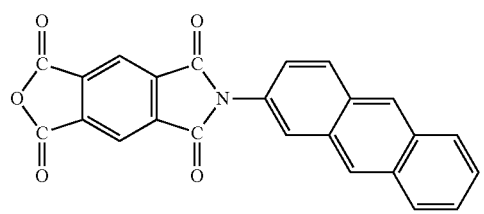
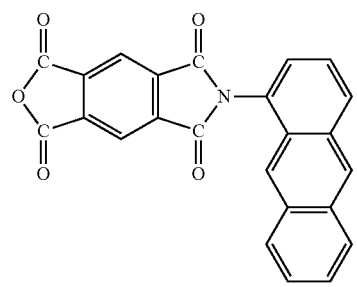
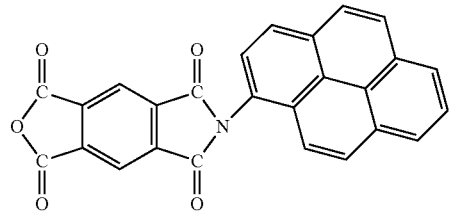
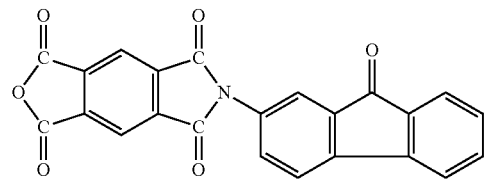
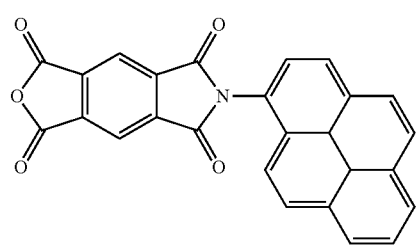
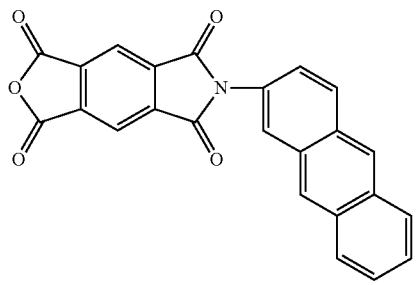

-continued
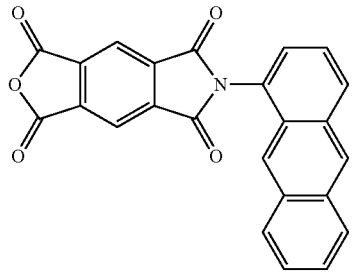
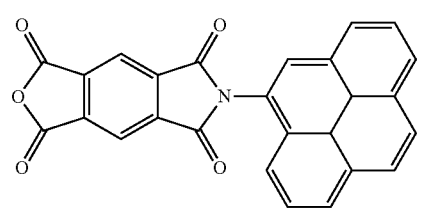
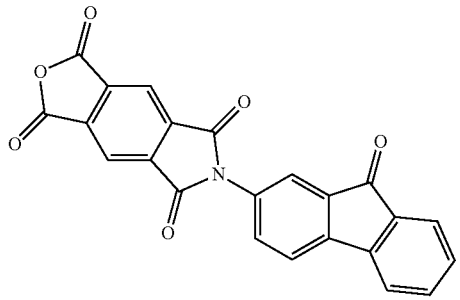
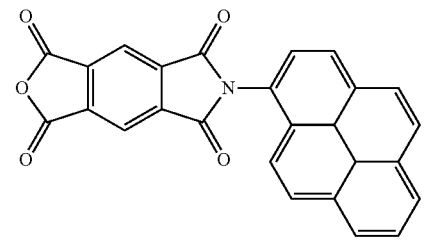
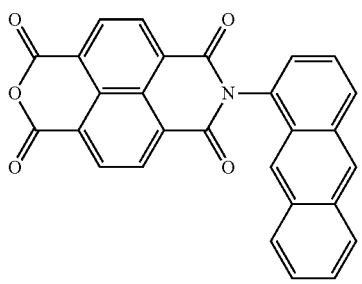
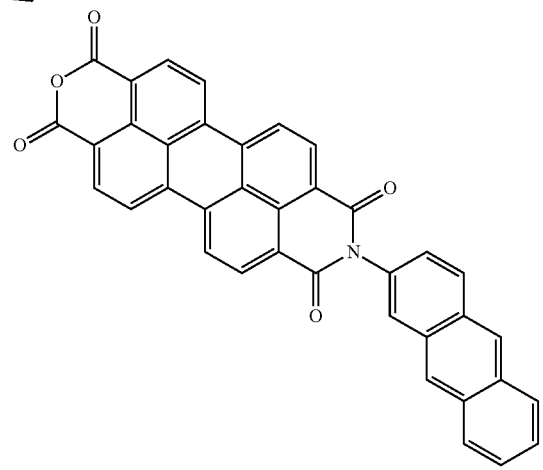
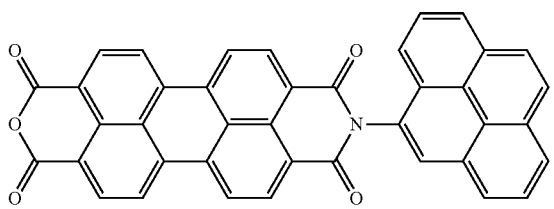
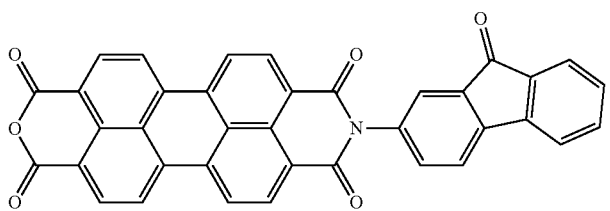
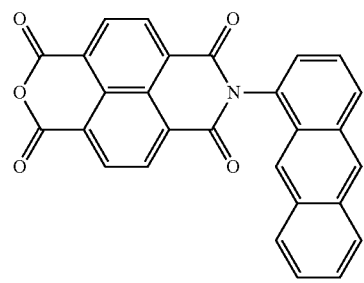
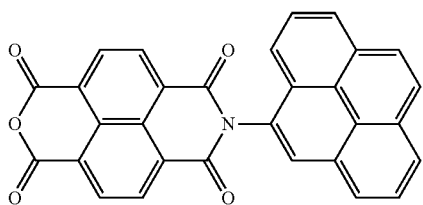
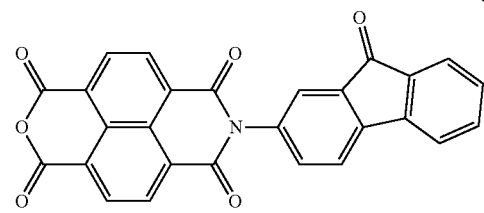

-continued
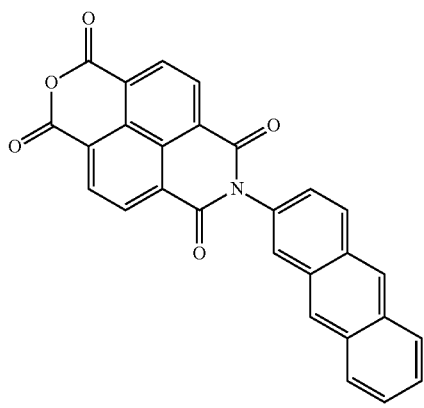
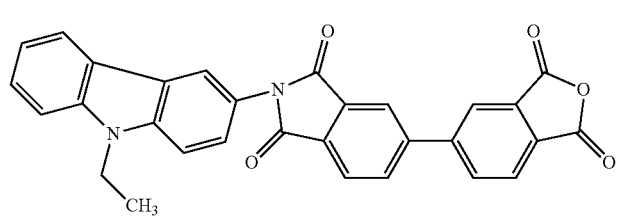
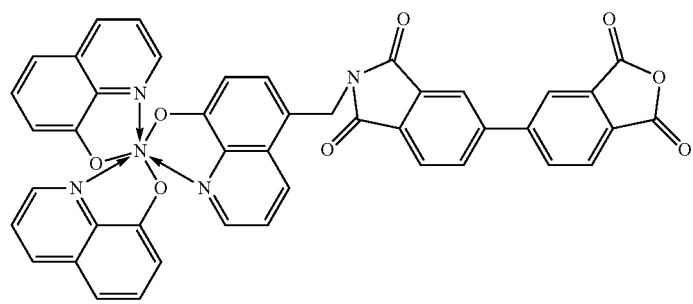
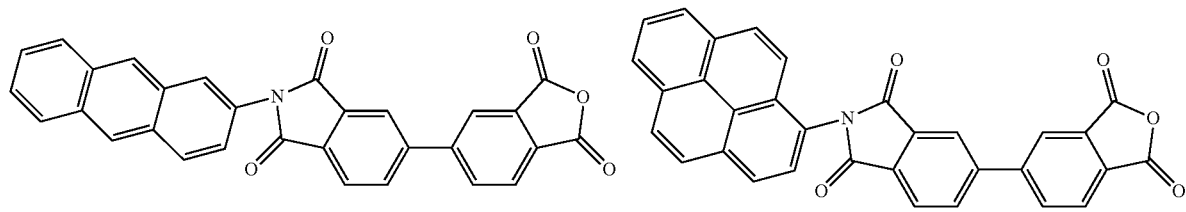
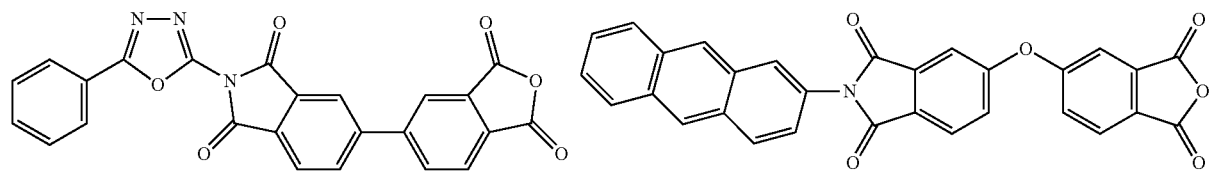
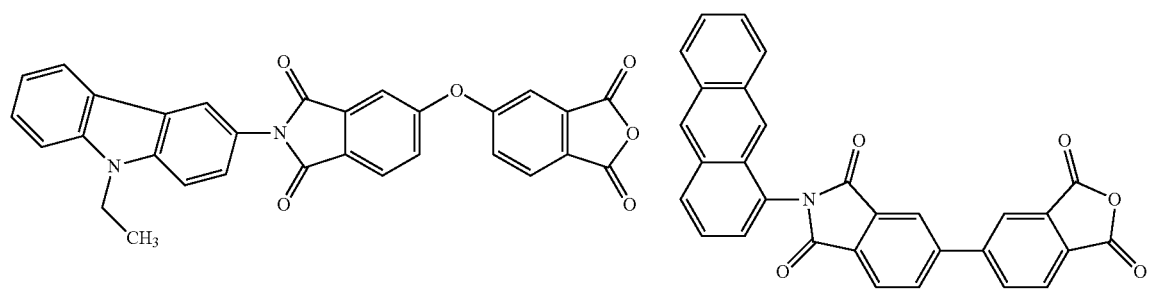

-continued
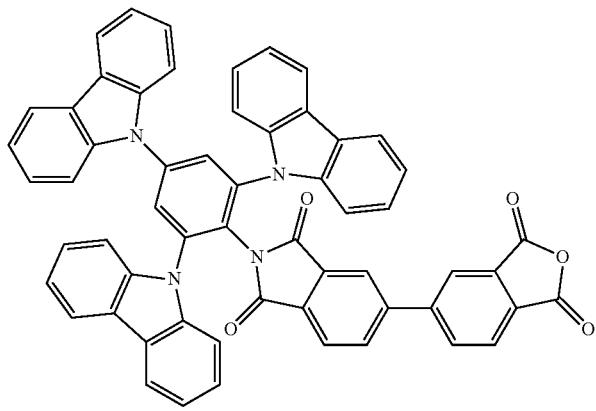
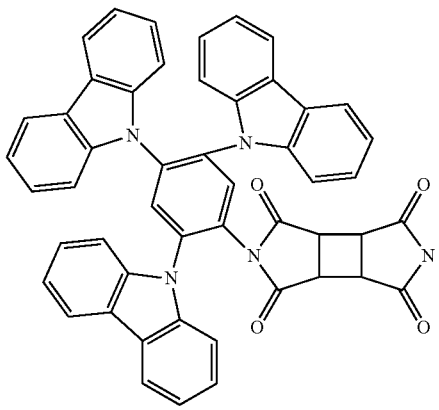
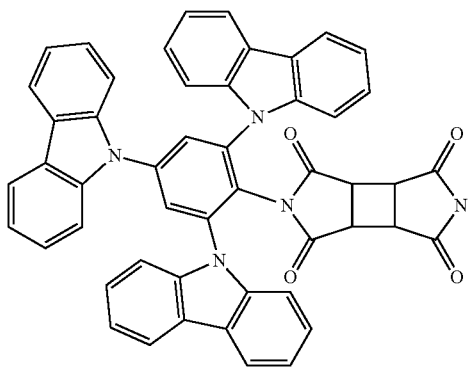
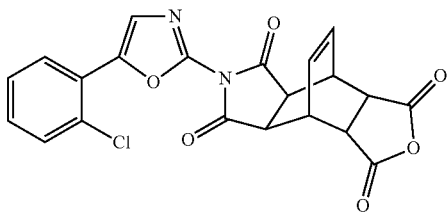
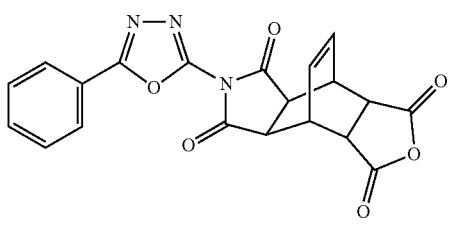
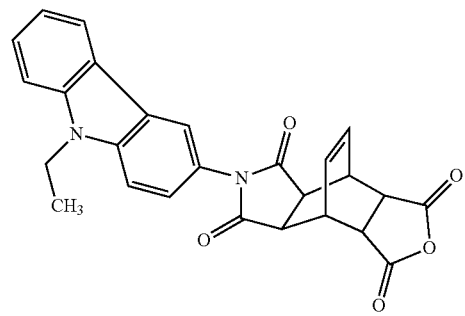
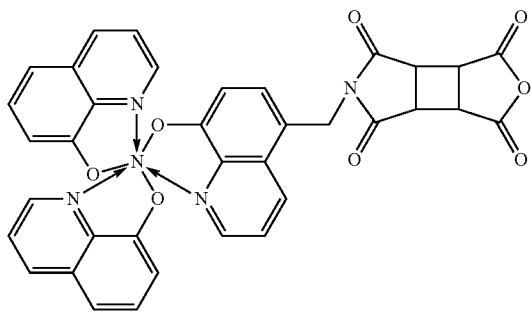
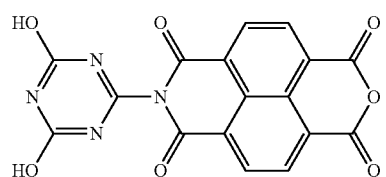

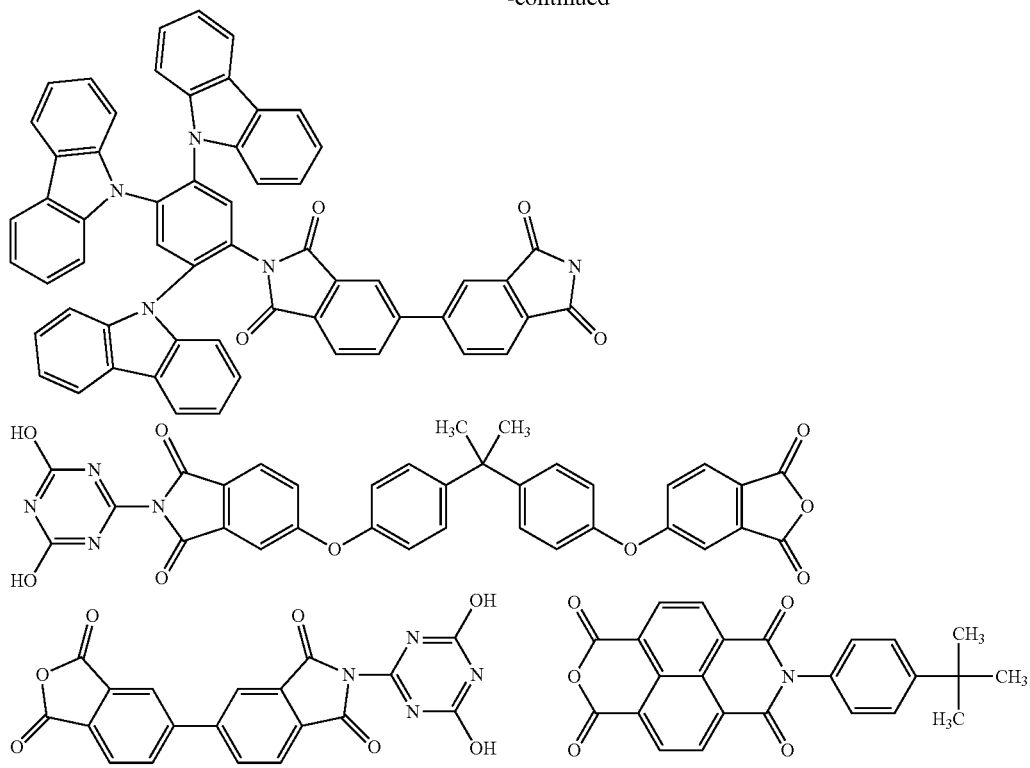

In a second step, the mono-anhydride is reacted with a functional primary amine of formula $L^2$-$R^2$—NH2, where $L^2$ is either —COOH or OH; $R^2$ is selected from the group comprising an aliphatic or cycloaliphatic hydrocarbon group having 1 to 20 carbon atoms, an aromatic group or multicyclic aromatic nucleus; to give a monovalent cyclic bisimide electron-transport luminescent material of this invention.

All of the compounds from this reaction scheme can be decolorized with charcoal and recrystallized from p-dioxane. The full reaction scheme is shown below.

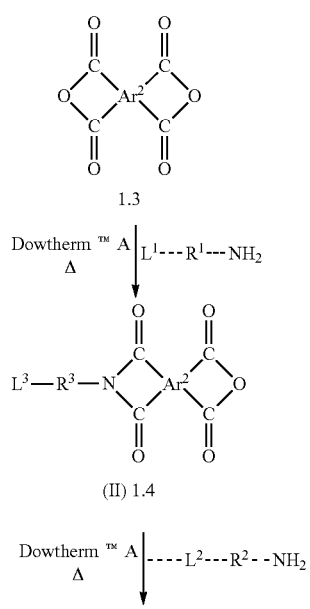

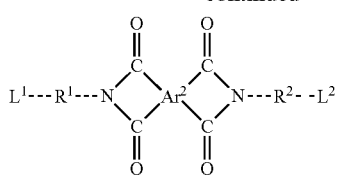

Specific examples of the novel monovalent luminescent bis-imides include, but not limited to:

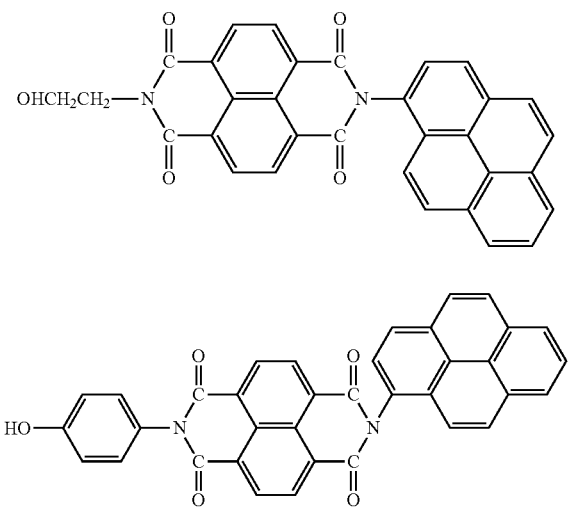

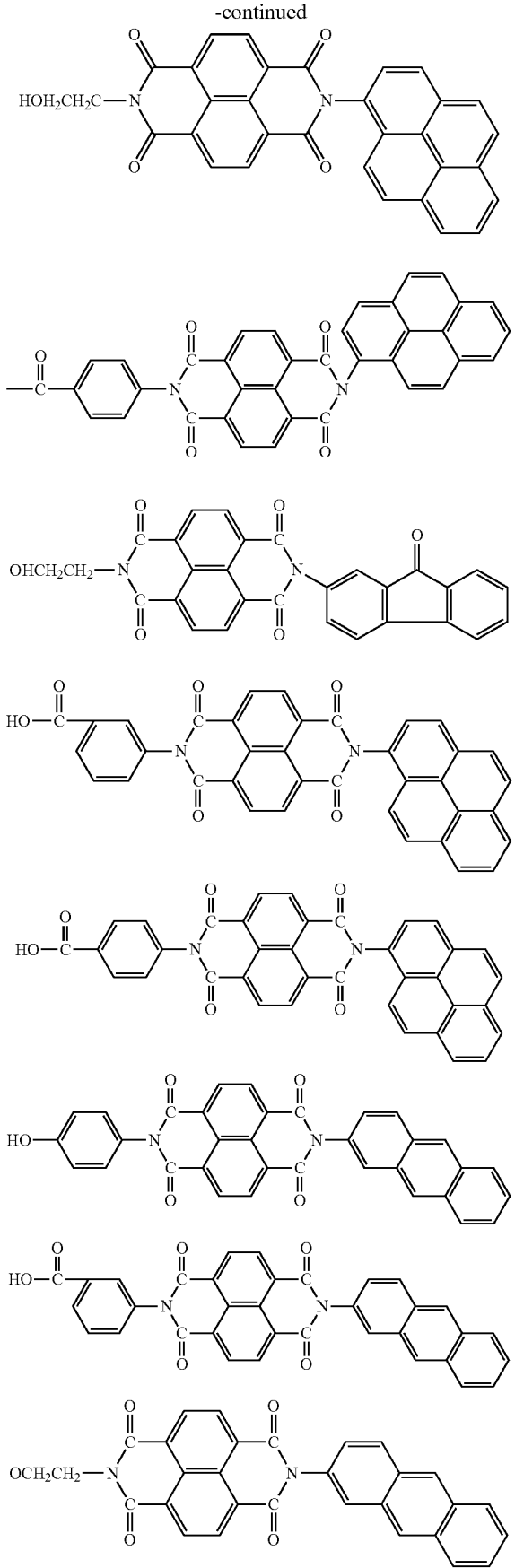

A similar scheme can be used to generate monovalent charge-transporting moieties containing carbazole or imidazole or other charge-transporting group(s). The reaction reported in J. Cho et al, Bull. Korean Chem. Soc. 2011, Vol. 32, No. 7 2461 can be adapted to prepare a dicarbazole substituted aniline that can be further reacted with excess biscyclic anhydride to generate a mono-anhydride-containing carbazole that can be reacted directly with diamines to provide luminescent molecular glass imides of this invention. Alternately the mono-anhydride-containing anhydride can further reacted with a functional mono-amine to generate mono-alcohol or mono-carboxyl chloride that can be used to generate luminescent molecular glass esters, urethanes, or amides of this invention. The following scheme illustrates this approach:

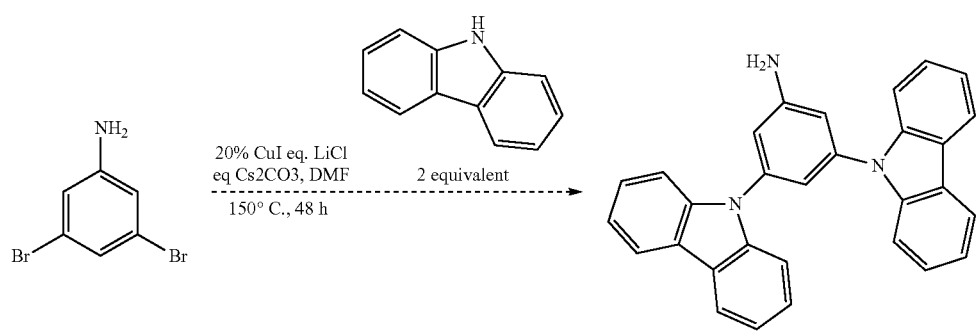

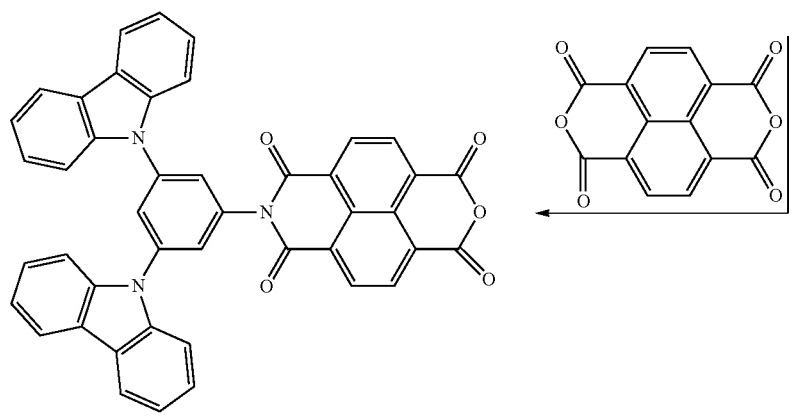

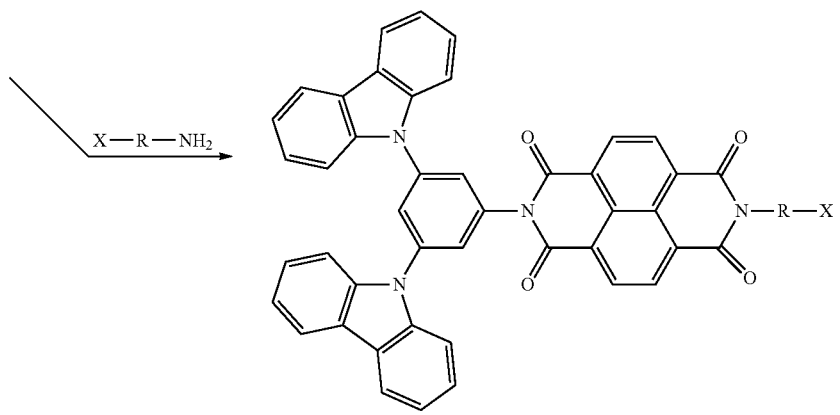

R = alkyl, phenyl, multicyclic aromatic
X = OH, CO₂H

The carbazole can be replaced by starting materials such as N-phenyl-1-anthramine, N-phenyl-2-anthramine, N-phenyl-9-anthramine, 4-Methyldiphenylamine, m,m'-Ditolylamine, 3-methoxydiphenylamine, 4,4-Dimetoxydiphenylamine, Bis(4-biphenyl)amine), Bis(4-tert-butylphenyl)-amine, N-Phenyl-3-biphenylamine, N-Phenyl-4-biphenylamine, 1,2'-Dinaphtylamine, 2,2'-Dinaphthylamine, 1,2'-Dinaphthylamine, N-Phenyl-1-naphthylamine, N-Phenyl-2-naphthylamine, N-(p-Tolyl)-1-naphthylamine, N-(p-Tolyl)-2-naphthylamine all available at TC, or by 2-Phenylbenzimidazole

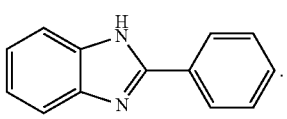 [SMILES: c1ccc(-c2nc3ccccc3[nH]2)cc1]

The following are examples (although not exhaustive) of intermediates that can be prepared for making the final luminescent molecular glass mixtures of this invention:

51
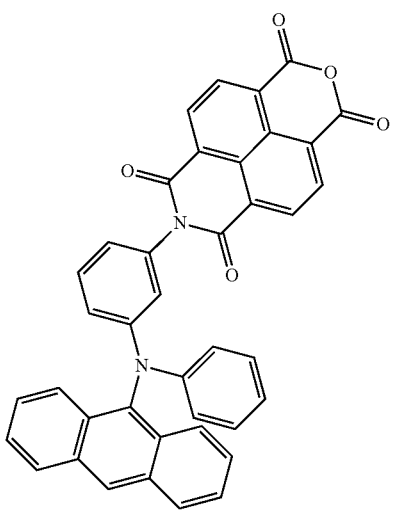
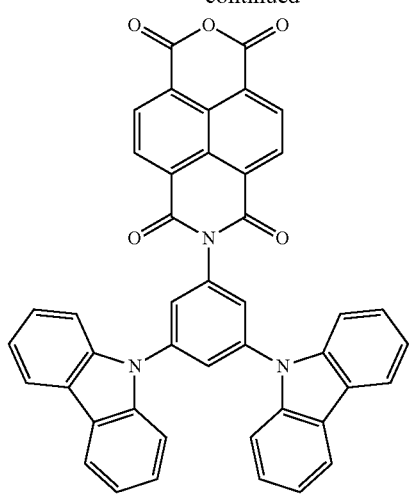
52
-continued
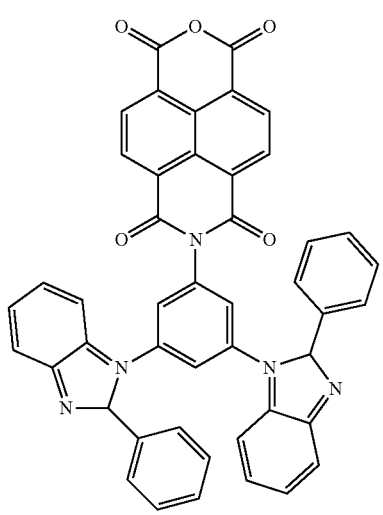
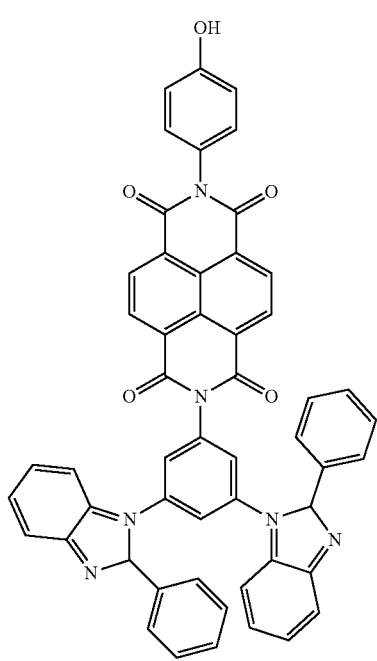

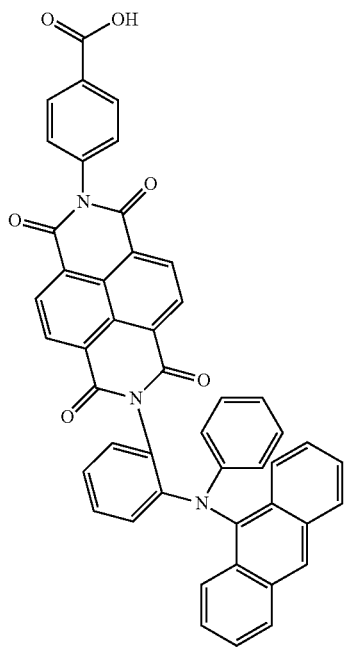
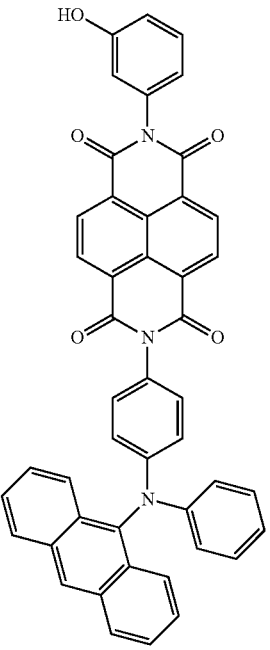
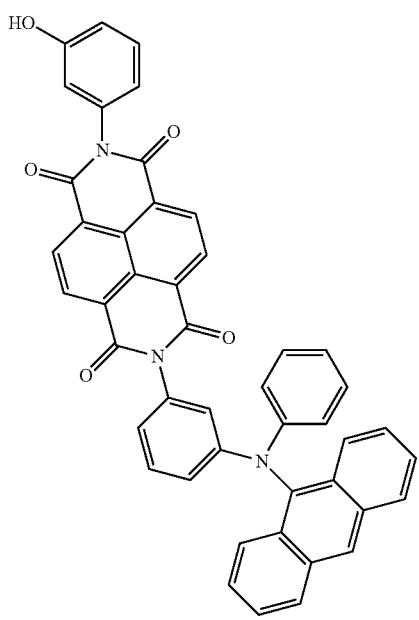
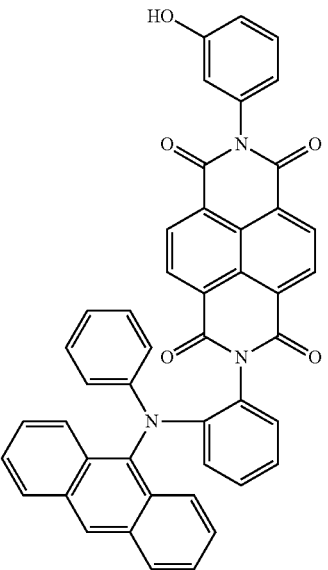

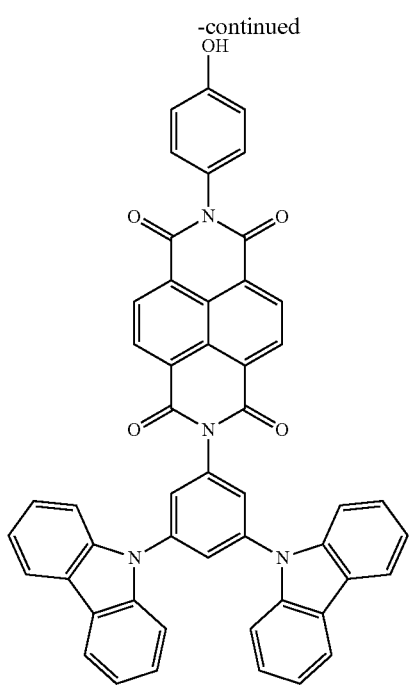

Using a similar scheme with an halogen-metoxy-substituted cyclic or multicyclic aromatic nucleus a series of mono or multi-substituted alcohol-containing charge-transporting, luminescent, or combinations thereof starting materials can be synthesized. Following is an example of this approach using 4-Bromo-2-methoxyaniline:

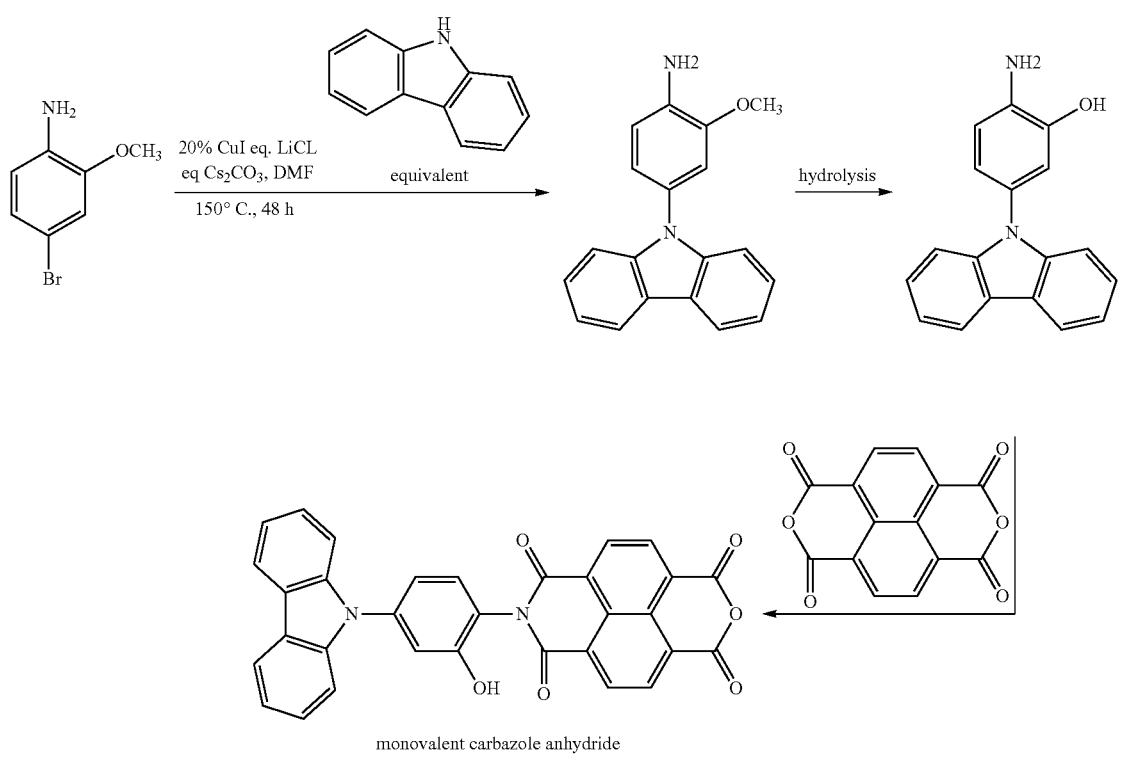

monovalent carbazole anhydride

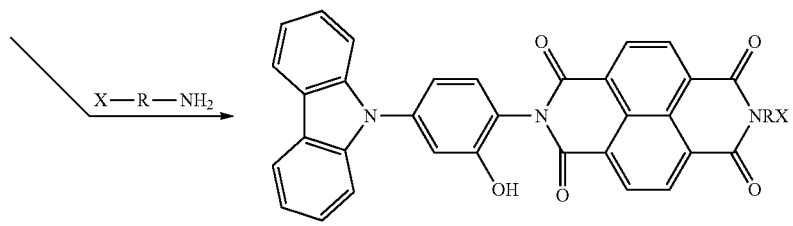

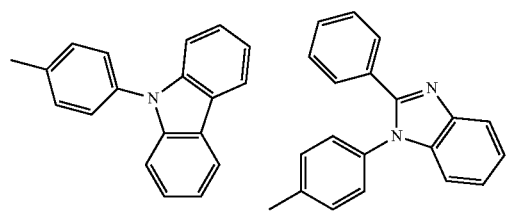

R = alkyl, phenyl, multicyclic aromatic
X = OH, CO₂H

The carbazole can be replaced by starting materials such as N-phenyl-1-anthramine, -phenyl-2-anthramine, N-phenyl-9-anthramine, 4-Methyldiphenylamine, m,m'-Ditolylamine, 3-methoxydiphenylamine, 4,4-Dimetoxydiphenylamine, Bis(4-biphenyl)amine), Bis(4-tert-butylphenyl)-amine, N-Phenyl-3-biphenylamine, N-Phenyl-4-biphenylamine, 1,2'-Dinaphtylamine, 2,2'-Dinaphthylamine.

The following are examples (although not exhaustive) of intermediates that can be prepared for making the final luminescent molecular glass mixtures of this invention:

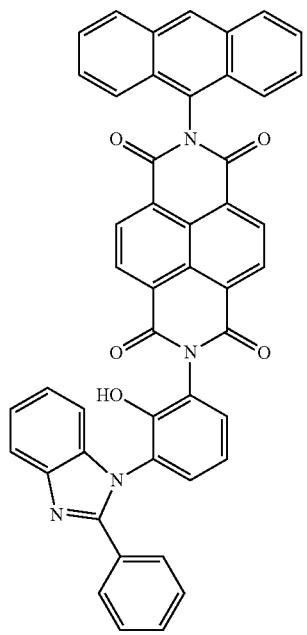

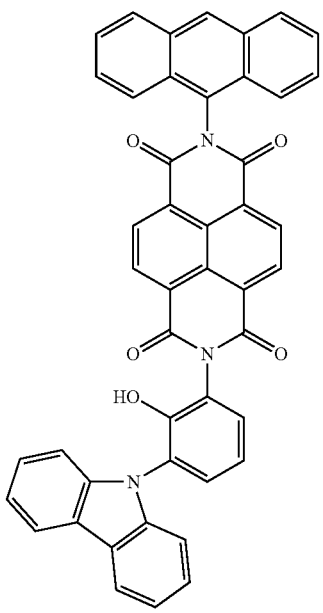

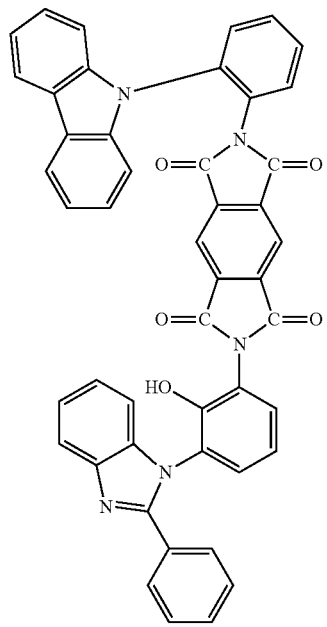

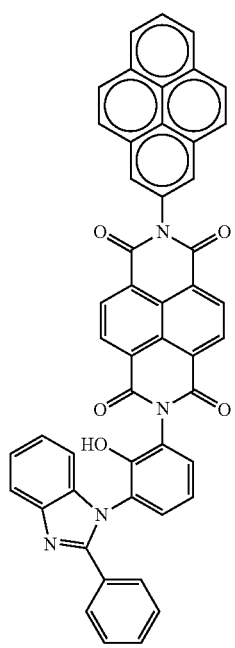

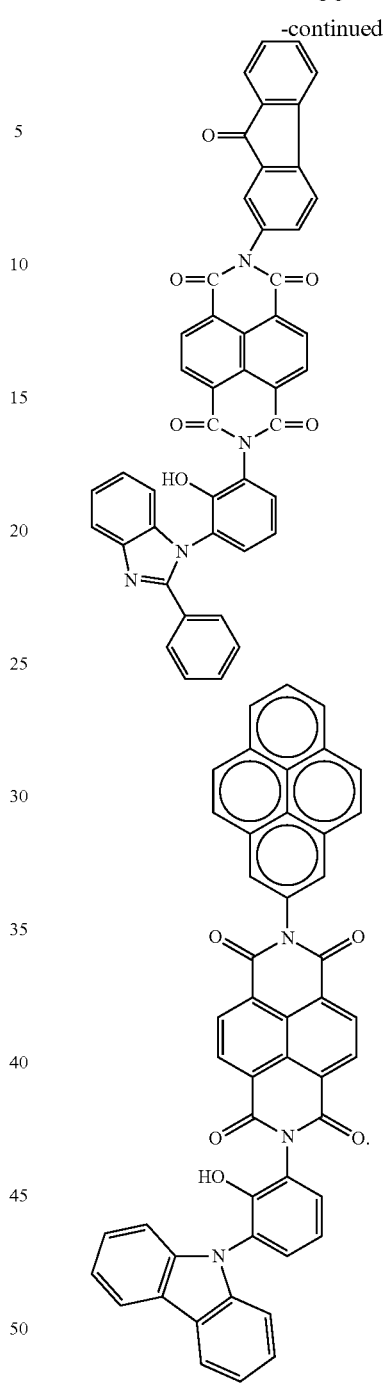

The mono-substituted anhydrides described above can also be used to prepare asymmetric glass mixtures, by reacting the monoanhydride with mixtures of monosubstituted amines. The monosubstituted amines can be aliphatic or aromatic, charge-transporting or electroluminesecent, or inert. Asymmetric glass mixtures can enhance the noncrystallizability of glass mixtures containing highly symmetrical and rigid nuclei.

Other examples of mono hydroxyl luminescent intermediates useful in the preparation of the luminescent molecular glass mixtures of this invention include those materials prepared from a mono-metoxy-substituted primary or secondary aromatic amines, such as, 3-Metoxydiphenylamine.

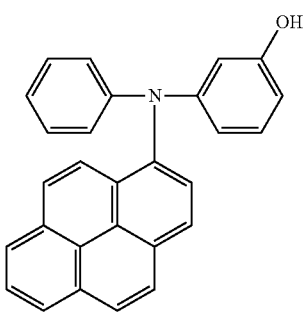

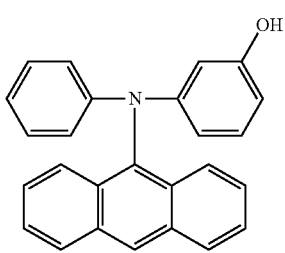

Examples of mono-amino luminescent starting materials include phosphorescent metal complexes available from Sigma-Aldrich:

Tris(dibenzoylmethane) mono(5-amino-1,10-phenanthroline)europium the amino-functionalized Alq3 metal complex reported in Journal of the Korean Physical Society, Vol. 53, No. 6, 2008, pp. 3563-3567

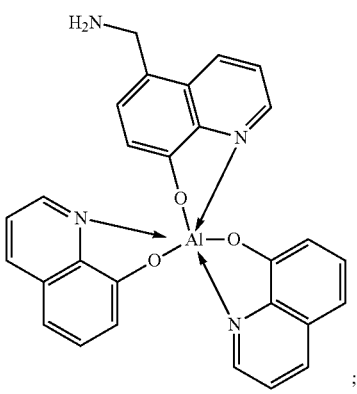

a tri-amino-substituted Alq3 can be prepared according to this reaction scheme from the 5-Amino-8-hydroxyquinoline available at Sigma Aldrich:

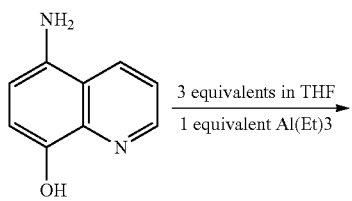

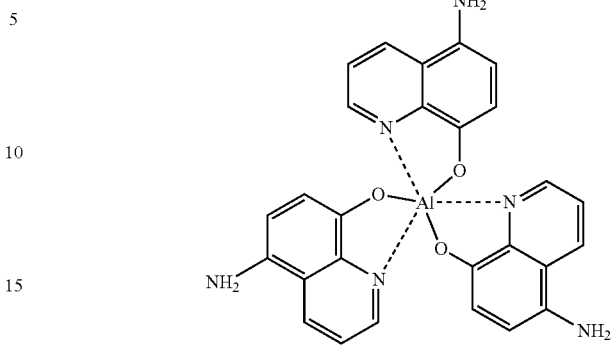

and other phosphorescent metal complexes capable of being functionalized for incorporation in a glass mixture.

Representative starting materials having a multicyclic aromatic nucleus and at least two functional (reactive) groups are selected from the following materials presented by Molaire in U.S. Pat. No. 4,626,361 which is hereby incorporated by reference in its entirely into this specification. (listed A through M).

A. The phenylindan diols of J. C. Wilson, Research Disclosure 11833, February 1974, and J. C. Wilson, U.S. Pat. Nos. 3,803,096, 3,859,364 and 3,886,124 and the phenylindan diamines of J. C. Wilson, U.S. Pat. Nos. 3,897,253 and 3,915,939, the disclosures of these United States patents are hereby incorporated by reference into this specification, having the structures:

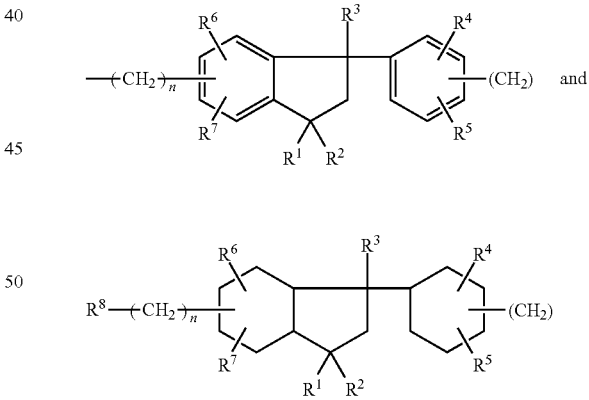

wherein $R^1$ and $R^3$ are independently selected from the group consisting of hydrogen and alkyl radicals of from 1 to 6 carbon atoms; $R^2$ is an alkyl radical of from 1 to 6 carbon atoms; $R^4$, $R^5$, $R^6$, and $R^7$ are independently selected from the group consisting of hydrogen, aryl radicals, halogen atoms, nitro radicals, cyano radicals, amino radicals, and alkoxy radicals; R is hydroxy or amino; and n is 0 or 1.

B. The 1,1'-spirobiindan diols and diamines of F. L. Hamb and J. C. Wilson, U.S. Pat. No. 3,725,070; and the 1-1'-spirobiindan (dicarboxylic acids) of Research Disclosure 9830, June, 1972 (anonymous), of the structure:

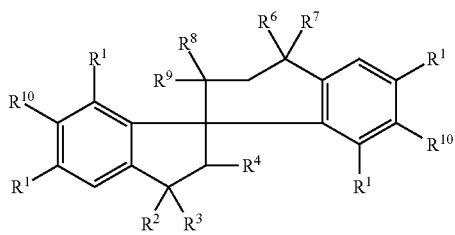

wherein each $R^1$ independently is selected from the group consisting of hydrogen atoms, or alkyl radicals having 1 to 12 carbon atoms; $R^2$, $R^3$, $R^4$, $R^5$, $R^6$, $R^7$, $R^8$, and $R^9$ are independently selected from the group consisting of hydrogen atoms and alkyl radicals of from 1 to 5 carbon atoms; $R^{10}$ is —OH, —NH$_2$, or —OCH$_2$COOH.

C. The 1,1'-spirobiindan-5,5'-diamines of J. C. Wilson, Research Disclosure 13117, March, 1975, with the structure:

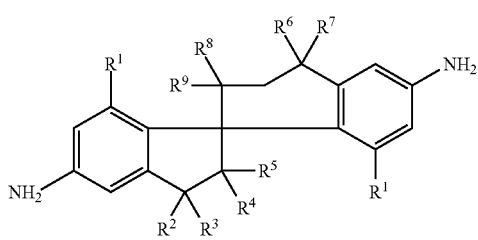

wherein each $R^1$ is independently selected from hydrogen atoms and alkyl radicals of 1 to 12 carbon atoms; and $R^2$, $R^3$, $R^4$, $R^5$, $R^6$, $R^7$, $R^8$, and $R^9$ are independently selected from the group consisting of hydrogen atoms and alkyl radicals of from 1 to 5 carbon atoms.

D. The 2,2'-spirobichromans of F. L. Hamb and J. C. Wilson, U.S. Pat. No. 3,859,097 of the structure:

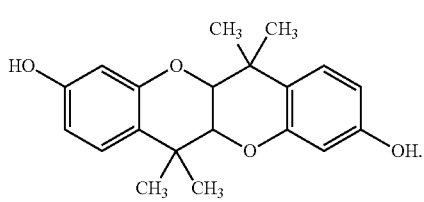 [SMILES: CC1(C)c2ccc(O)cc2OC2C1Oc1cc(O)ccc1C2(C)C]

E. The 7,7-dimethyl-7H-dibenzoxanthene diols of F. L. Hamb and J. C. Wilson, U.S. Pat. Nos. 3,859,254 and 3,902,904, which are hereby incorporated by reference in their entirely, of the structure:

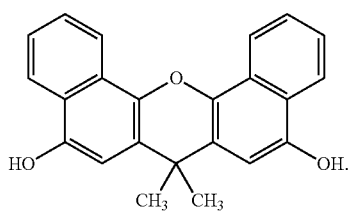

F. The 9,9-dimethylxanthene-3,6-bis(oxyacetic acids) of Research Disclosure 9830, June, 1972 (Anonymous) with the structure:

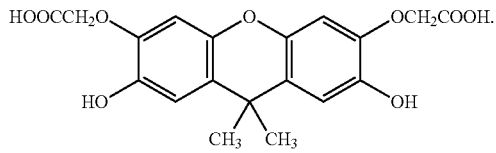

G. The xanthylium salts of J. C. Wilson, U.S. Pat. No. 3,856,751, with the structure:

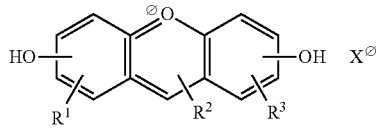

wherein $R^1$, $R^2$ and $R^3$ are hydrogen, alkyl, aryl, halogen, alkoxy, or cyano; and $X^\ominus$ is an acid anion.

H. The 4,4-(3-phenyl-1-indanylidene)diphenols of J. C. Wilson, Research Disclosure 13101, March, 1975, with the structure:

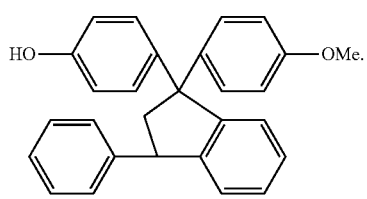 [SMILES: COc1ccc(C2(c3ccc(O)cc3)CC(c3ccccc3)c3ccccc32)cc1]

I. The 4,4-(hexahydro-4,7-methanoindan-5-ylidene)diphenols of M. A. Sandhu, Research Disclosure 13568, July, 1975, with the structure:

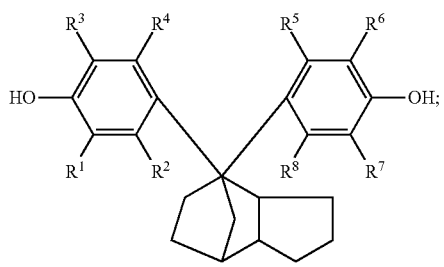

wherein $R^1$, $R^2$, $R^3$, $R^4$, $R^5$, $R^6$, $R^7$, and $R^8$ are independently hydrogen, halogen, cyano, alkyl of 1 to 8 carbon atoms, or alkoxy of 1 to 8 carbon atoms.

J. The bisphenols of T. L. Conklin and F. L. Hamb, Research Disclosure 12012, April, 1974, and the halogenated bisphenols of M. A. Sandhu, Research Disclosure 13569, July, 1975, with the structure:

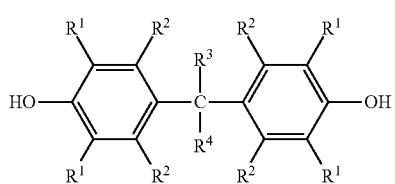

wherein each $R^1$ is hydrogen, halogen, preferably chloro or bromo, alkyl of 1 to 8 carbon atoms, or alkoxy of 1 to 8 carbons; each $R^2$ is hydrogen, alkyl of 1 to 8 carbon atoms or alkoxy of 1 to 8 carbon atoms; and $R^3$ and $R^4$ are alkyl of about 1 to 6 carbon atoms.

K. The sulfonyldibenzoic acids of M. A. Sandhu, Research Disclosure 14016, December, 1975, with the structure:

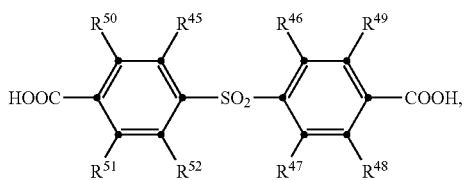

wherein each of $R^{45}$ through $R^{52}$ is independently from hydrogen, halogen, preferably chloro or bromo, and alkyl of about 1 to 4 carbon atoms.

L. The polycyclic norbornanes of Research Disclosure 9207, December, 1971 (Anonymous), with the structure:

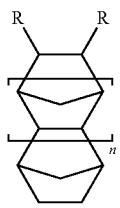

wherein n is 0 to 3 and R is —COOH or —CH$_2$OH.

M. The 1,2,3,4-tetrahydronaphthalenes of M. A. Sandhu, Research Disclosure 13570, July, 1975, with the structure:

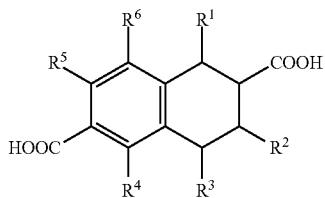

wherein each of $R^1$ through $R^6$ is independently selected from hydrogen, halogen or lower alkyl at 1 to 4 atoms.

Other useful polyfunctional compounds include commercially available bisphenols such as tetrabromophenolphthalein, tetrachlorophenolphthalein, tetrabromophenol blue, Eosin B, tetrabromocresol blue, hematoxylin, 4',5'-diiodofluorescein, the polyhydroxy aromatic condensation product of pyrogallol and acetone, quercetin and derivatives thereof, the 9,9-bis(4-amino-3-benzoylphenyl)fluorene, 9,9-bis(4-aminophenyl)-10-anthrone and derivatives thereof reported in Macromolecules 14, p. 486-493 (1981), and other multifunctional molecules susceptible to quantitative condensation reaction to yield mixed esters, or mixed amides, or mixed imides, or mixed urethanes, or any other mixtures of organic materials that are non-crystallizable, and have glass-transition temperatures well above room temperature, i.e., above 50° C., preferably above 55° C.

Examples of monofunctional compounds that can be incorporated into the molecular charge-transporting glass mixtures of this invention include:

A. substituted benzene functionalized compounds of the structure:

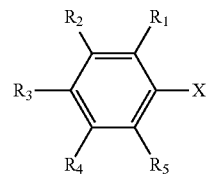

wherein $R_1$, $R_2$, $R_3$, $R^4$ and $R_5$ are independently selected from the group consisting of hydrogen, aryl radicals, halogen atoms, nitro radicals, cyano radicals, amino radicals and alkoxy radicals, and X is selected from the group consisting of primary or secondary amino radicals, hydroxy radicals, acid radicals, isocyanate radicals, and the like;

B. substituted phthalic anhydride compounds of the structure:

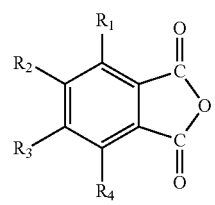

wherein $R_1$, $R_2$, $R_3$, $R^4$ are independently selected from the group consisting of hydrogen, aryl radicals, halogen atoms, nitro radicals, cyano radicals, and alkoxy radicals;

C. aliphatic acids, alcohols, isocyanates, amines, and derivatives thereof. Aliphatic monofunctional compounds are particularly useful in controlling the glass transition temperature of the mixture within the range useful for toner applications;

D. compounds having unsaturated polymerizable or crosslinkable groups such as acrylic acid, methacrylic acid and derivatives thereof, allyl alcohol, and the like;

E. any other monofunctional compounds susceptible to quantitative reactions amenable to the molecular charge-transporting glass mixtures of this invention.

Multivalent Asymmetric Nuclei

In the ninth embodiment of the present invention, asymmetric nuclei are used in the design of non-crystallizable molecular glass mixtures. It is preferable to use asymmetric nuclei in the design of non-crystallizable molecular glass mixtures. Asymmetric nuclei, depending on the extent of asymmetry will lead to larger number of structural components for the same number of substituents compared to their symmetric analogue, thus decreasing the likelihood of crystallization of the molecular glass mixture. A specific example of an asymmetric nucleus is the 2,3,3',4'-Biphenyltetracarboxylic acid dianhydride (BPDA), a-BPDA sold by Akron Polymer System of Akron, Ohio:

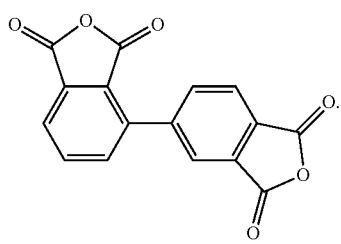 [SMILES: O=C1OC(=O)c2cc(-c3cccc4c3C(=O)OC4=O)ccc21]

Other examples of asymmetric nuclei include:

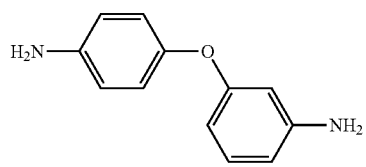

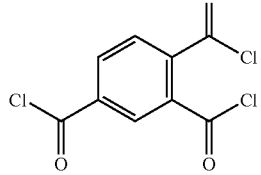

For example reacting two equivalent moles of an asymmetric bisanhydride with one equivalent mole of a diamine, yield a mixture of three asymmetric isomeric bisanhydride-terminated imides. The diamines can be electron transporting, hole transporting, luminescent, or a combination thereof. The resulting mixture can be further reacted with a mixture of monoamines to generate non-crystallizable imide molecular glass mixtures of the invention.

Specific examples of asymmetric isomeric bisanhydride-terminated imides include:

1. Asymmetric-Isomeric Bisanhydride Imides 1: Pyrene based via the following reaction (Pyrene Imide Bisanhydride Asymmetric-Isomeric Mixture comprising the following three reaction products):

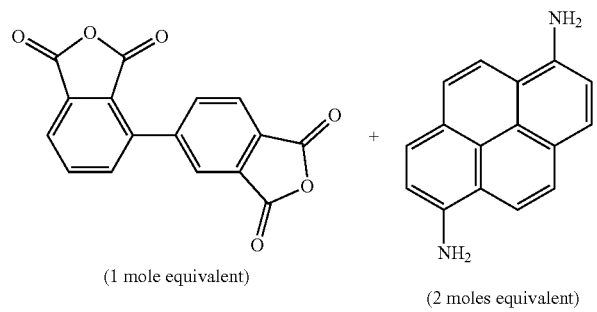

(1 mole equivalent)     (2 moles equivalent)

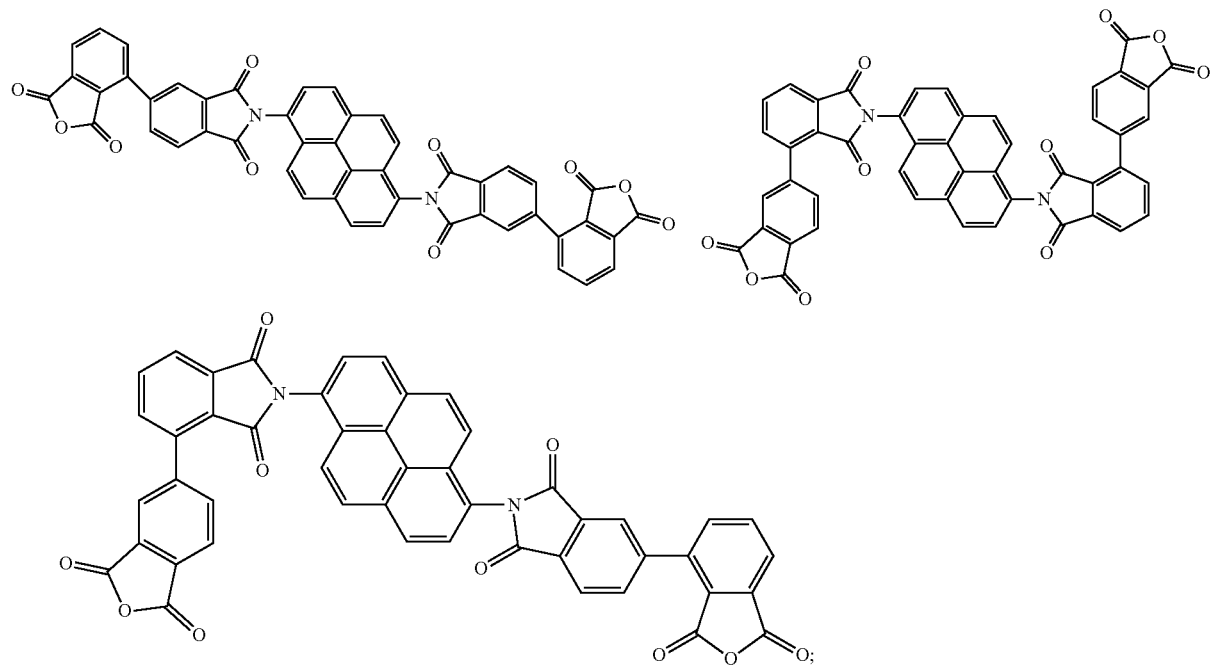

(Asymmetric-Isomeric Bisanhydride Imides 1: Pyrene based);

2. Asymmetric-Isomeric Bisanhydride Imides 2: Carbazole based via the following reaction (Carbazole Imide Bisanhydride Asymmetric-Isomeric Mixture comprising the following three reaction products):

3. Asymmetric-Isomeric Bisanhydride Imides 3: Oxadiazole based via the following reaction (Oxadiazole Imide Bisanhydride Asymmetric-Isomeric Mixture comprising the following three reaction products):

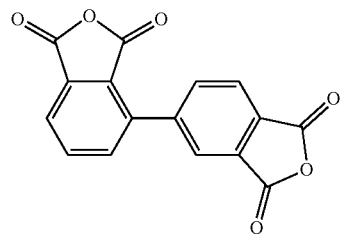

(2 moles equivalent) plus

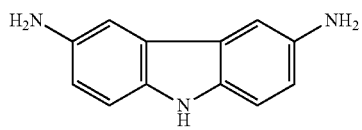

(1 mole equivalent)

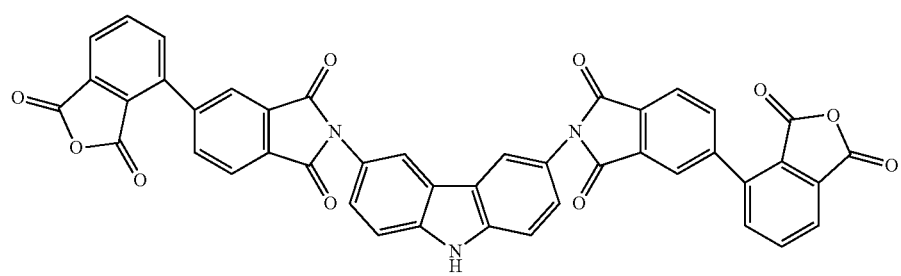

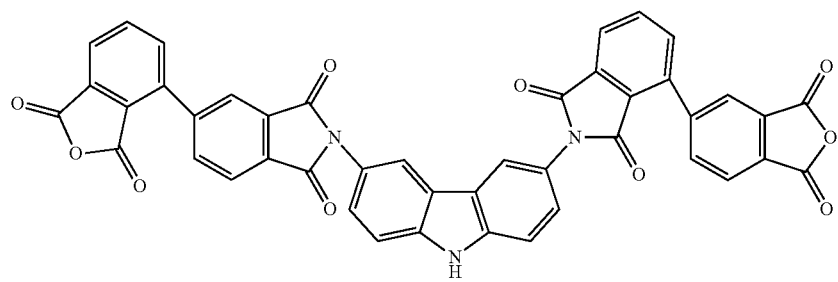

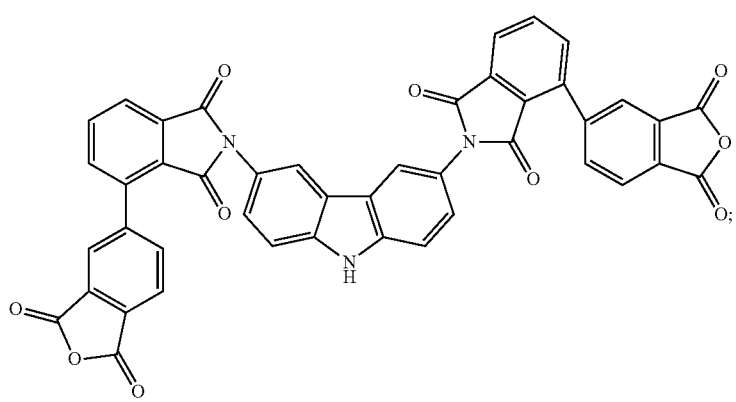

(Asymmetric-Isomeric Bishanhydride Imides 2: Carbazole based)

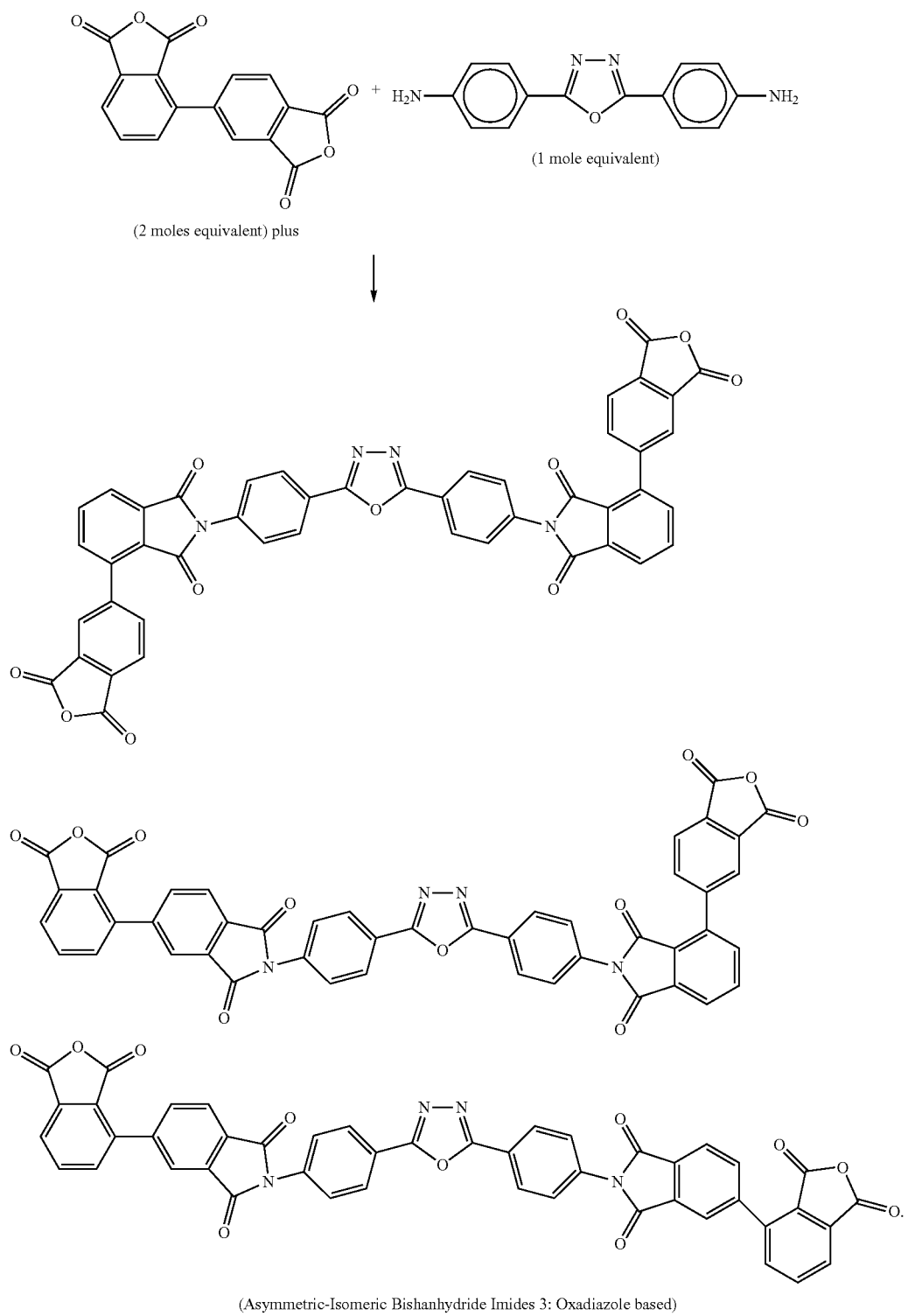

(Asymmetric-Isomeric Bishanhydride Imides 3: Oxadiazole based)

General Procedure

An important object of this invention is to provide a method of providing truly non-crystallizable charge transporting molecular glass mixtures; truly non-crystallizable luminescent molecular glass mixtures; and combinations thereof that can be easily purified by simple and economic processes. Truly amorphous materials by definition cannot be recrystallized. Thus because of that it is very difficult, or perhaps potentially costly to purify charge transport molecular glass mixtures containing high level of impurities and other compositions.

Accordingly, this invention only uses reactions that
1) are quantitative, that is the reaction is near 100% complete;

2) with either no byproducts;
3) or with byproducts that can be easily solubilized in water or other solvents and extracted efficiently.

Furthermore the procedure of this invention calls for pre-purification of all starting materials by either recrystallization, sublimation, or distillation to purity level required for poly-condensation reactions. This procedure eliminates the transport of unwanted impurities from any of the starting materials to the produced amorphous charge transport materials.

The reactions used by the present invention include:
1 reactions of purified acid chloride with purified alcohol to produce ester glass mixtures or with purified amines to produce amide glass mixtures, where the by product is HCl that can be either volatilized from the reaction mixture, neutralized by base to water soluble salts extractable by water and other aqueous solvents, or a combination thereof;
2 reactions of purified isocyanates with purified alcohol to produce urethane glass mixtures, or with purified amines to produce urea glass mixtures; these reactions are quantitative and have no appreciable byproducts; and
3 reactions of purified anhydrides and amines to produce imide glass mixtures. These reactions are quantitative with water as the byproduct.

The following are specific examples of reaction procedures.

1. Molecular Glass Mixture Reaction Procedure: Esterification/Amidation

One equivalent of the multifunctional starting material (neutral, hole-transporting, electron-transporting, luminescent, or a combination thereof) is mixed with an aprotic solvent such as dichloromethane with about 2.2 equivalents of tri-ethylamine in a three-necked, round-bottomed flask. The mixture is cooled to 0° C. using an ice-water mixture and magnetically stirred. Careful precaution is taken to keep water out of the reaction vessel. A mixture of purified mono acid chlorides (2 equivalents total) dissolved in the aprotic solvent is added drop-wise to the reaction vessel. After complete addition, the reaction is allowed to continue for one hour, at which time the precipitated salt is filtered off. The solution is subjected to the following extraction sequence:
  (a) two dilute sodium hydroxide solution washes (2%, cold);
  (b) two dilute hydrochloric acid solution washes; and
  (c) two distilled water washes.

The aprotic solvent solution is then dried over magnesium sulfate. The solvent is stripped off under vacuum at approximately 90° C. Complete removal of the dichloromethane is very important. A mixture of alcohol and an aprotic water-miscible solvent such as tetrahydrofuran (THF), acetone, dimethyl formamide (DMF), is chosen to dissolve the dried amorphous mixture. The resulting solution is precipitated into a large volume of water. The filtered solid is dried at a temperature about 20° C. above the glass transition temperature of the final molecular glass, in an air-circulating oven.

If necessary the mixture is further purified by column chromatography using silica gel and appropriate solvent, or solvent mixture.

The isolated material is characterized, using differential scanning calorimetry (DSC) for glass transition temperature, and liquid chromatography for composition. The "Component Equations" of Molaire are used to calculate the expected composition based on the functionality of the multifunctional hole-transport material and the number of mono acid chlorides. (*Organic Monomeric Glasses: A Novel Class of Materials*, M. F. Molaire et al, J of Polymer Science, Part A, Polymer Chemistry, Vol. 27, 2569-2592 (1989))

The following is a listing of specific examples of molecular glass mixtures that can be prepared by the procedure above:

Glass Mixture 1: which is a hole-transporting ester molecular glass mixture comprising the following six components:

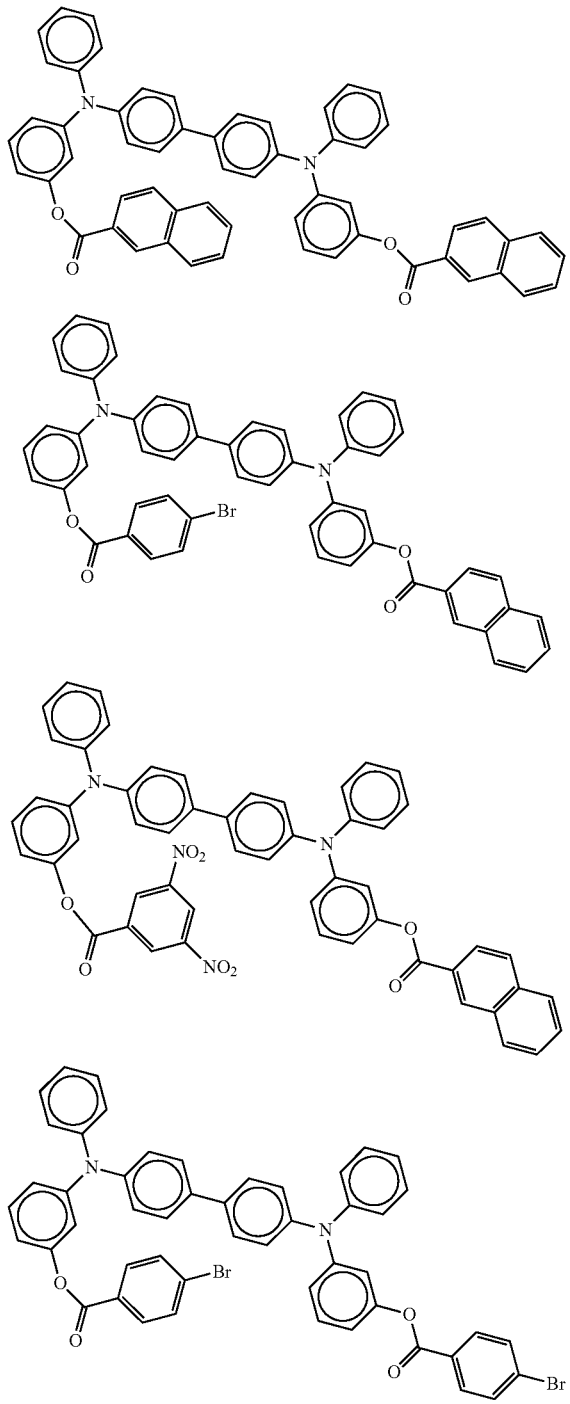

(Glass Mixture 1)

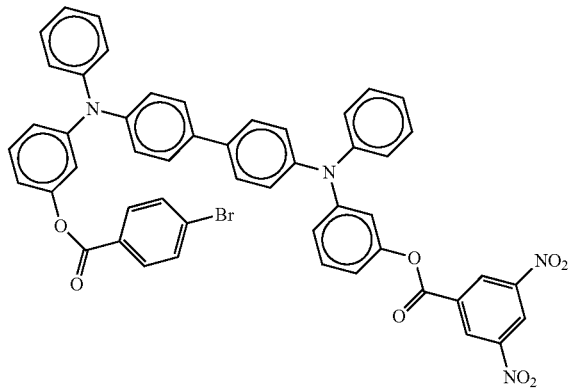
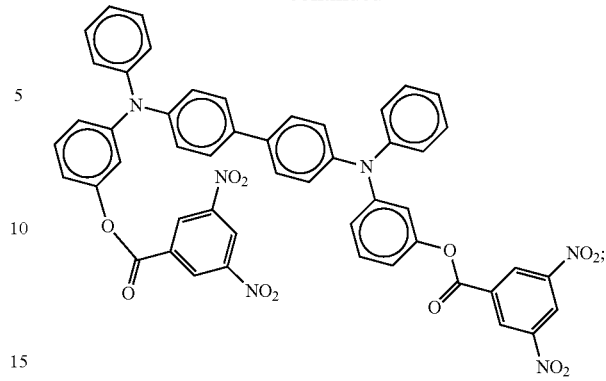
Glass Mixture 2: which is an electron-transporting amide molecular glass mixture comprising the following six components:
(Glass Mixture 2)
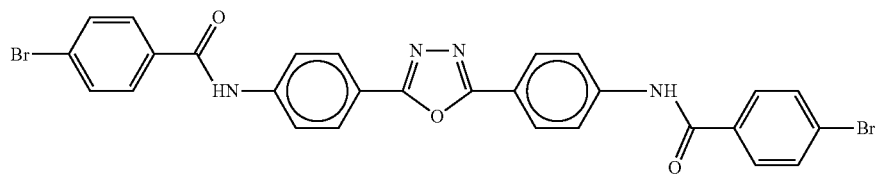
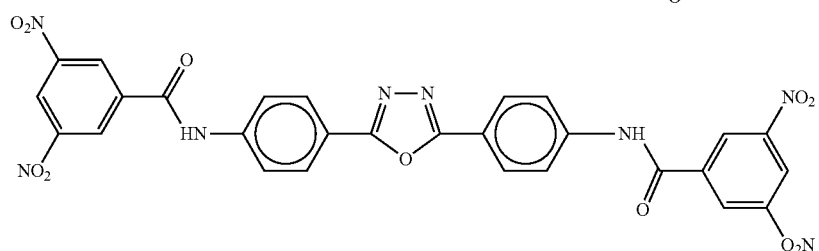
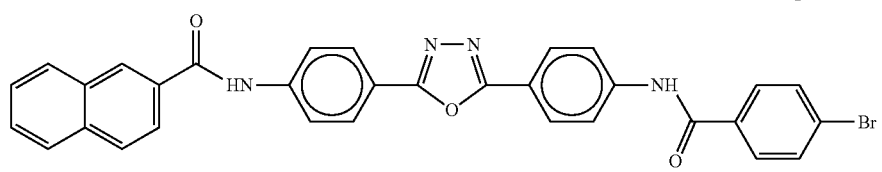
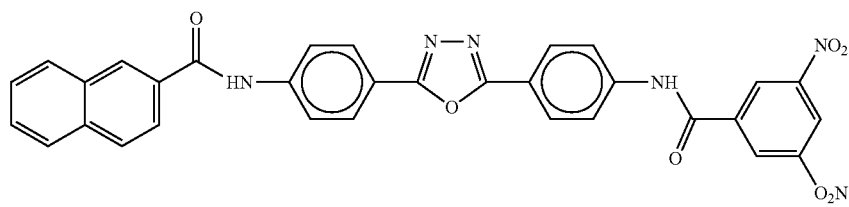
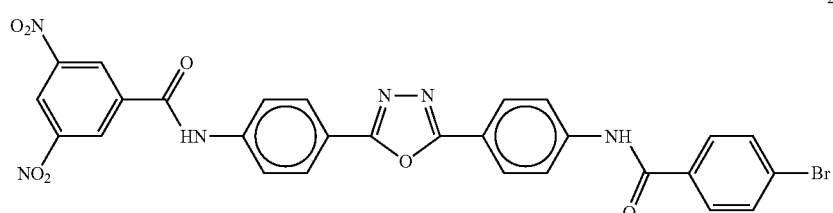
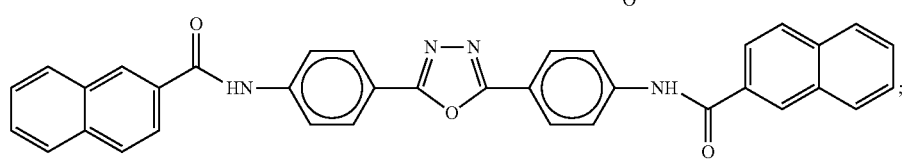

Glass Mixture 3: which is a bipolar luminescent ester molecular glass mixture comprising the following six components:
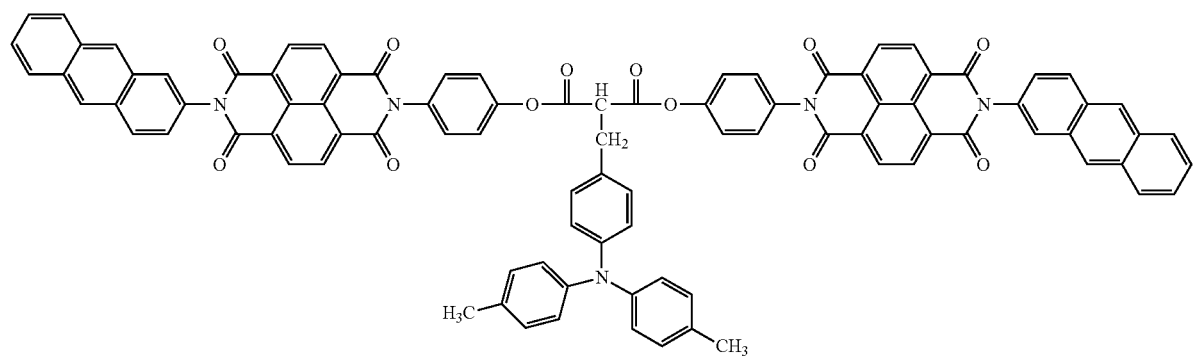
(Glass Mixture 3)
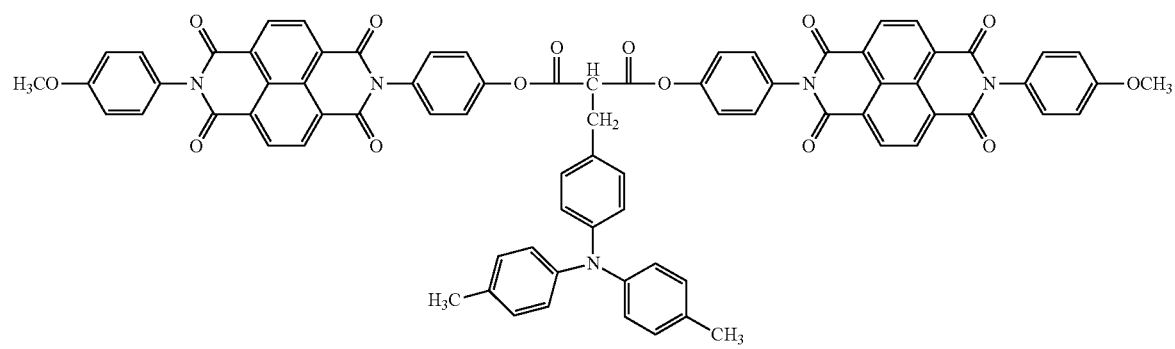
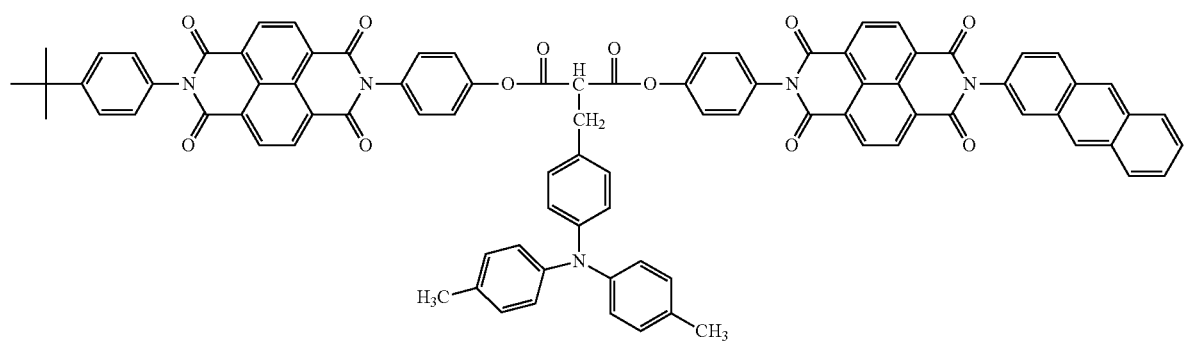
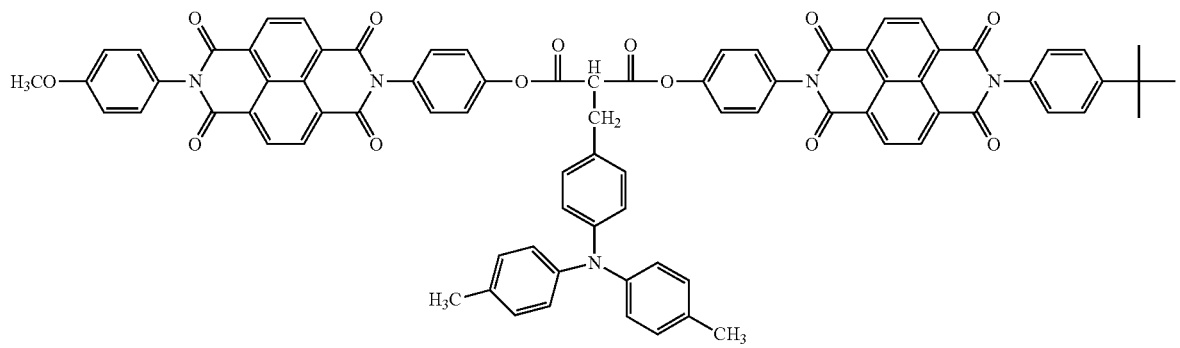

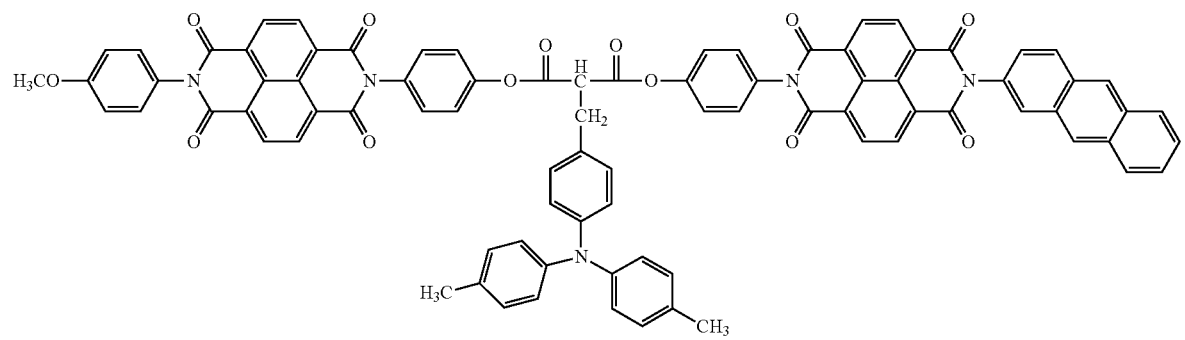
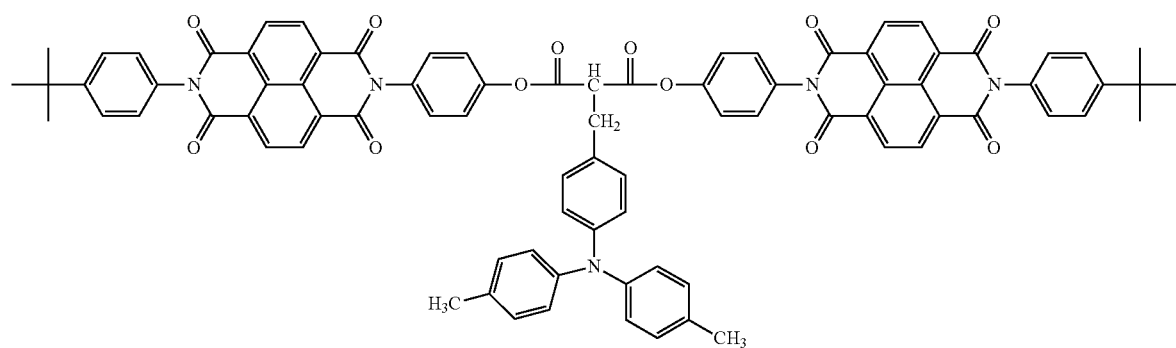
Glass Mixture 4: which is a hole-transporting luminescent ester molecular glass mixture comprising the following six components:
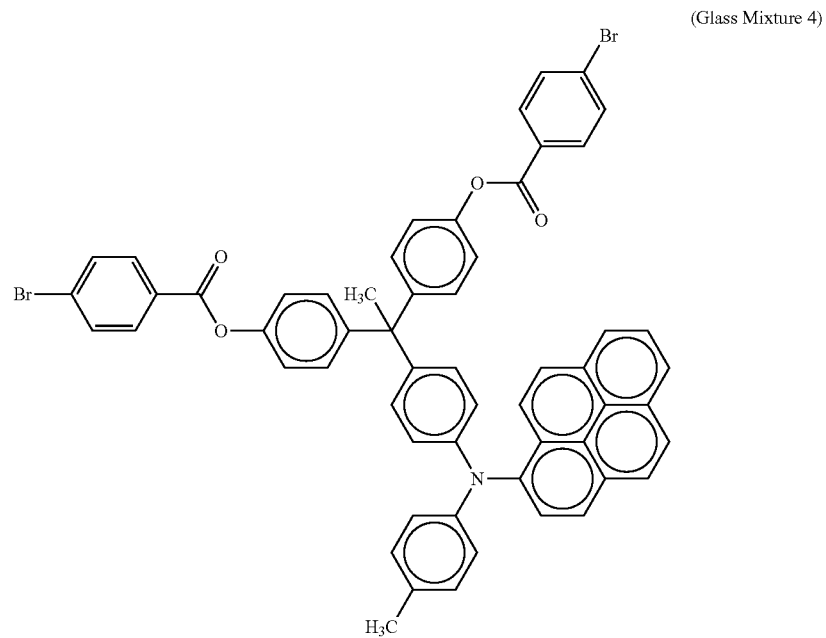
(Glass Mixture 4)

-continued
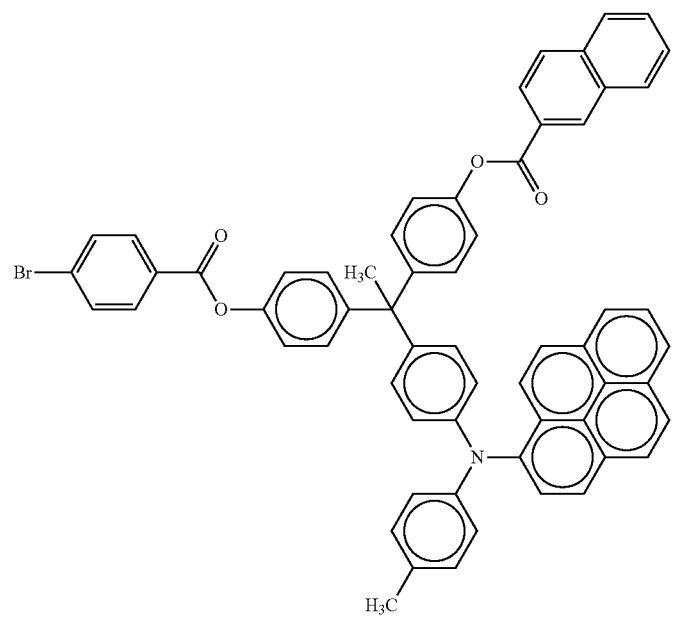
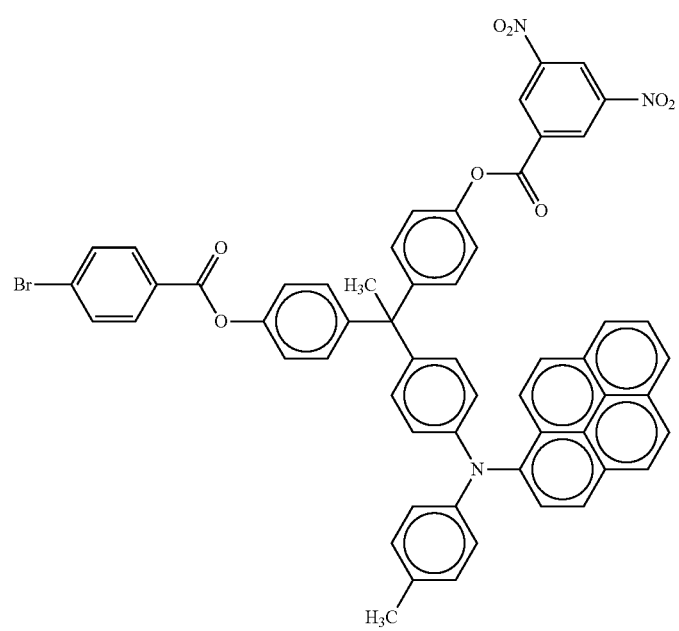

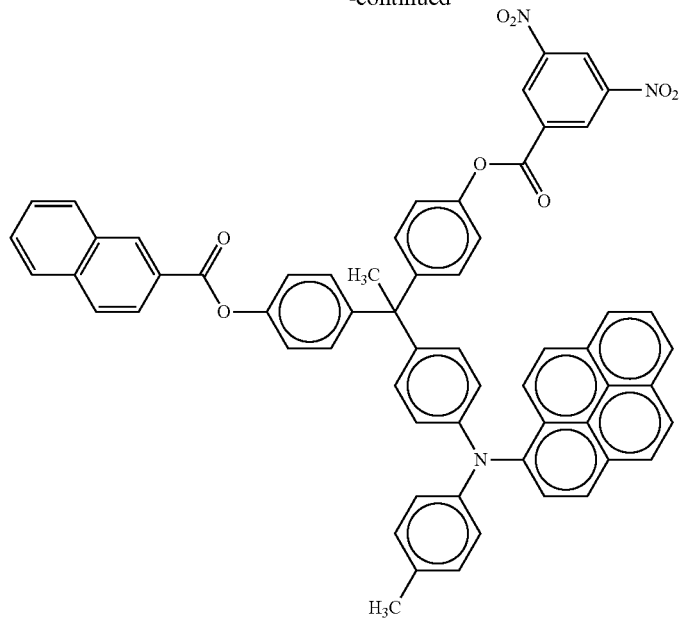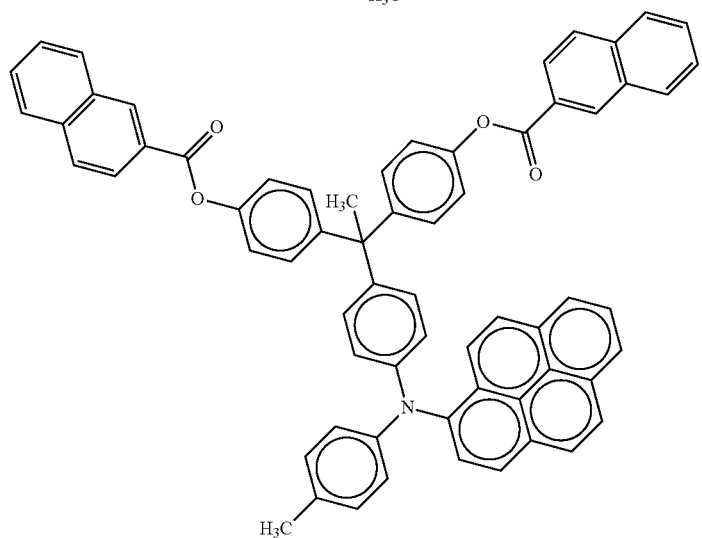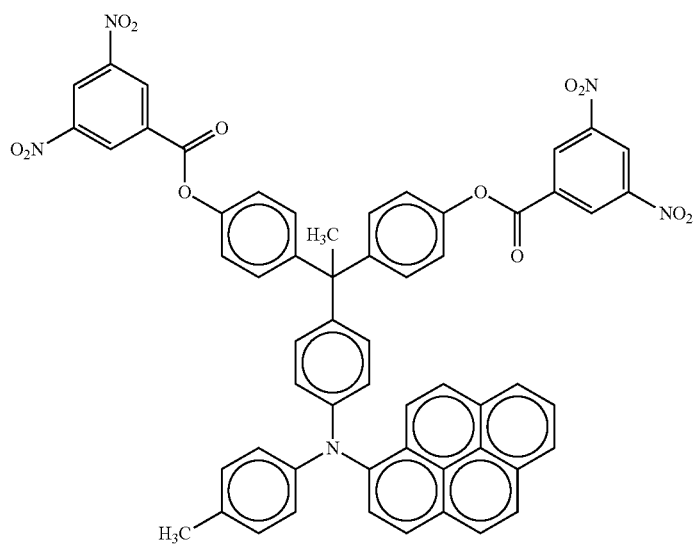

Glass Mixture 5: which is a water/alcohol soluble hole-transporting ester glass mixture comprising the following six components:
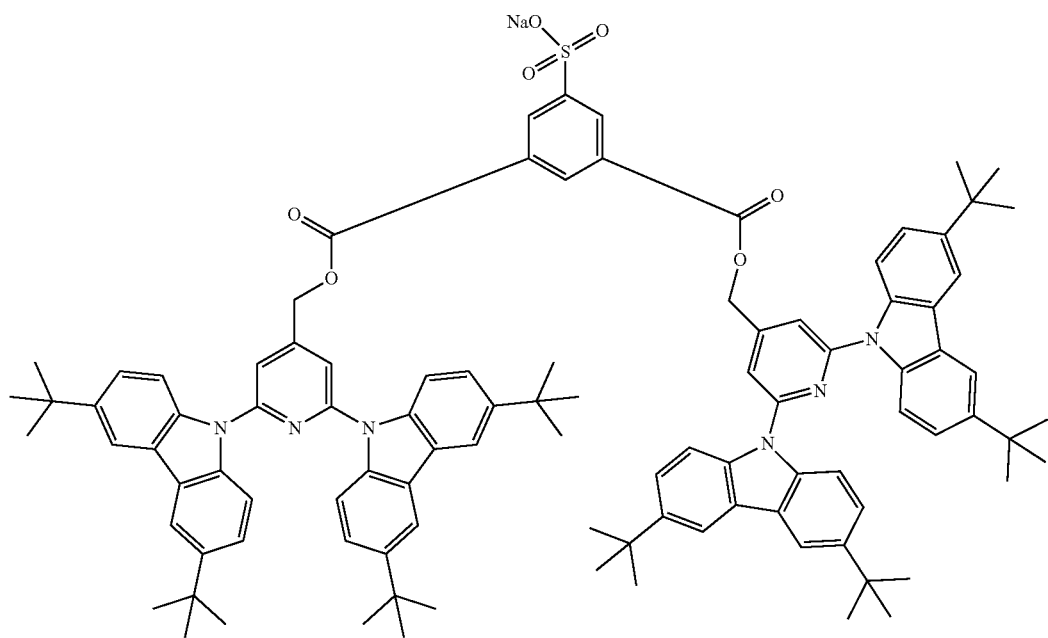
(Glass Mixture 5)
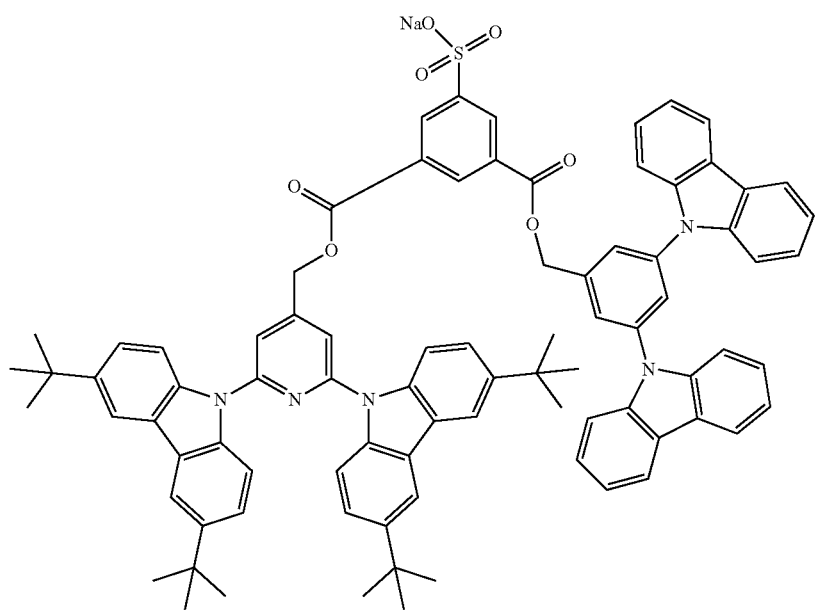

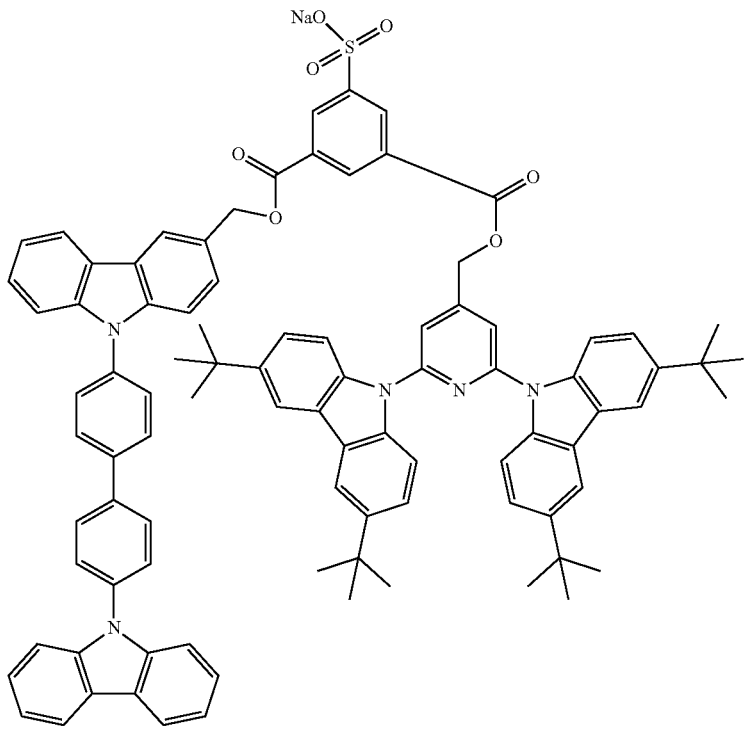
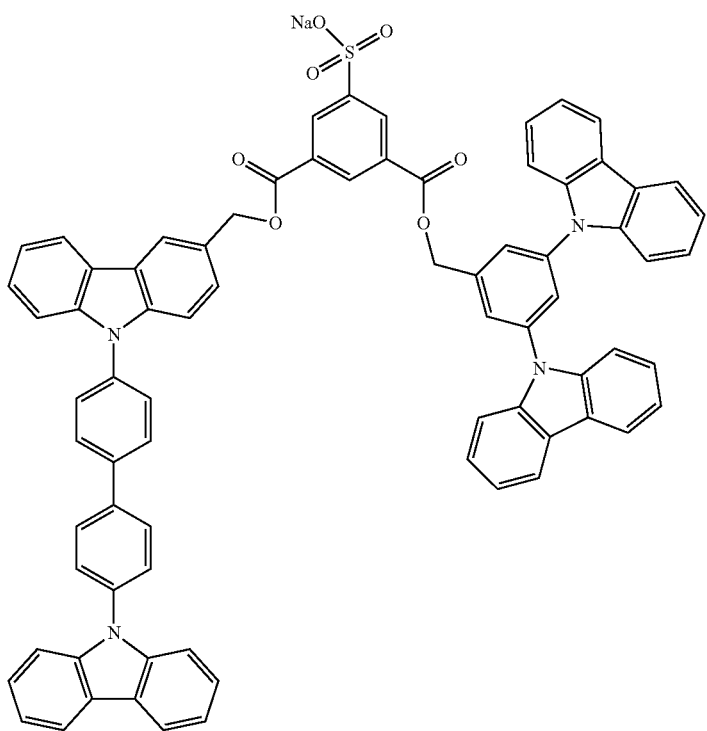

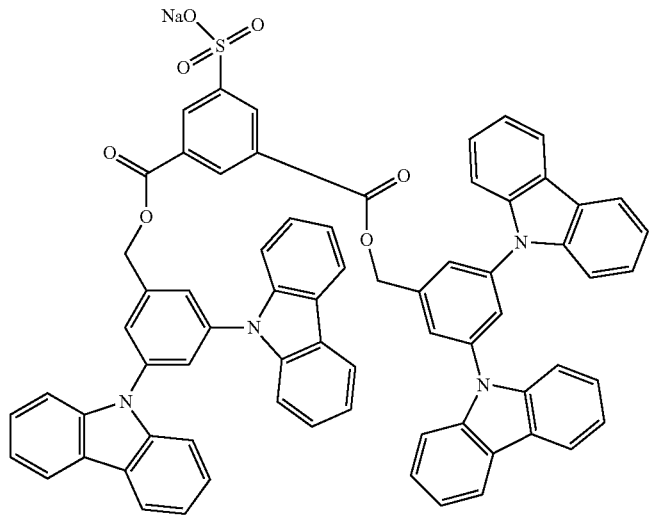
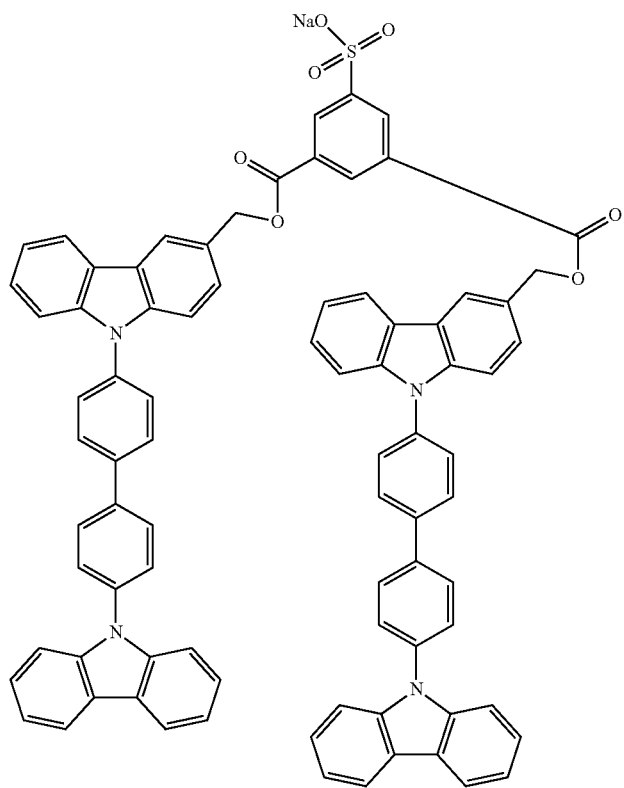

Glass Mixture 6: which is a bipolar luminescent ester molecular glass mixture comprising the following six components:
(Glass Mixture 6)
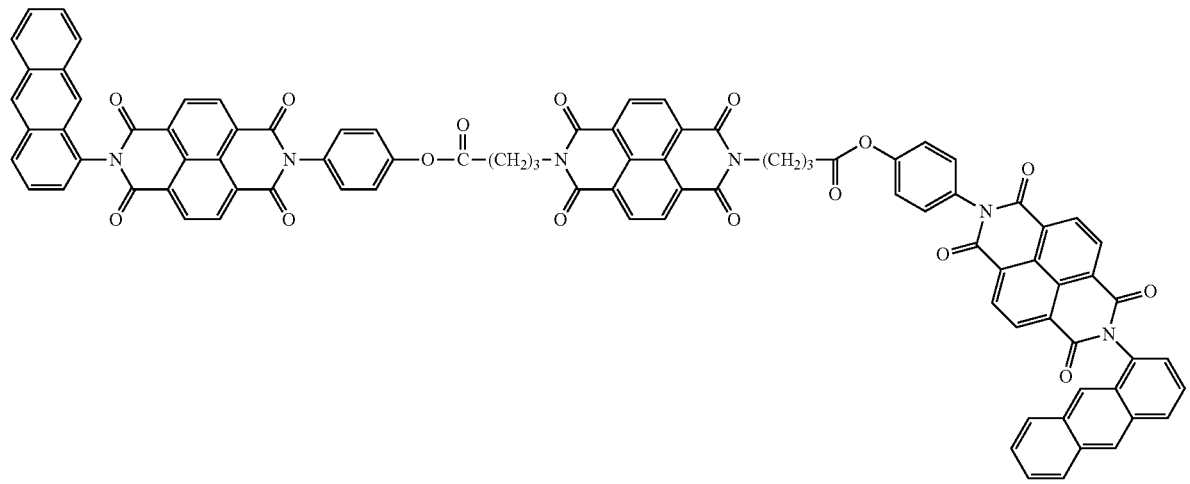
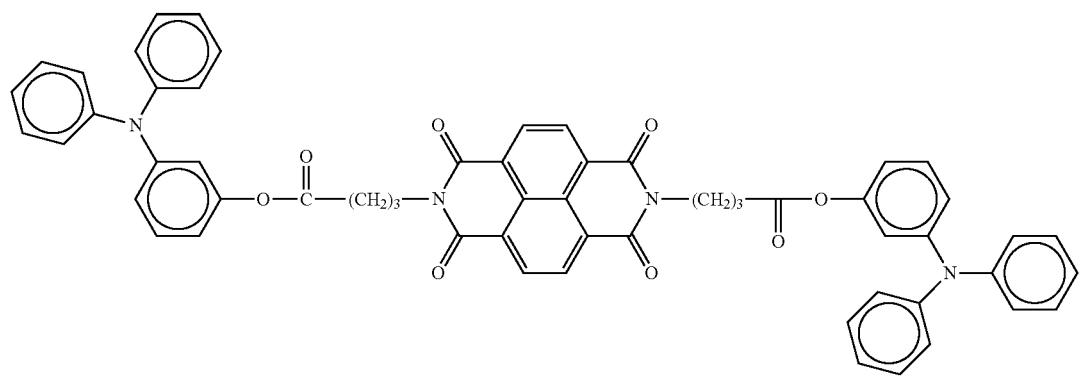
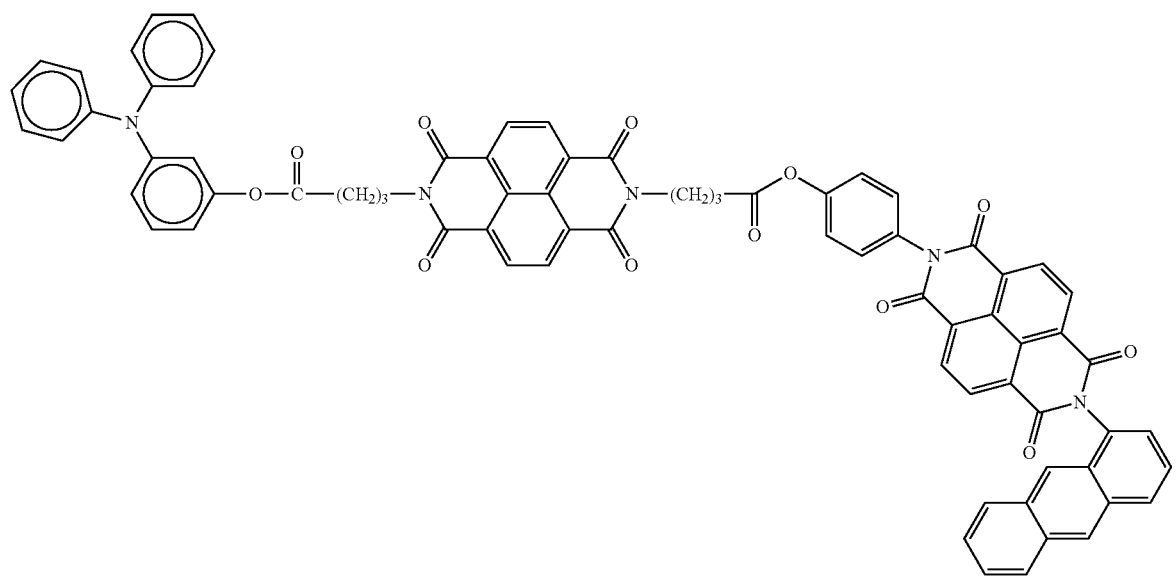

-continued
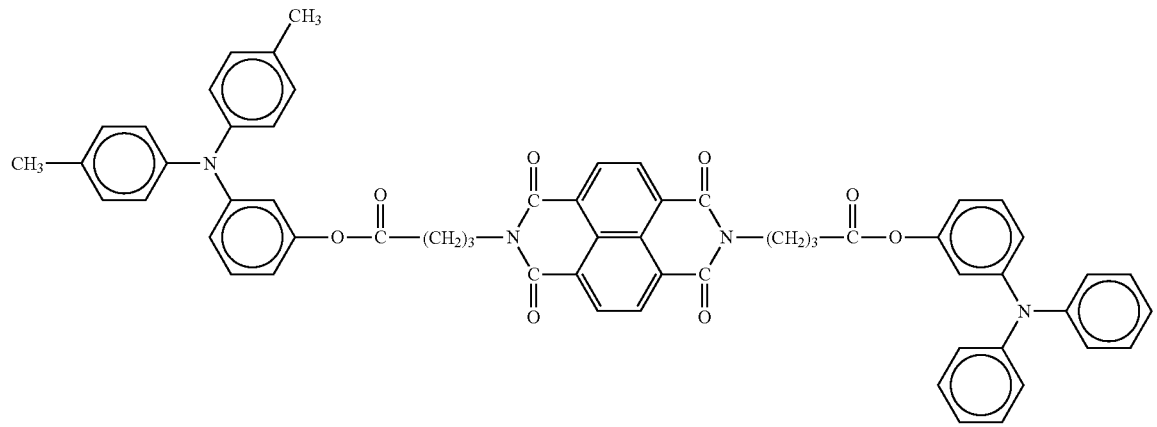
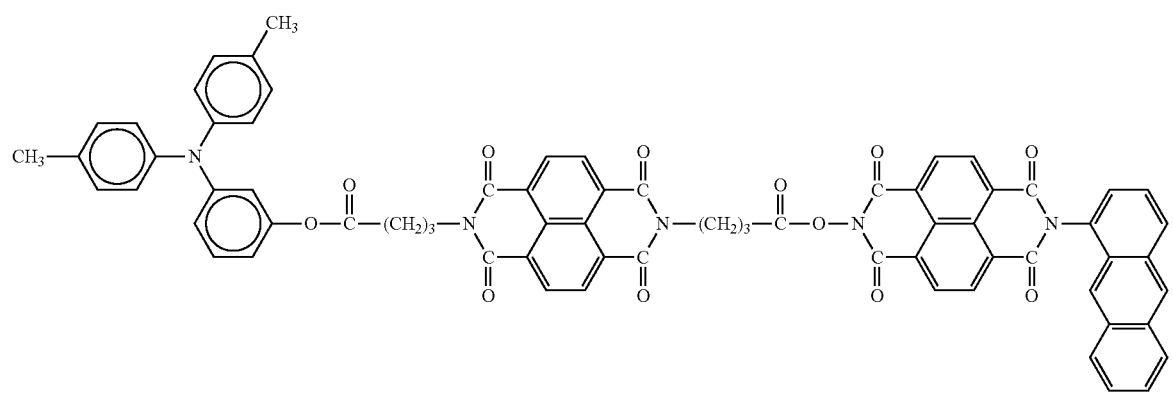
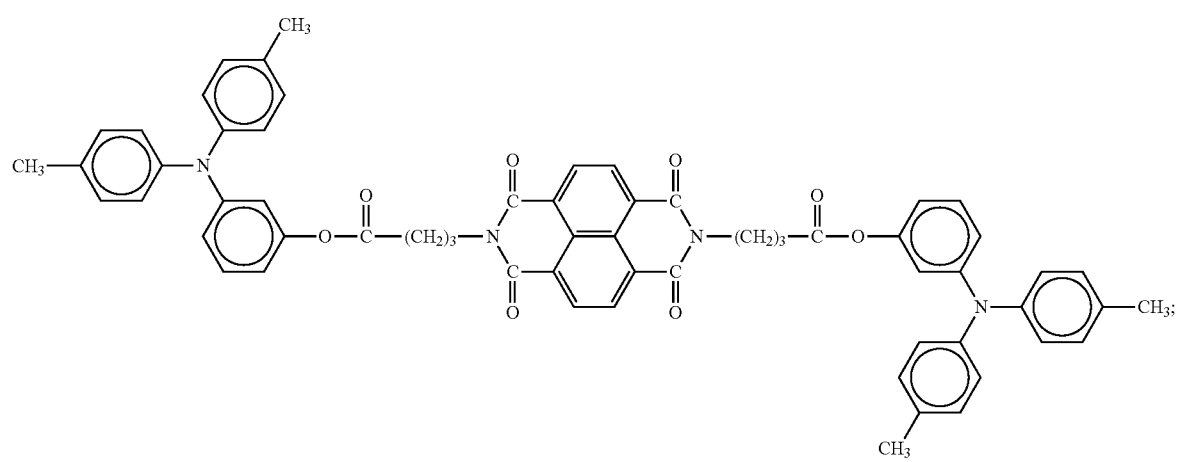

Glass Mixture 7: which is an amide phosphorescent (Alq3) molecular glass mixture comprising the following nine components:
(Glass Mixture 7)
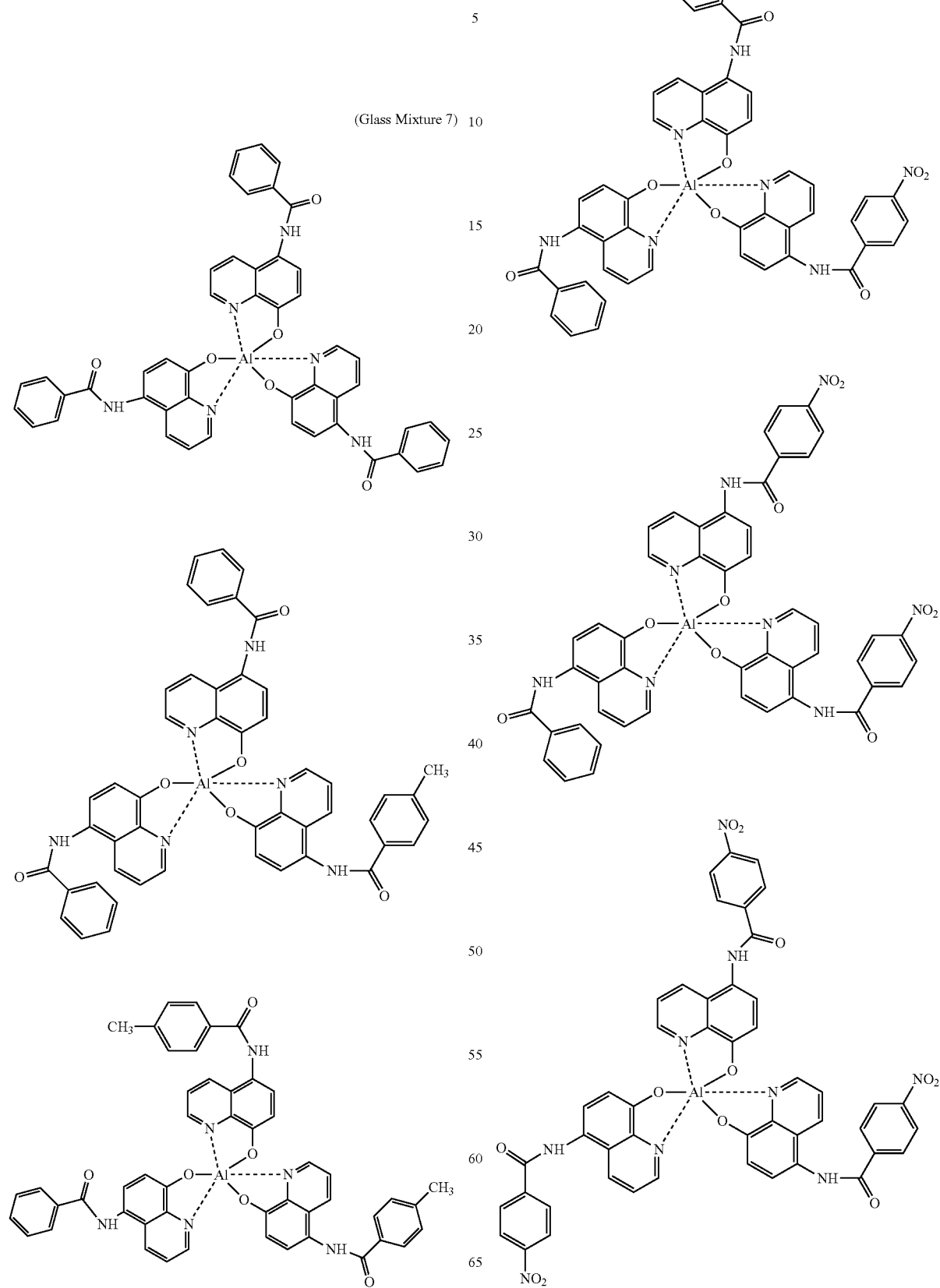

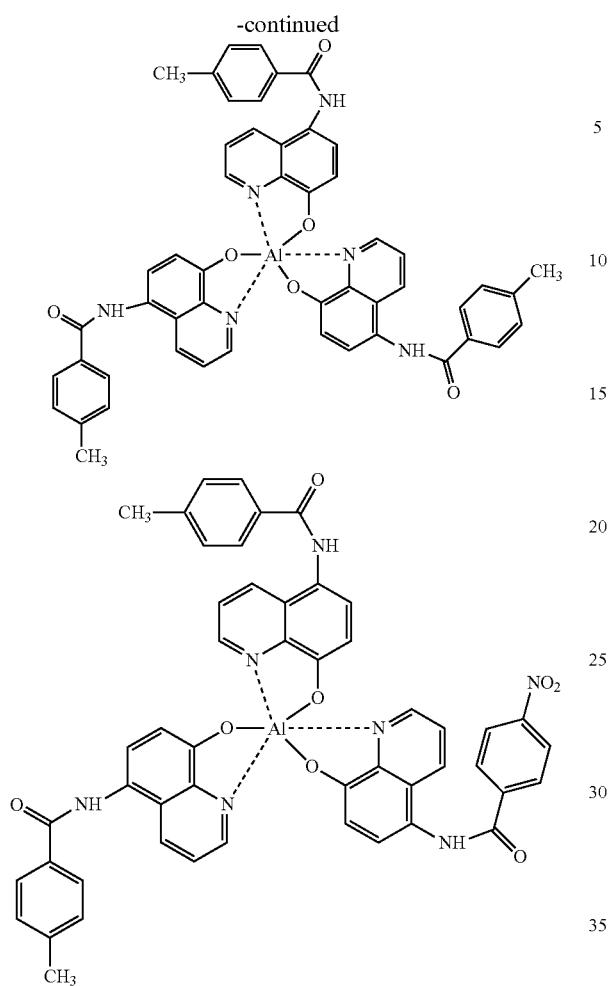
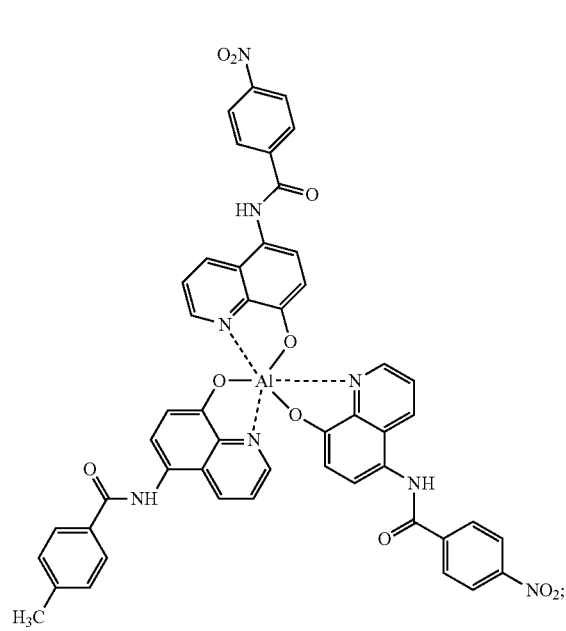
Glass Mixture 8: which is a bipolar ester molecular glass mixture comprising the following six components:
(Glass Mixture 8)
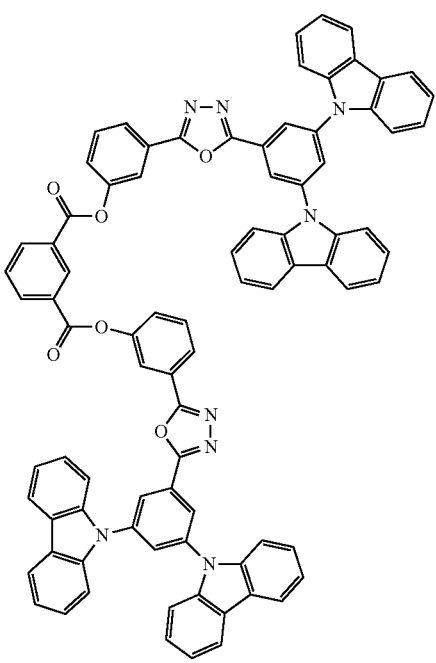

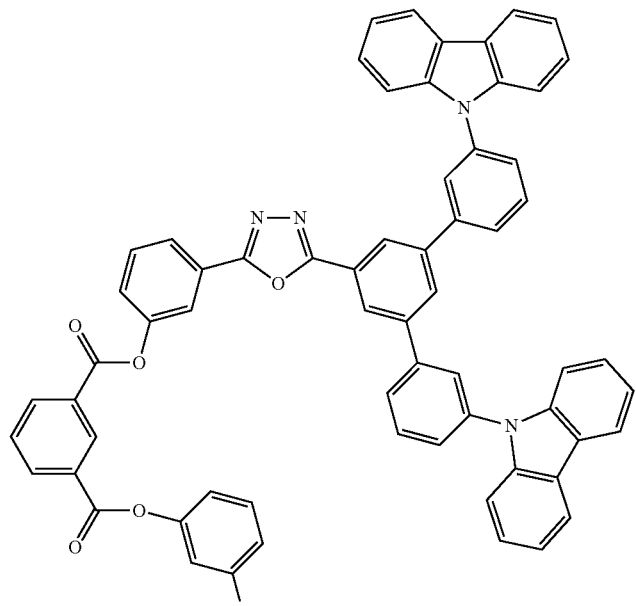
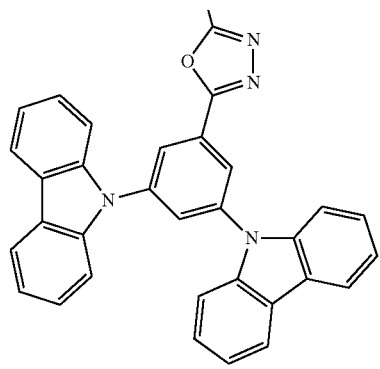
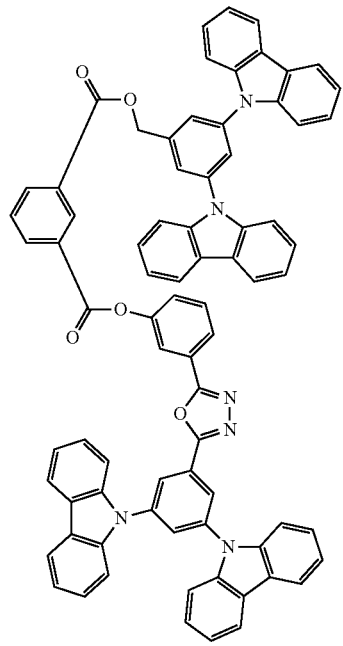

-continued
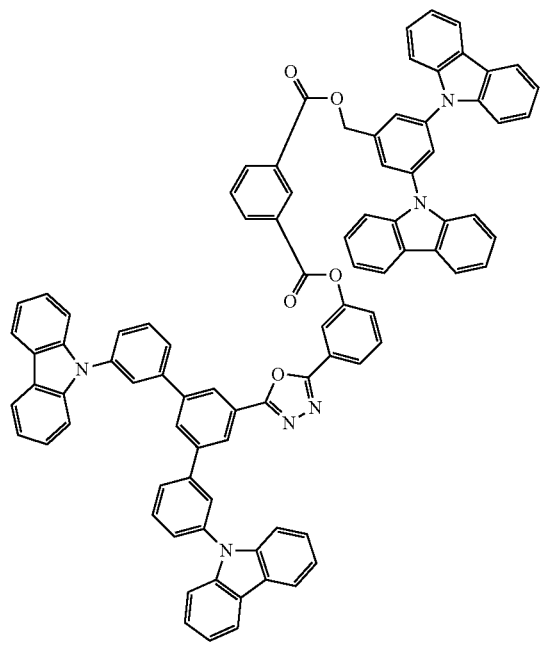
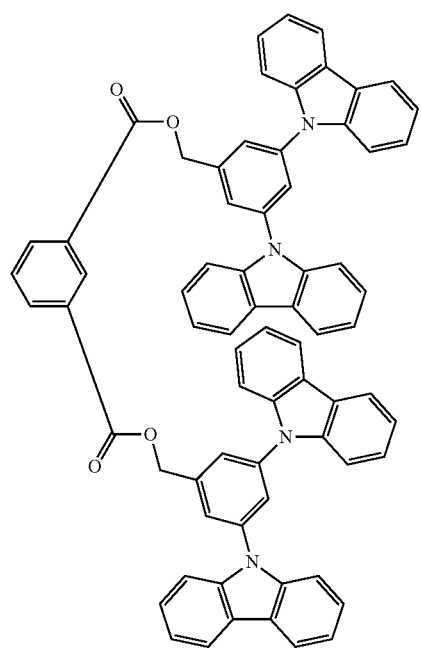

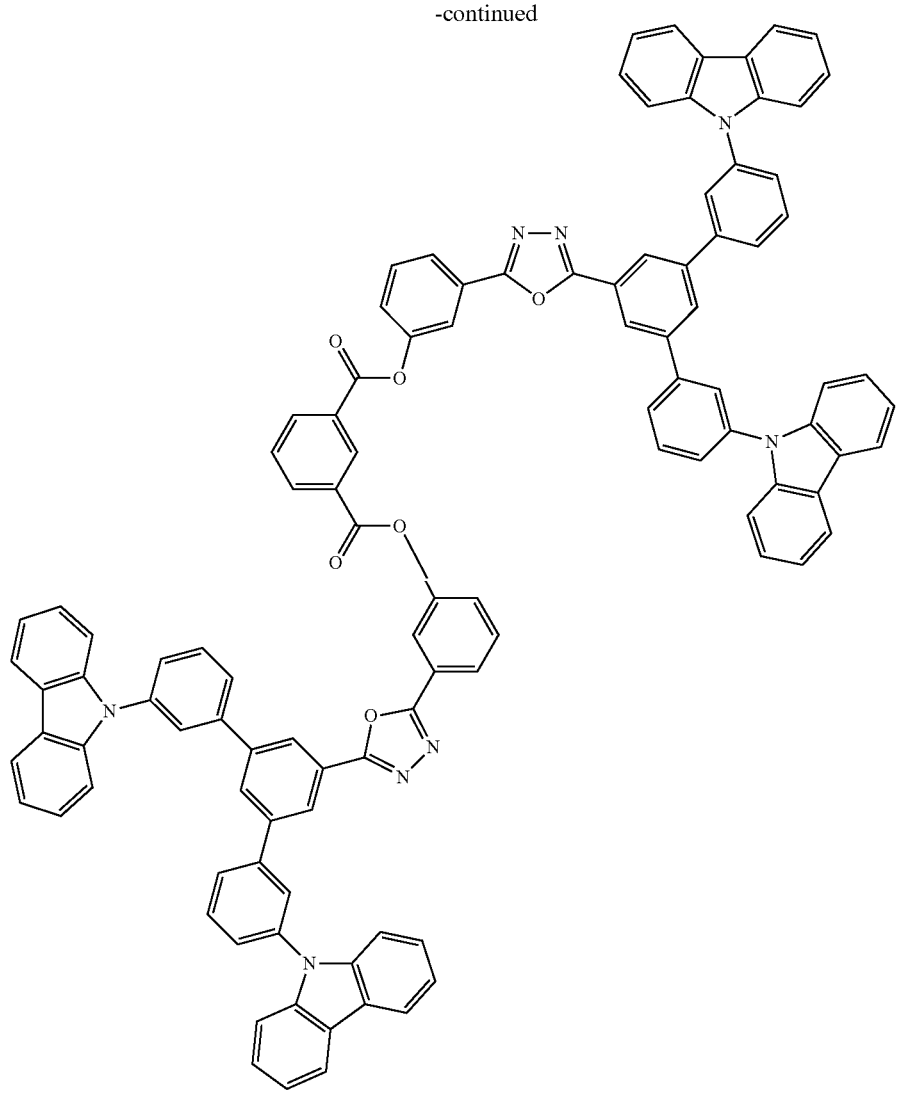
and
Glass Mixture 9 which is a bipolar amide molecular glass mixture comprising the following eight components:
(Glass Mixture 9)
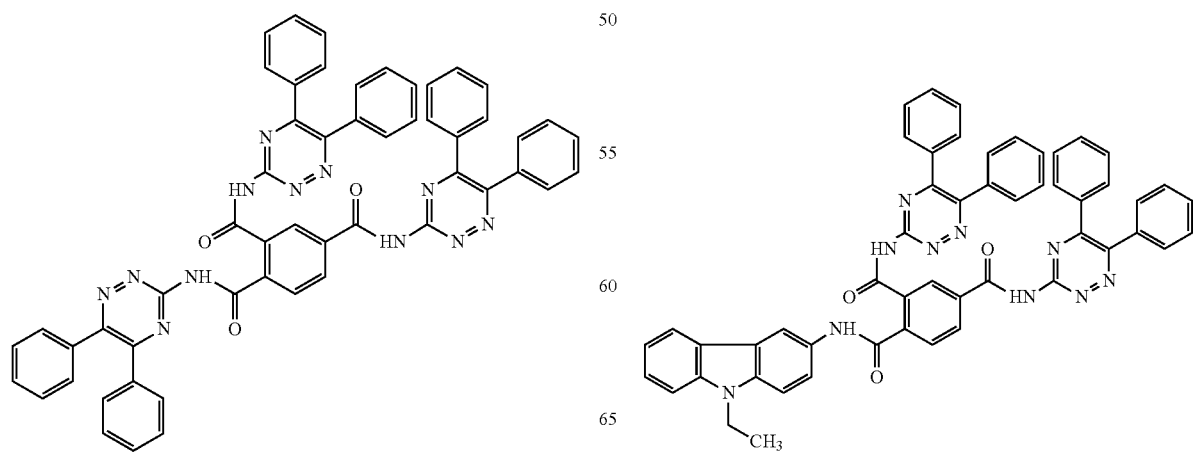
;
-continued

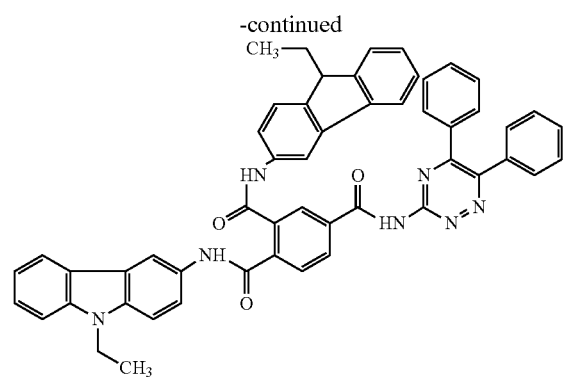

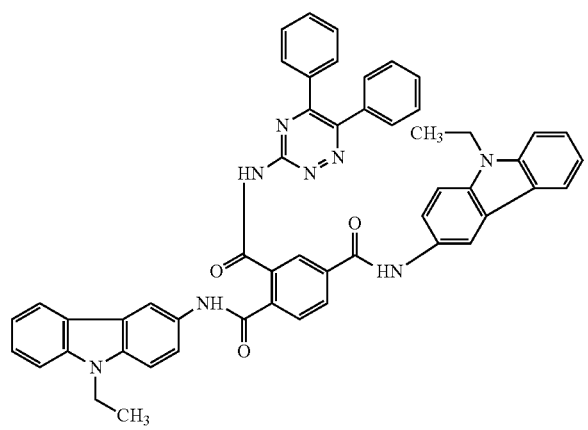

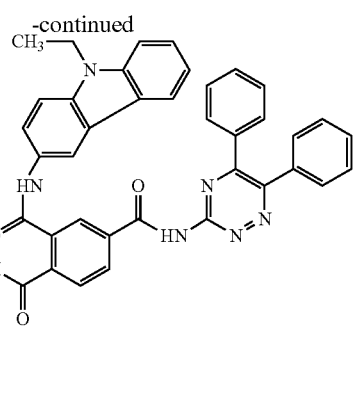

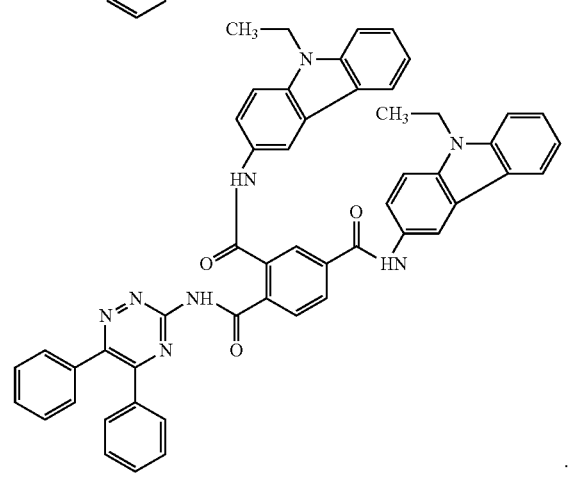

2. Reaction Procedure for Imide Molecular Glass Mixture

One equivalent of a purified multifunctional amine compound (neutral, hole-transporting, electron-transporting, luminescent, or a combination thereof) is dissolved in N,N-dimethylformamide. The mixture of purified mono anhydrides (neutral, hole-transporting, electron-transporting, luminescent, or a combination thereof, 2 equivalents total) (well mixed before addition) are added in small portions to the stirred amine solution. After complete addition the solution is refluxed for 5 hours.

While the mixture was still hot, an equal volume of pyridine, and acetic anhydride are added and stirring continued for another hour. The mixture is then poured into two liters of distilled water and the product collected by filtration. The molecular glass is re-dissolved in dimethyl formamide and re-precipitated into a mixture of methanol and distilled water twice. The final precipitate was filtered, washed with methanol and dried under vacuum.

If necessary the mixture is further purified by column chromatography using silica gel and appropriate solvent or solvent mixture.

The isolated material is characterized, using differential scanning calorimetry (DSC) for glass transition temperature, and liquid chromatography for composition. The "Component Equations" of Molaire are used to calculate the expecting composition based on the functionality of the multifunctional hole-transport material and the number of mono amines. (*Organic Monomeric Glasses: A Novel Class of Materials*, M. F. Molaire et al, J of Polymer Science, Part A, Polymer Chemistry, Vol. 27, 2569-2592 (1989).

The following are specific imide molecular glass mixtures that can be prepared using this procedure:

Glass Mixture 10 which is an electron-transporting imide molecular glass mixture comprising the following six components:

(Glass Mixture 10)
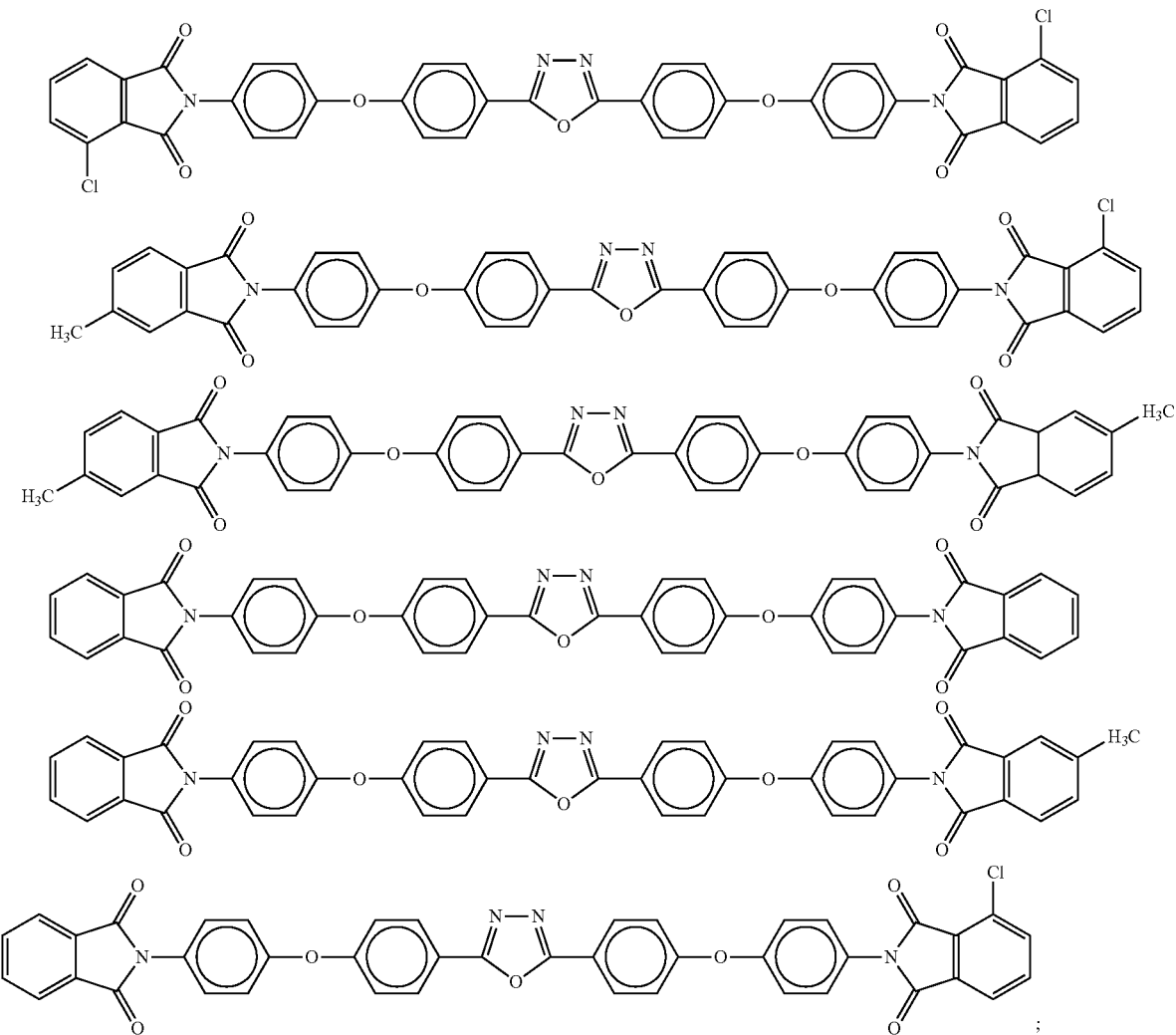
Glass Mixture 11: which is a hole-transporting imide molecular glass mixture comprising the following six components:
(Glass Mixture 11)
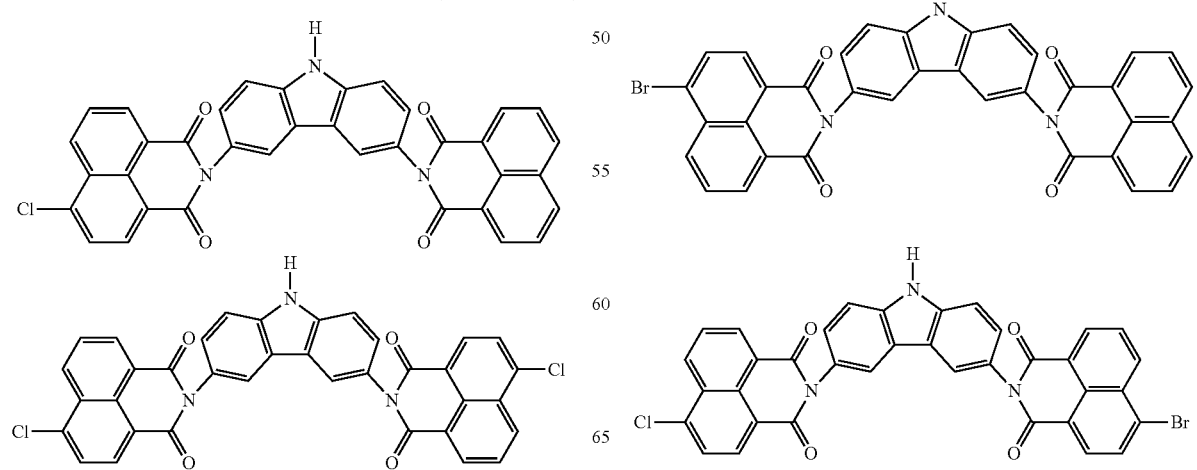
-continued

109
-continued
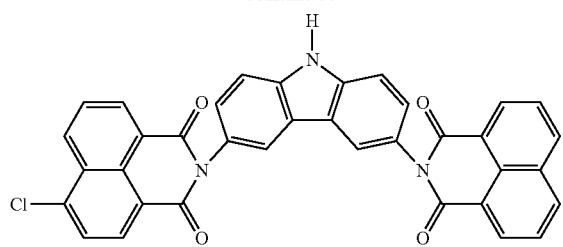
110
-continued
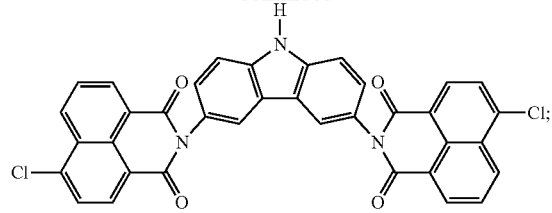
Glass Mixture 12: which is a bipolar imide molecular glass mixture:
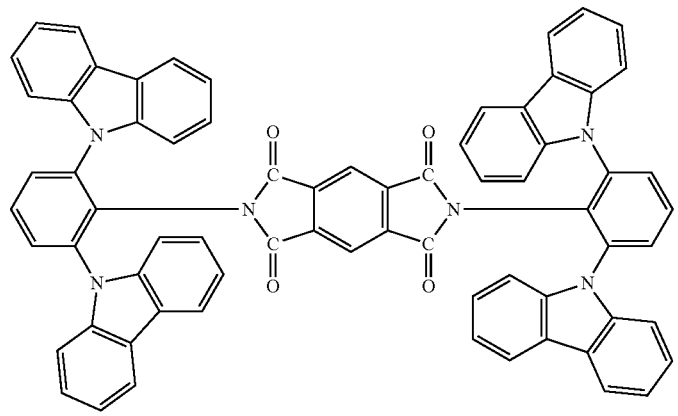
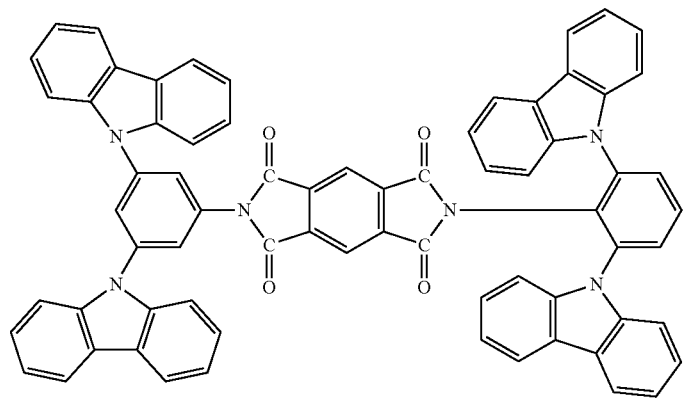
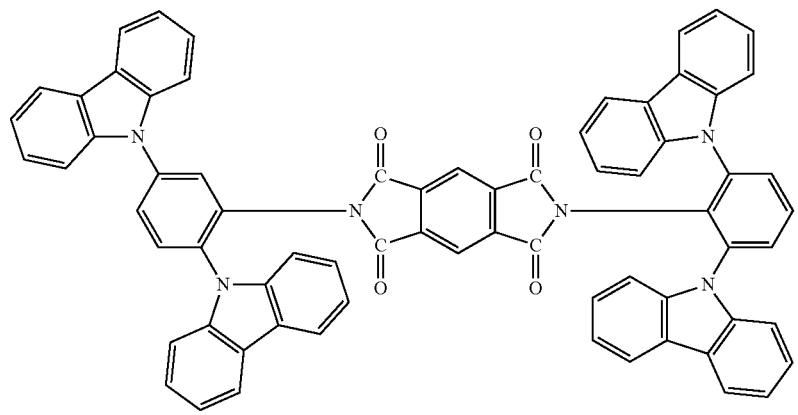
(Glass Mixture 12)

-continued
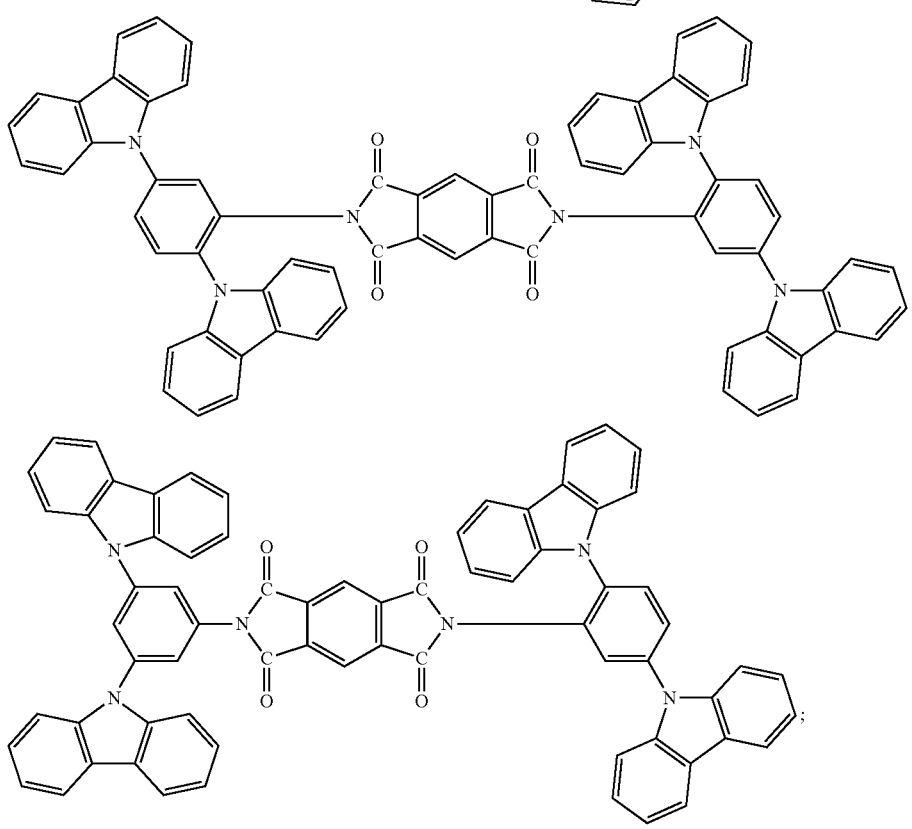
Glass Mixture 13: which is a luminescent imide molecular glass mixture:
(Glass Mixture 13)
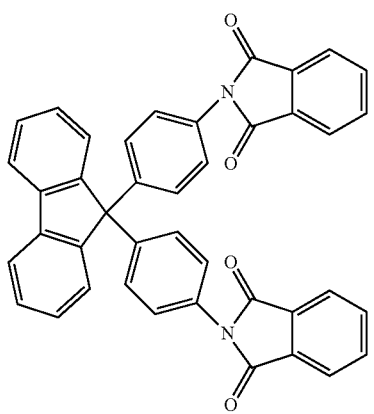
-continued
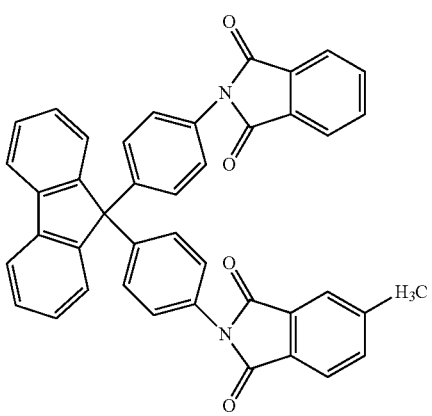

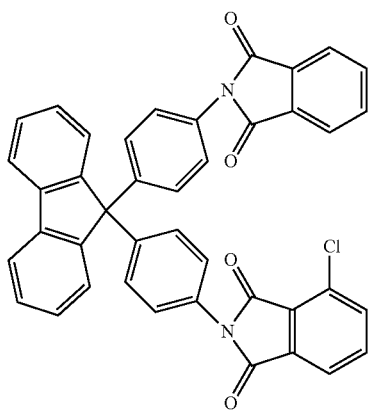
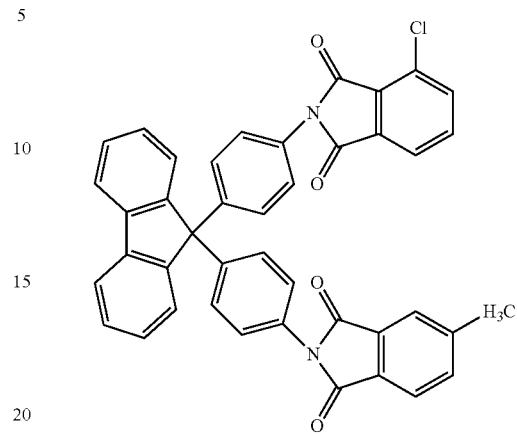
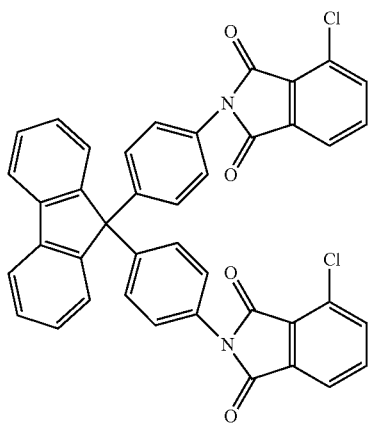
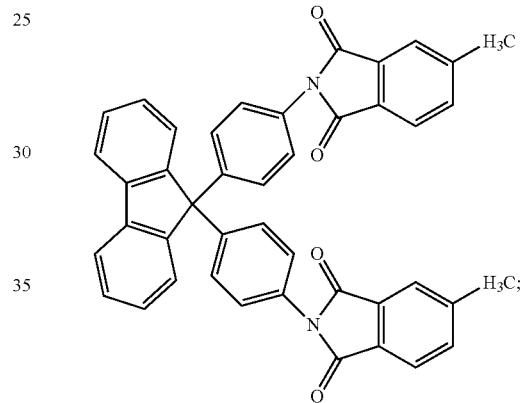
Glass Mixture 14: which is a water/alcohol soluble bipolar luminescent molecular glass mixture:
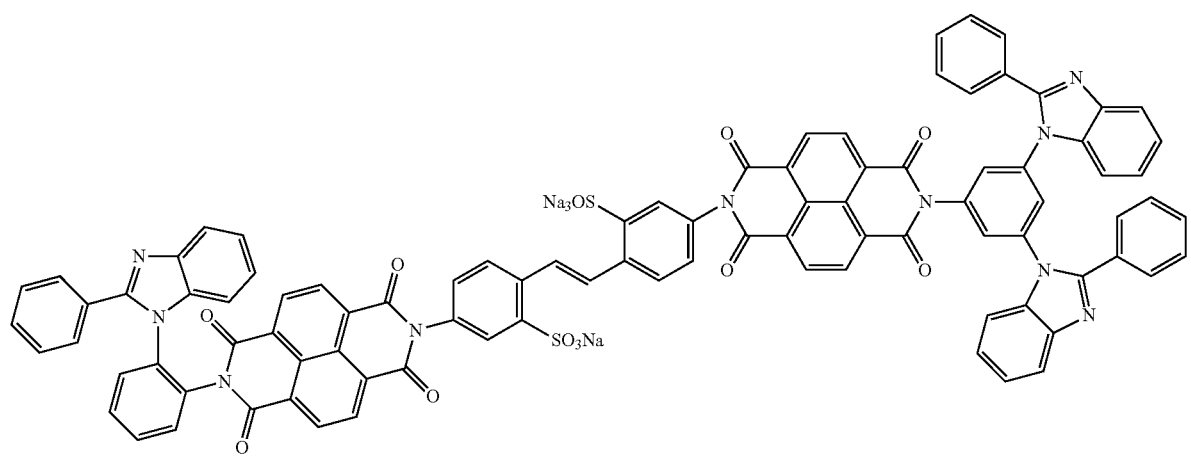
(Glass Mixture 14)

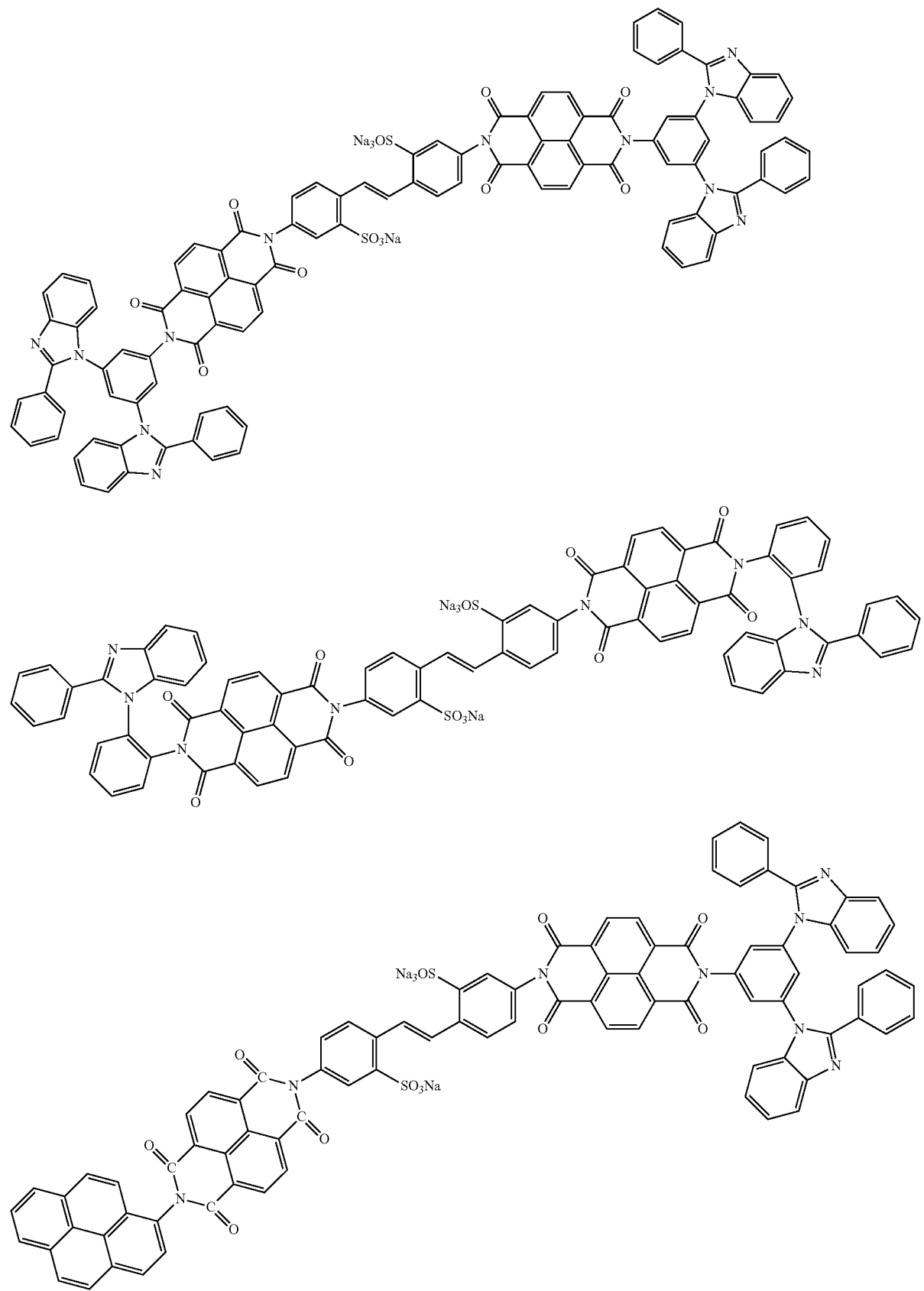

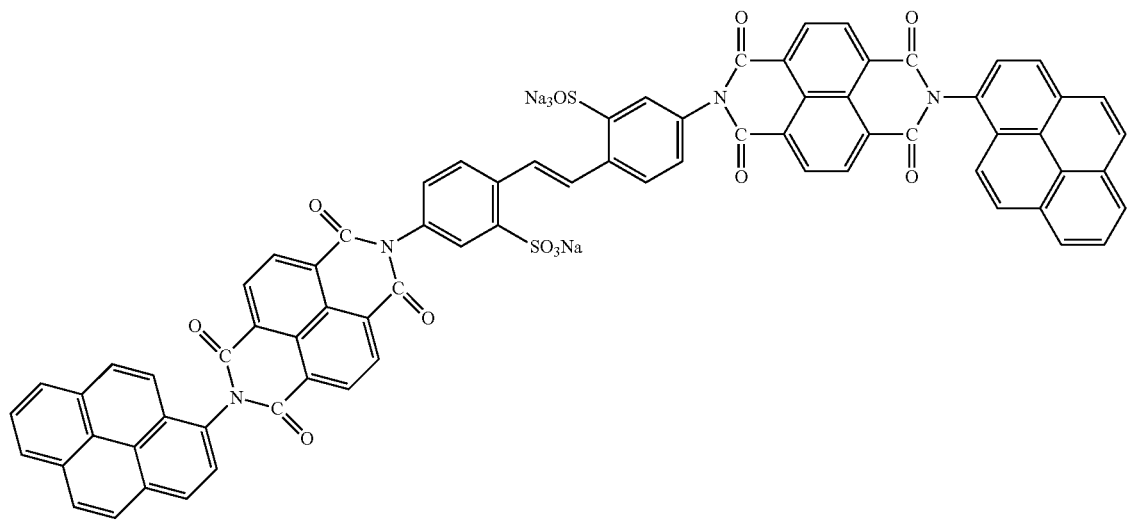
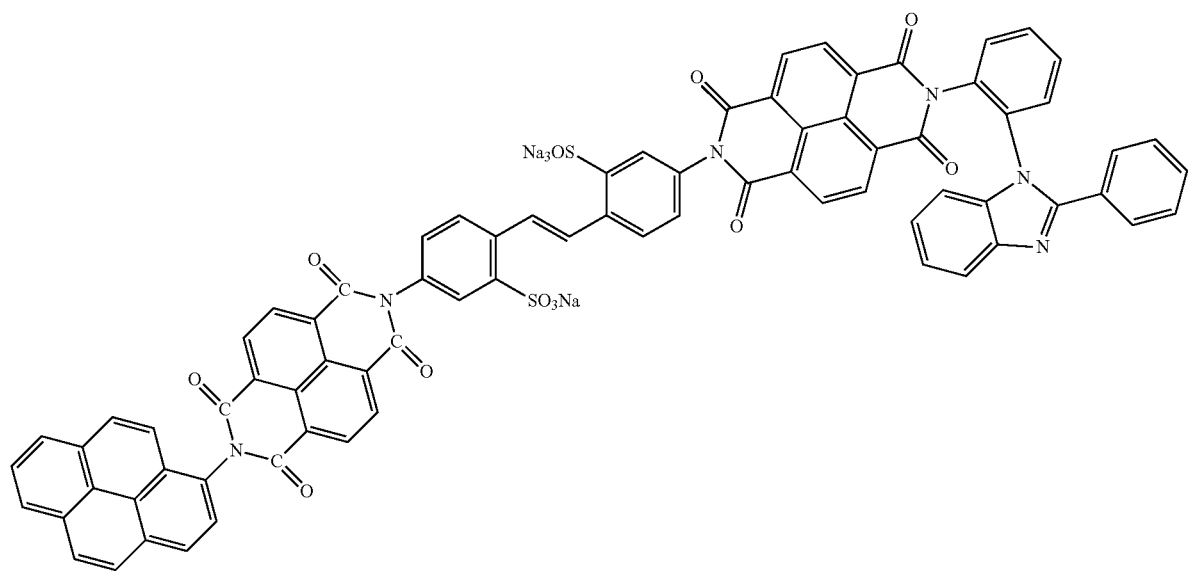
;
Glass Mixture 15: which is a bipolar phosphorescent molecular glass mixture comprising the following six components:
(Glass Mixture 15)
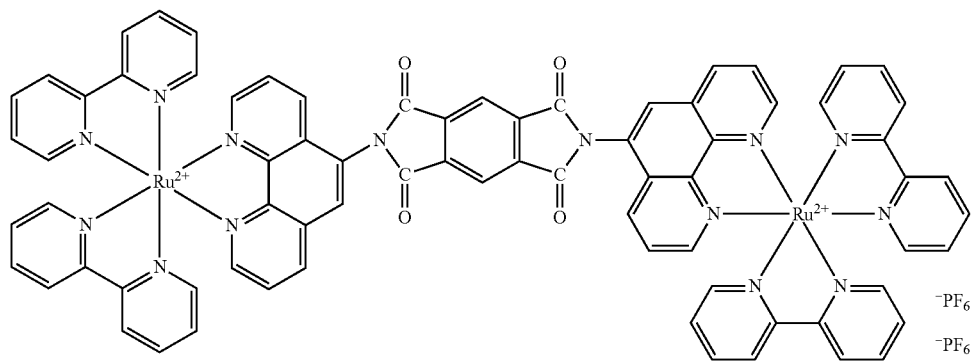

-continued
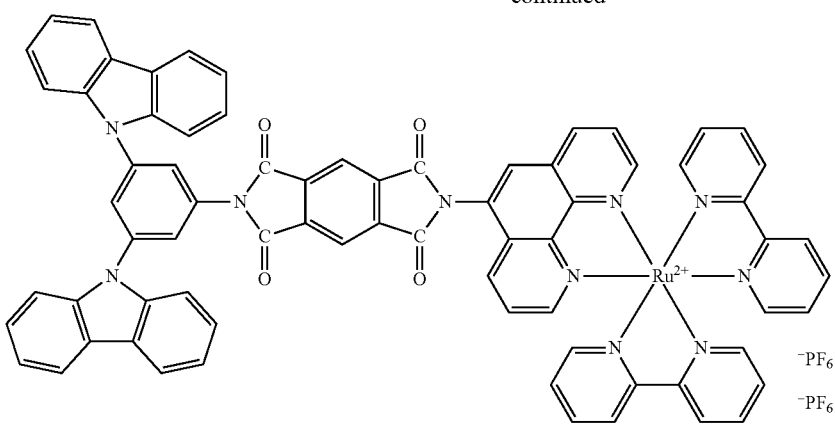
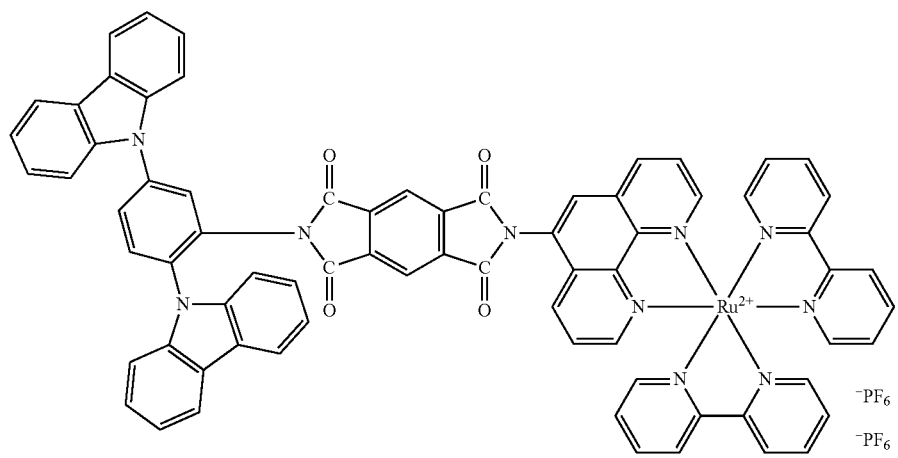
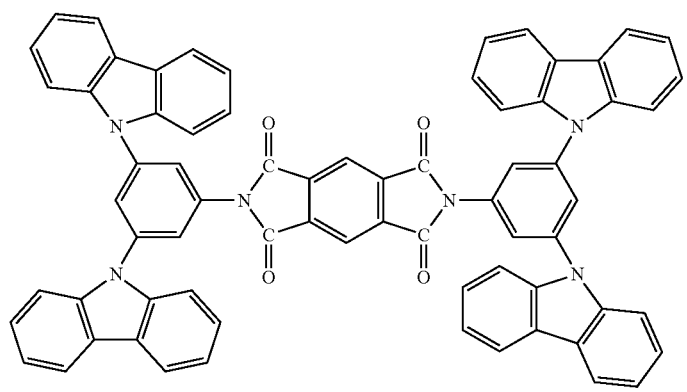
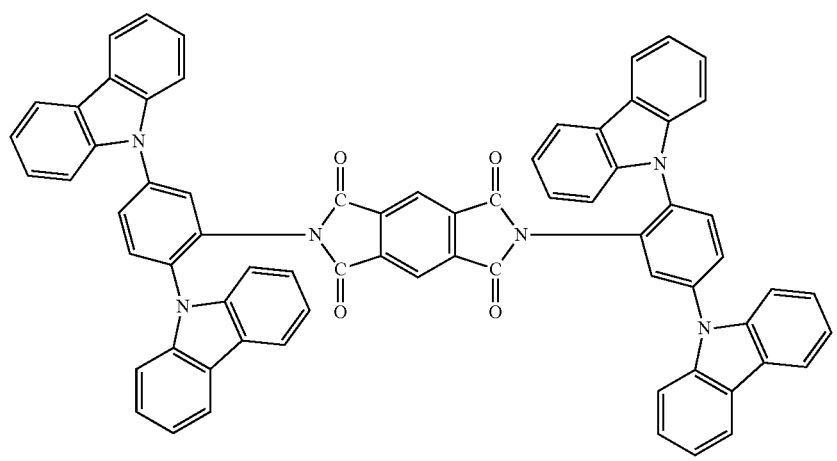

-continued
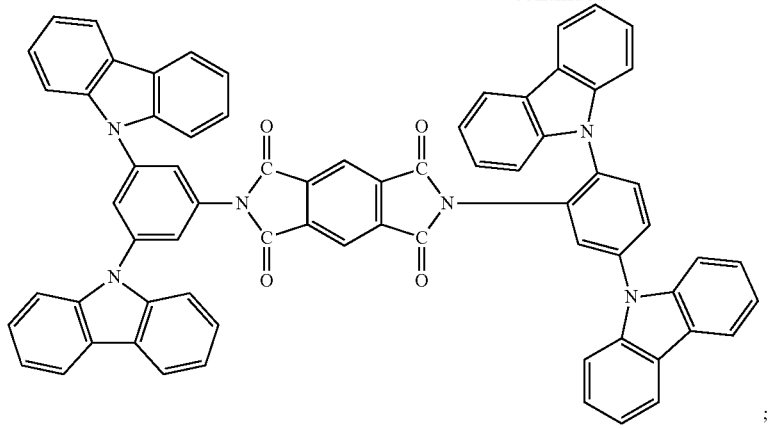
Glass Mixture 16: which is an electron-transporting oxadiazole molecular glass mixture:
(Glass Mixture 16)
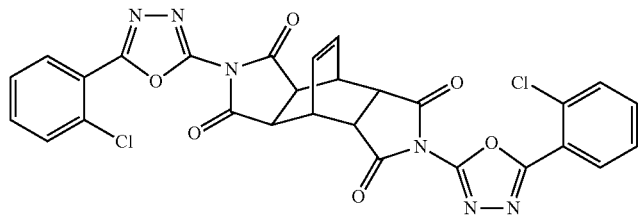
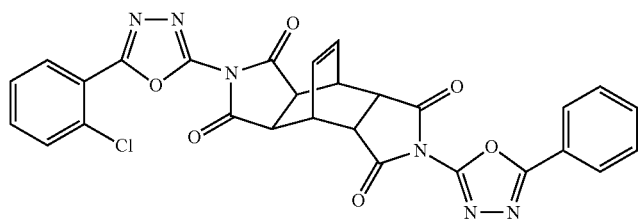
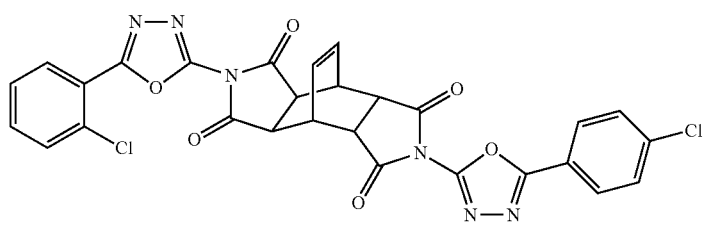
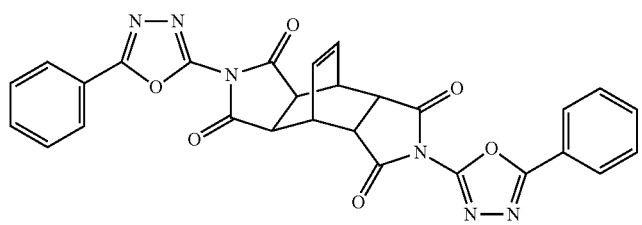

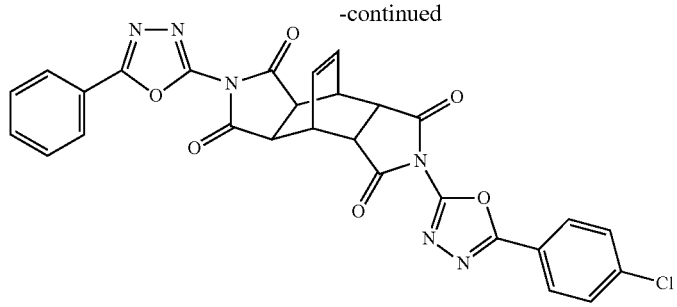
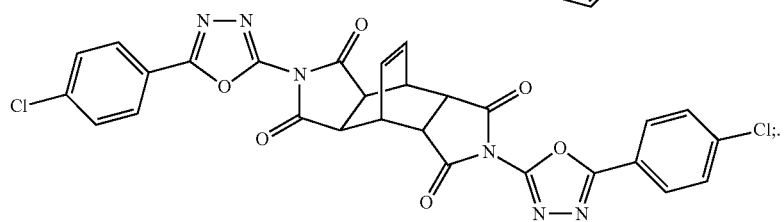
Glass Mixture 17: which is an electron-transporting triazine molecular glass mixture:
(Glass Mixture 17)
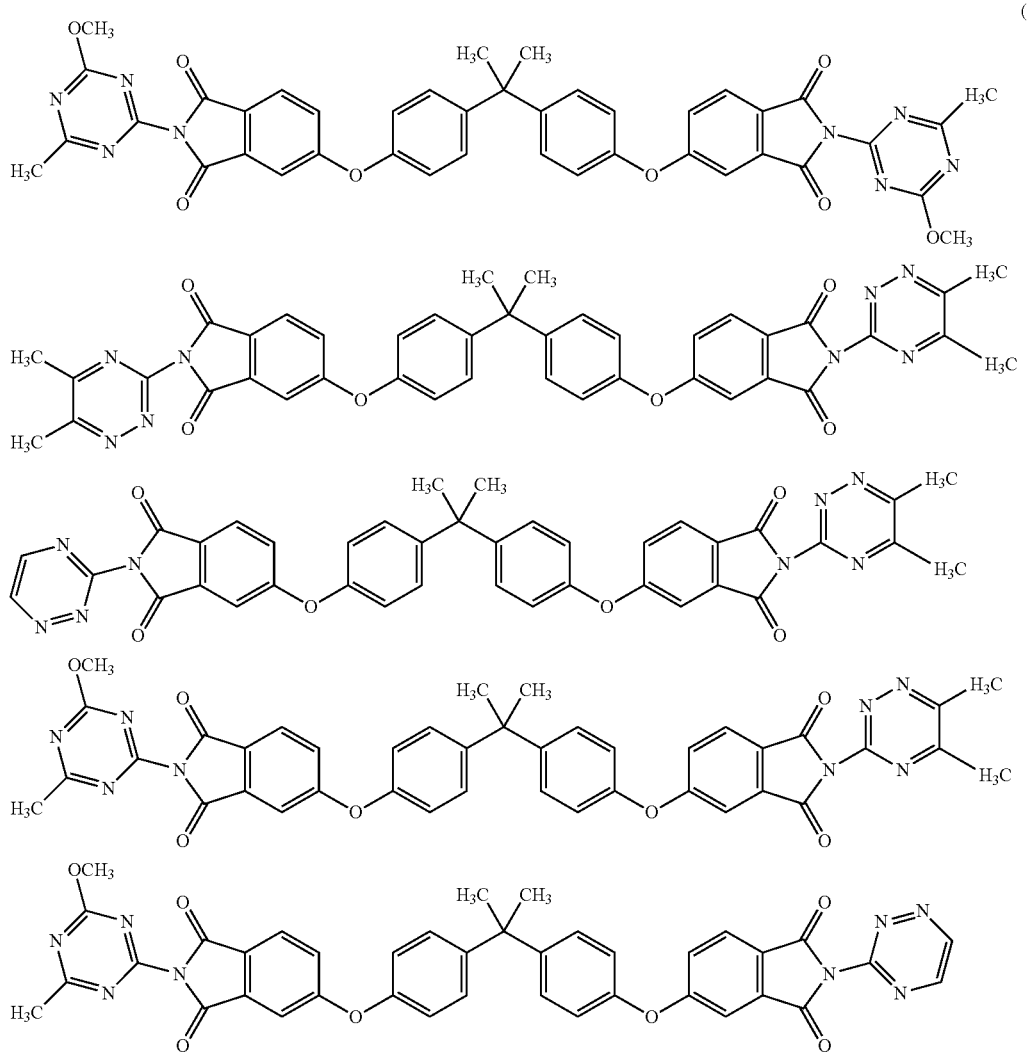

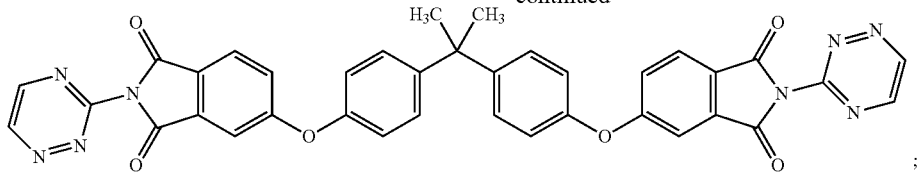
Glass Mixture 18: which is an electron-transporting naphthalene bisimide molecular glass mixture comprising the following ten components:
(Glass Mixture 18)
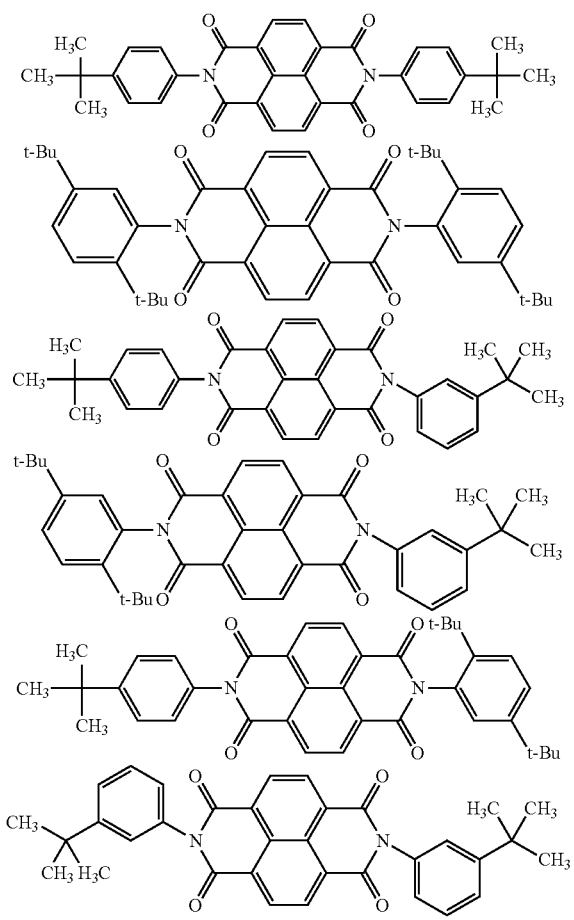
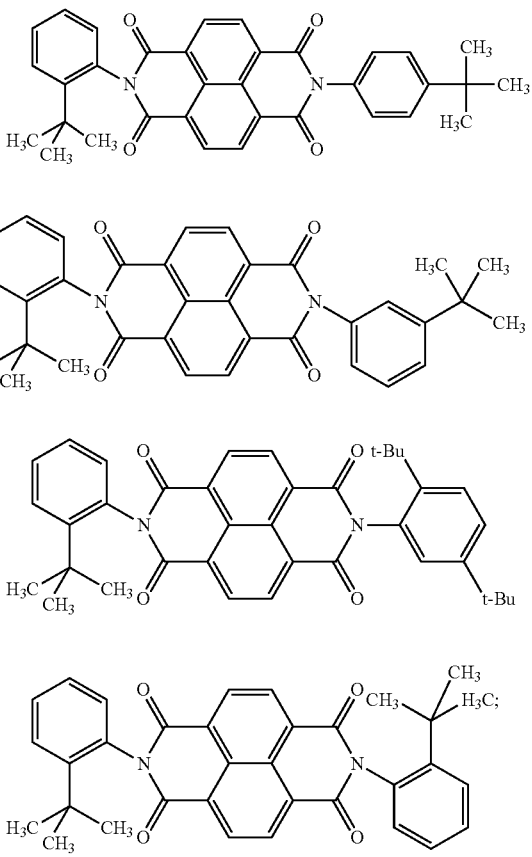
Glass Mixture 19: which is a bipolar carbazole/oxadiazole molecular glass mixture comprising the following six components:
(Glass Mixture 19)
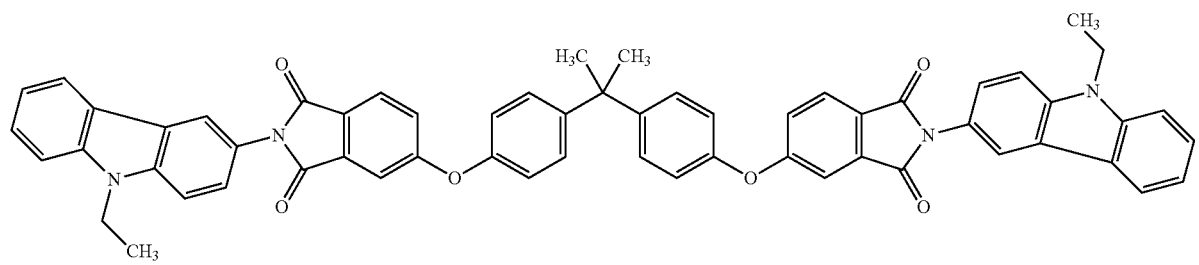

-continued
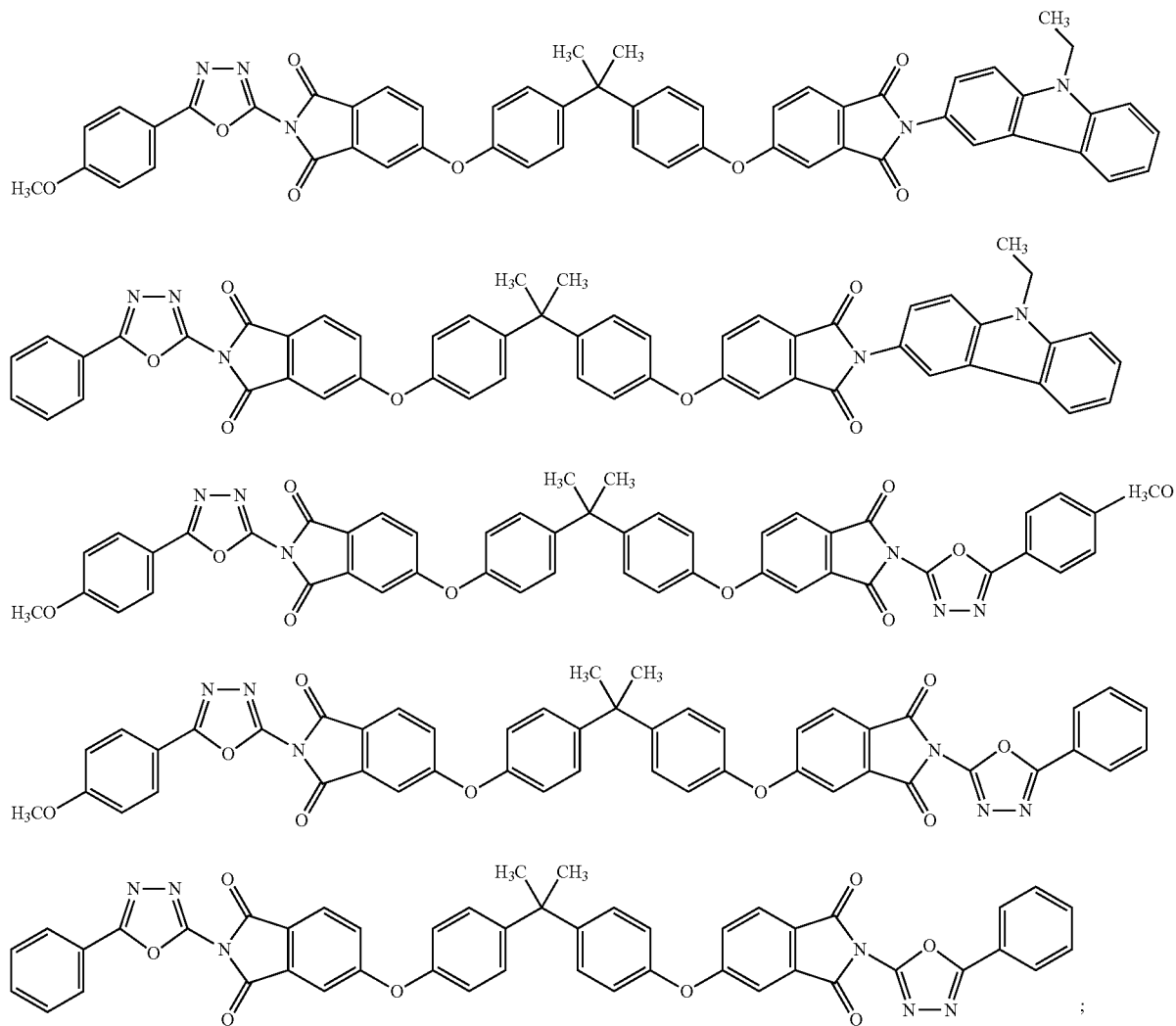
Glass Mixture 20: which is a bipolar carbazole-triazine ester-imide molecular glass mixture comprising the following six components:
(Glass Mixture 20)
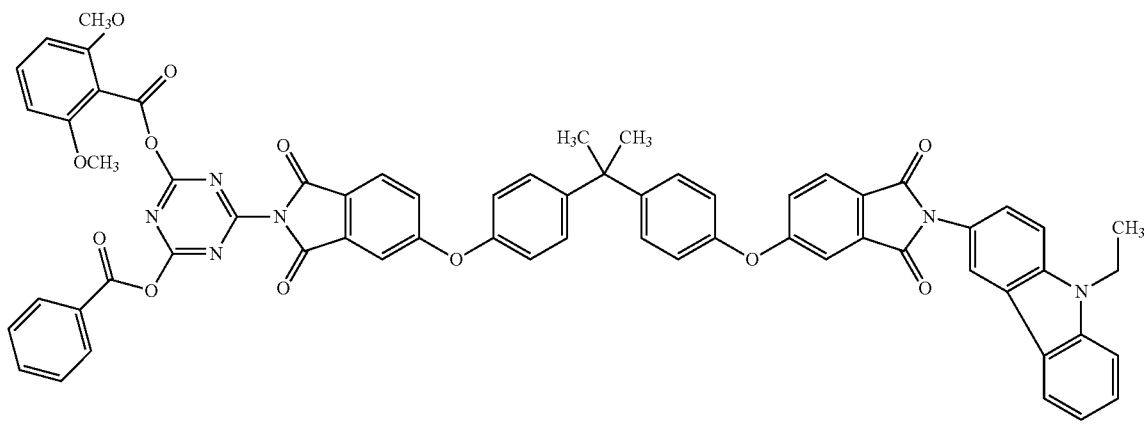

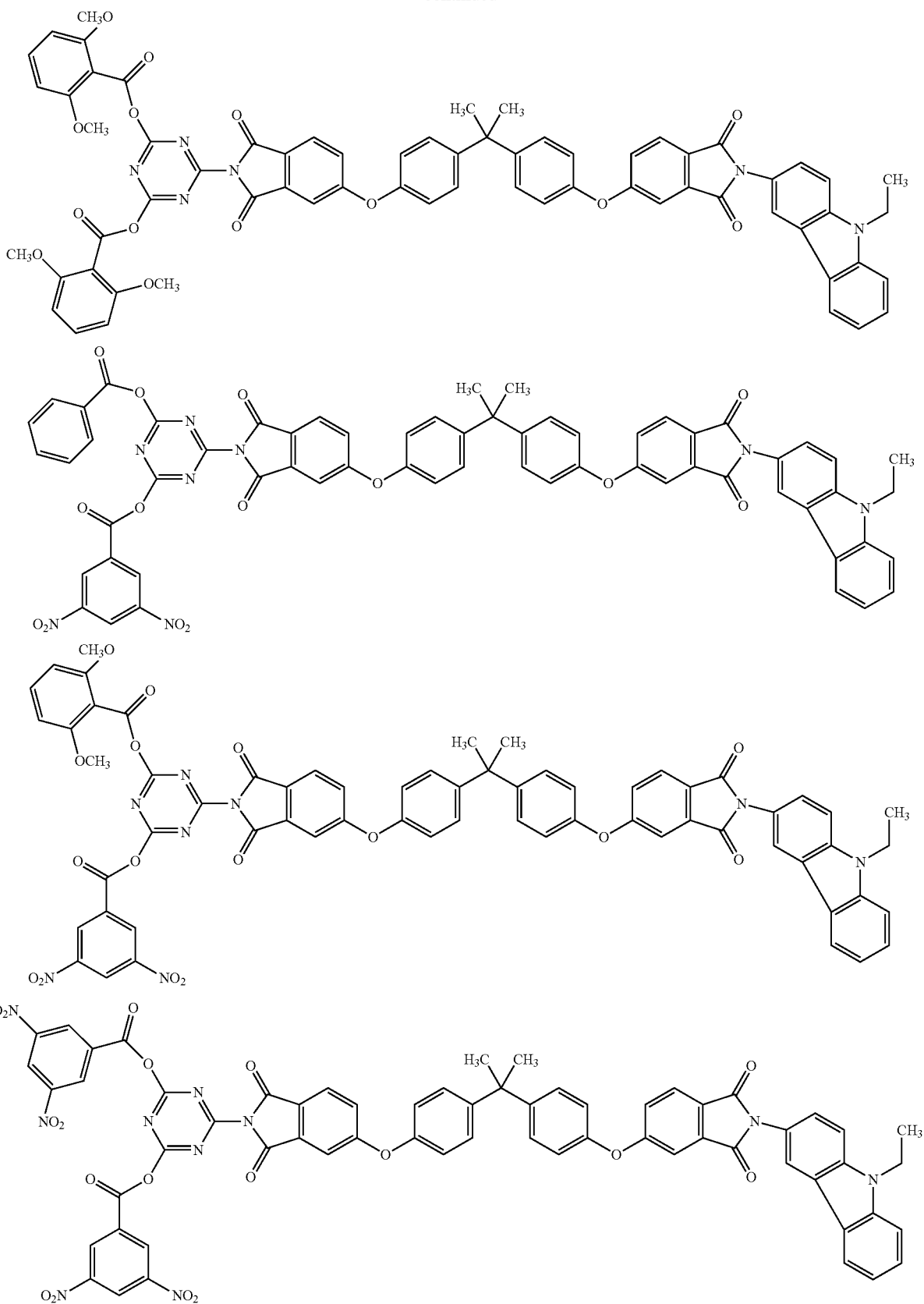

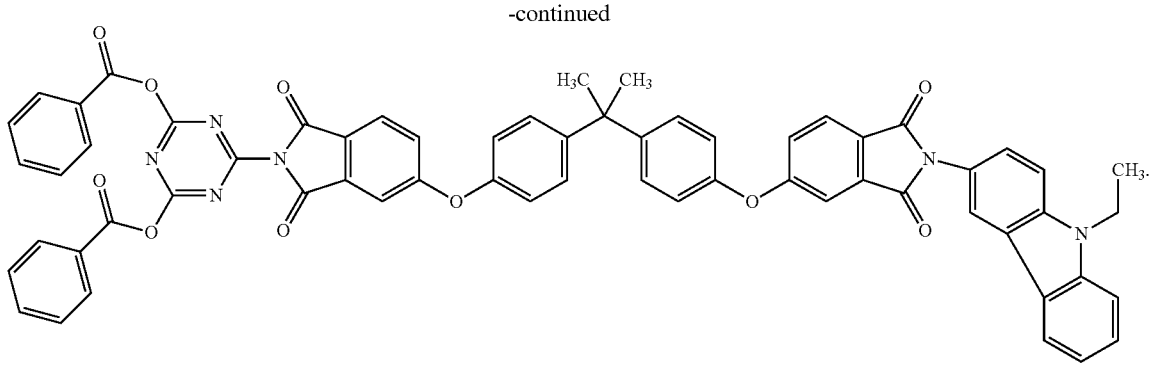

3. Procedure for the Preparation of Asymmetrical Imide Molecular Glass Mixtures One equivalent of a purified mono (neutral, hole-transporting, electron-transporting, luminescent, or combination thereof) is dissolved in N-methyl pyrrolidone, The mixture of purified mono anhydrides (neutral, hole-transporting, electron-transporting, luminescent, or combination thereof, 2 equivalents total) (well mixed before addition) are added in small portions to the stirred amine solution. After complete addition the solution is refluxed for 5 hours.

While the mixture was still hot, an equal volume of pyridine, and acetic anhydride are added and stirring continued for another hour. The mixture is then poured into two liters of distilled water and the product collected by filtration. The molecular glass mixture is re-dissolved in dimethyl formamide and re-precipitated into a mixture of methanol and distilled water twice. The final precipitate was filtered, washed with methanol and dried under vacuum.

If necessary the mixture is further purified by column chromatography using silica gel and appropriate solvent or, solvent mixture.

The isolated material is characterized, using differential scanning calorimetry (DSC) for glass transition temperature, and liquid chromatography for composition. The "Component Equations" of Molaire are used to calculate the expecting composition based on the functionality of the multifunctional hole-transport material and the number of mono amines. (*Organic Monomeric Glasses: A Novel Class of Materials*, M. F. Molaire et al, J of Polymer Science, Part A, Polymer Chemistry, Vol. 27, 2569-2592 (1989).

The following are specific imide molecular glass mixtures that can be prepared using this procedure:

Glass Mixture 21: which is an asymmetric molecular electron-transporting blue emitter comprising the following six components:

(Glass Mixture 21)

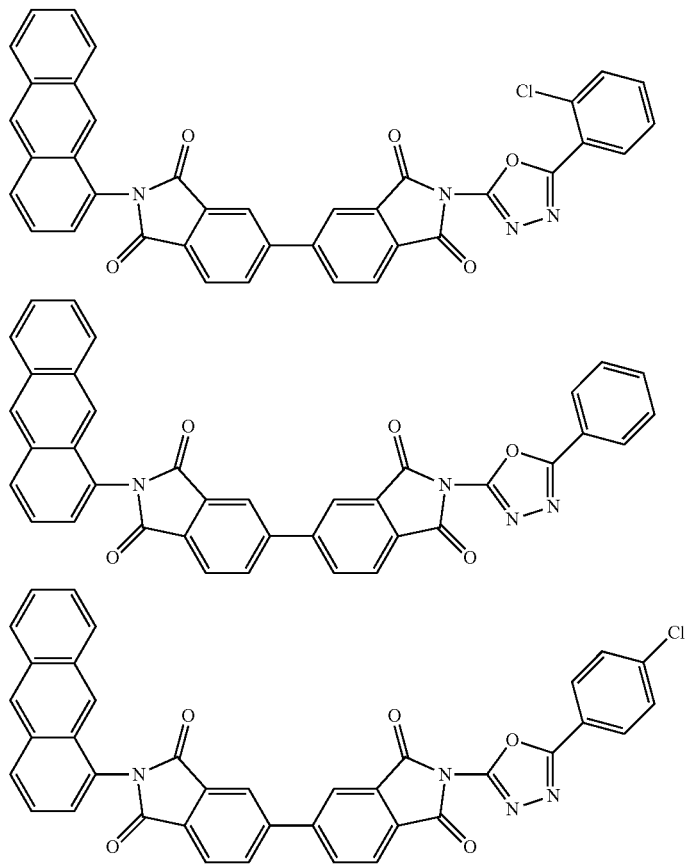

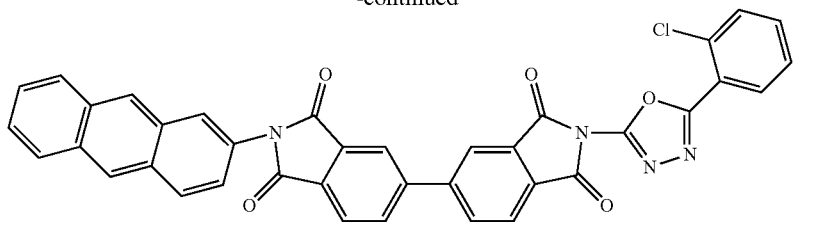
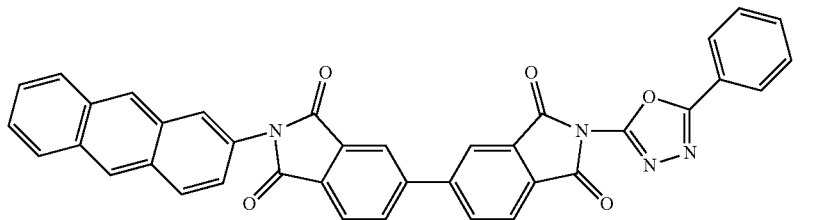
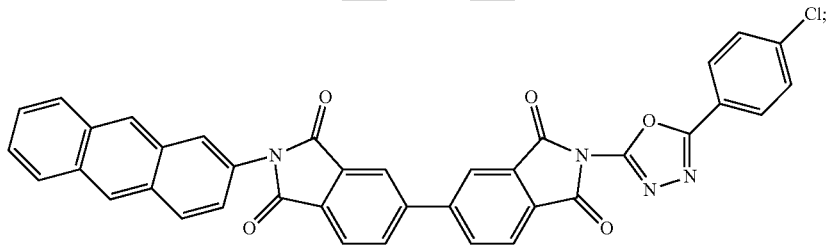
Glass Mixture 22: which is an asymmetric electron-transporting imide molecular glass mixture comprising the following six components:
(Glass Mixture 22)
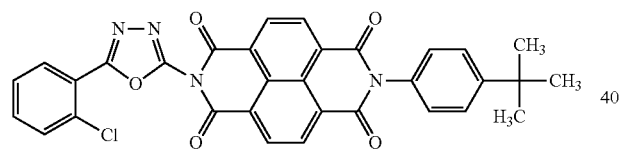
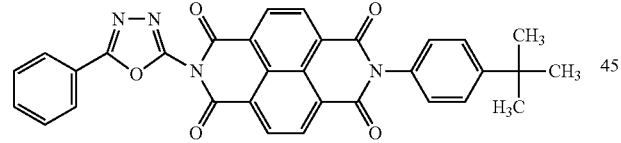
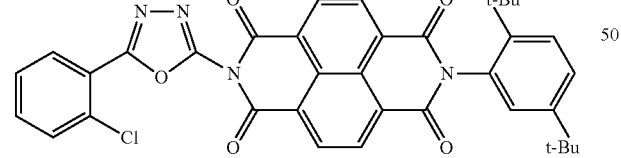
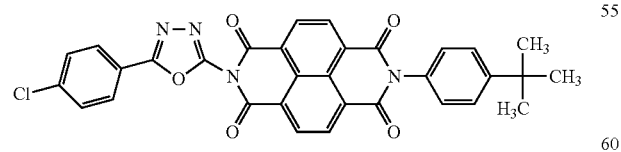
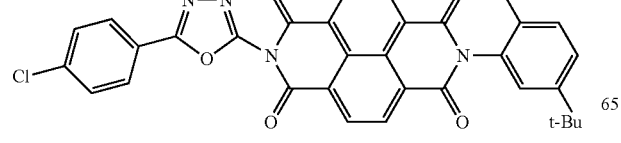
-continued
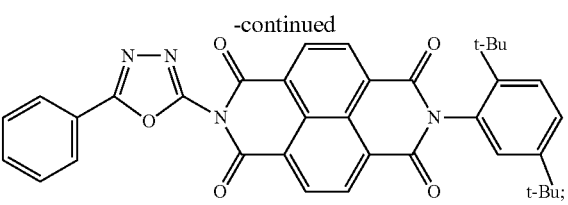
Glass Mixture 23: which is an asymmetric bipolar molecular glass mixture comprising the following six components:
(Glass Mixture 23)
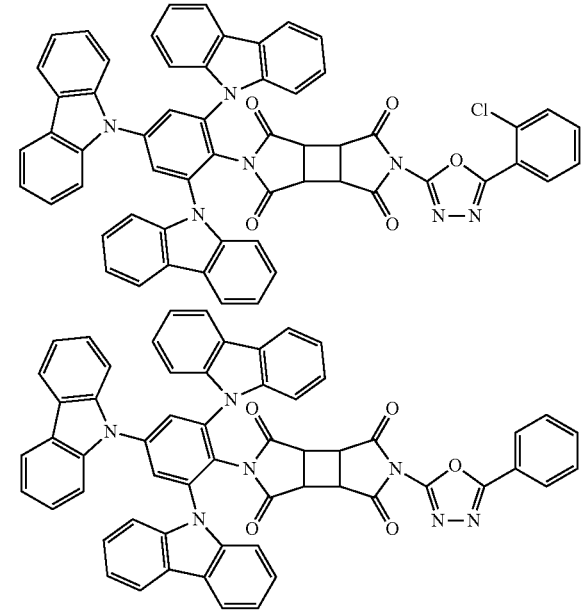

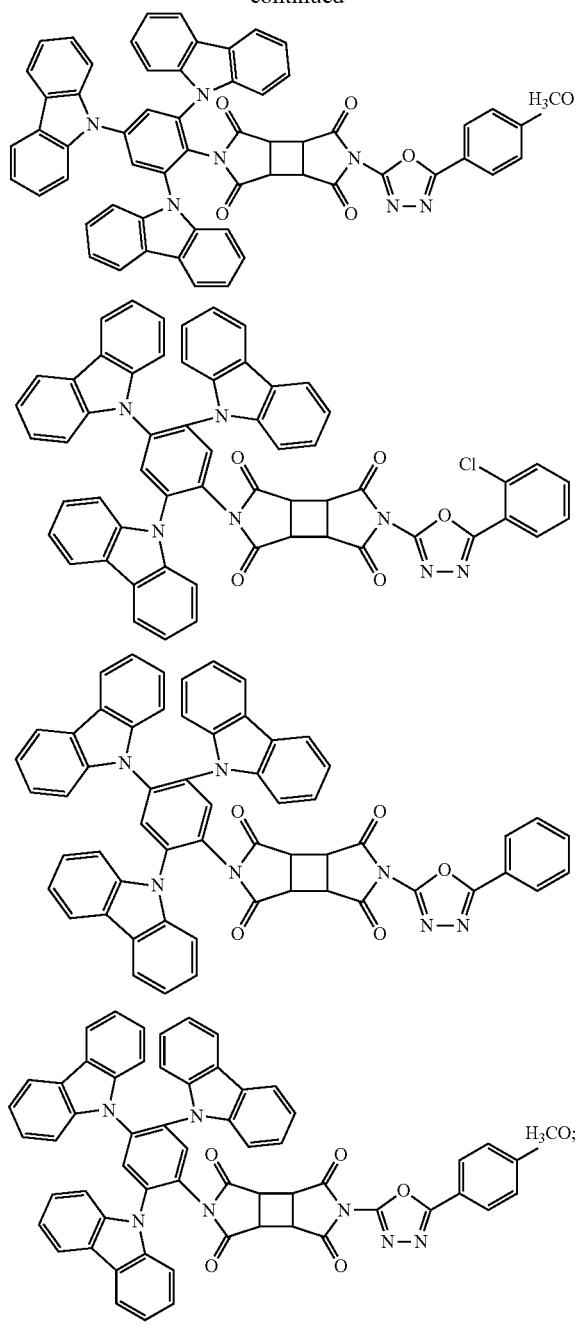
Glass Mixture 24: which is an asymmetric bipolar carbazole-oxadiazole molecular glass mixture comprising the following four components:
(Glass Mixture 24)
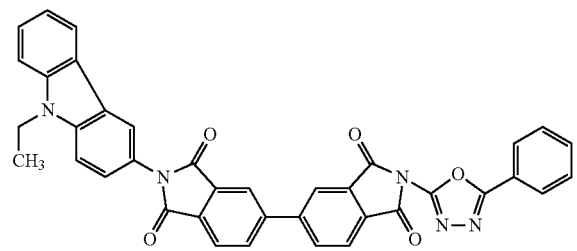
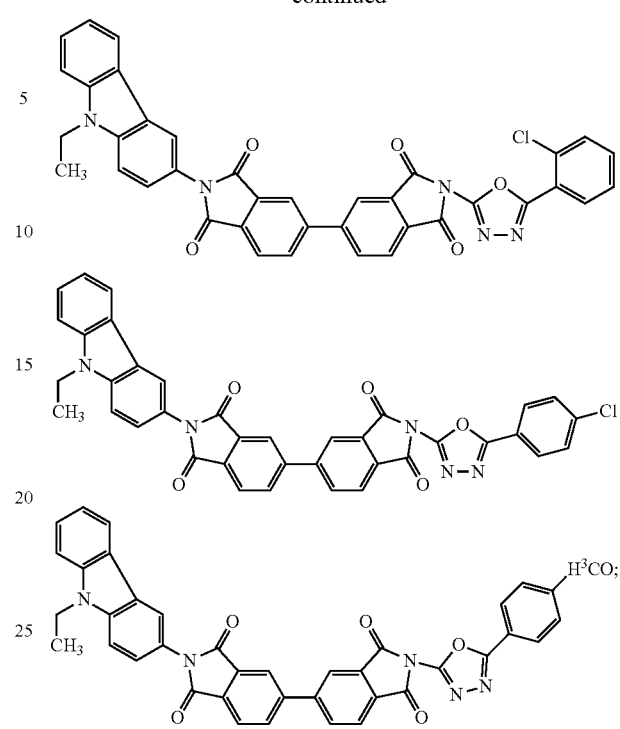
Glass Mixture 25: which is an asymmetrical bipolar carbazole/oxadiazole molecular glass mixture comprising the following six components:
(Glass Mixture 25)
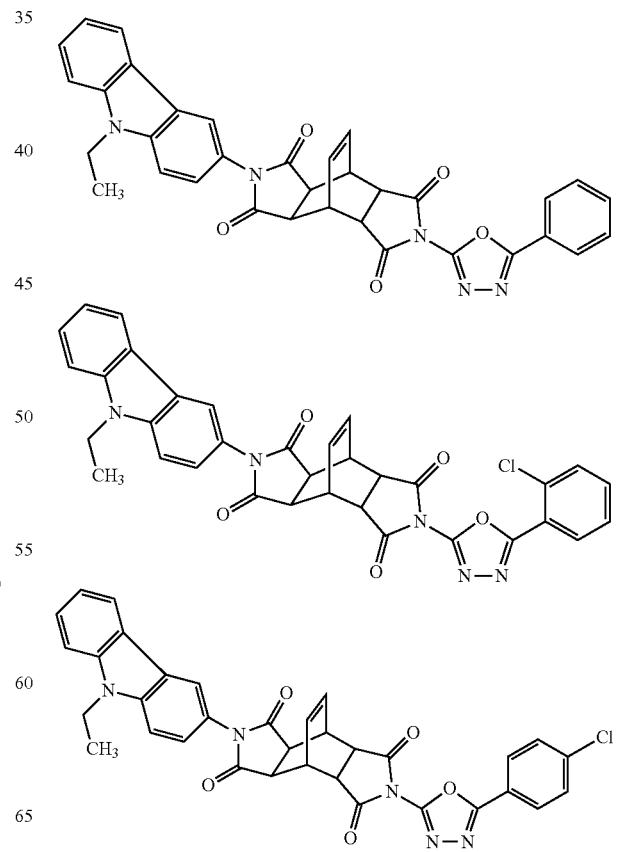

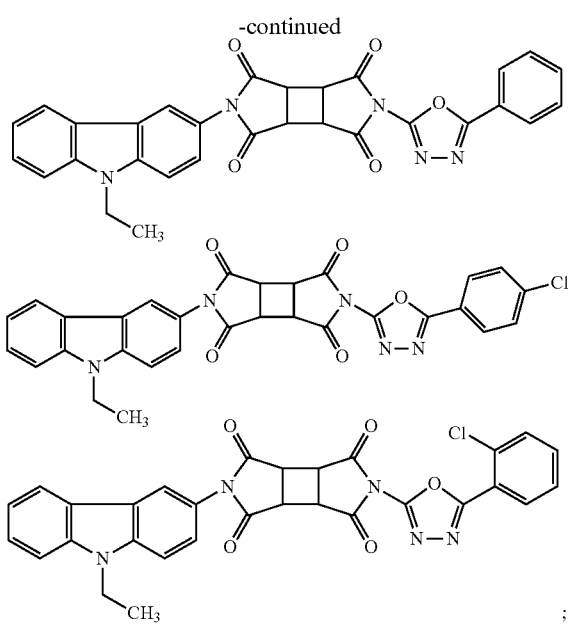

Glass Mixture 26: which is an asymmetric bipolar carbazole/triazine molecular glass mixture comprising the following six components:

(Glass Mixture 26)

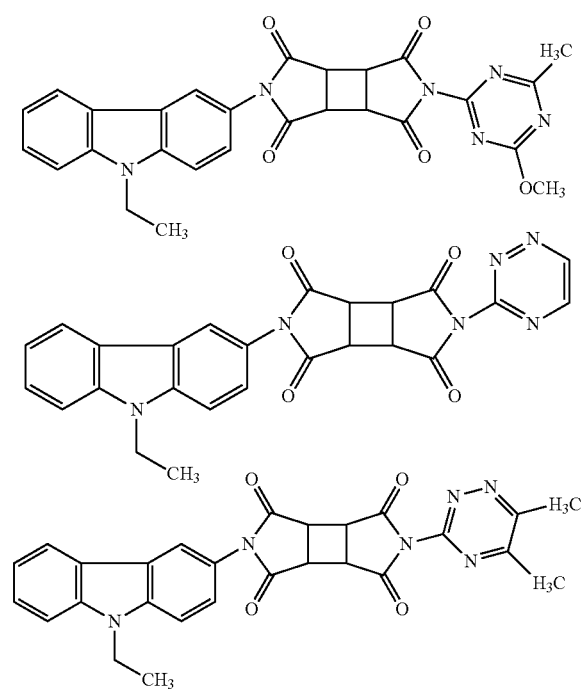

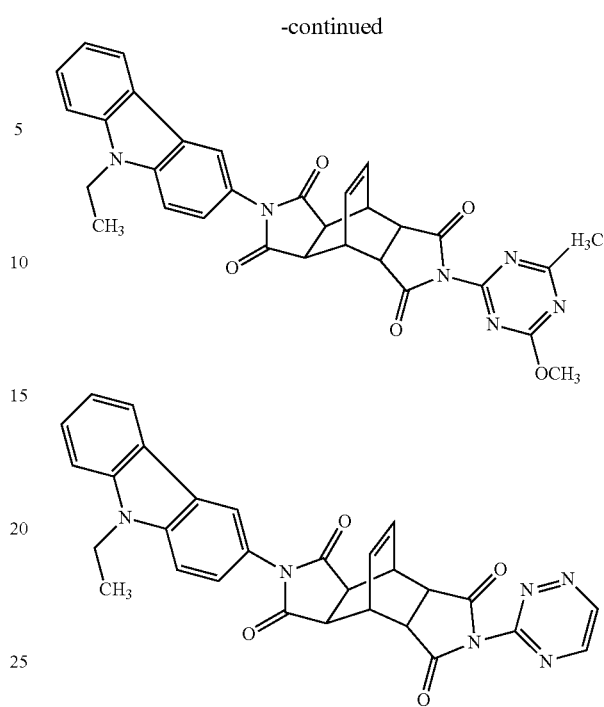

4. Asymmetric Molecular Glass Mixtures Prepared from Asymmetric-Isomeric Imide Bisanhydride The preceding procedure for the preparation of asymmetrical imide molecular glass mixtures is followed, except that the starting bisanhydride is an asymmetric-isomeric mixture:

A. Asymmetric-Isomeric Bisanhydride Imides 4: Carbazole based via the following reaction which produces Glass Mixture 26: which is a bipolar carbazole-ozadiazole molecular glass mixture comprising the following ten reaction products):

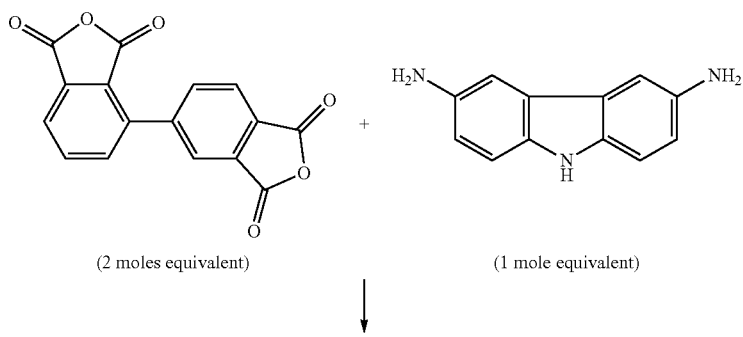

(2 moles equivalent)    (1 mole equivalent)

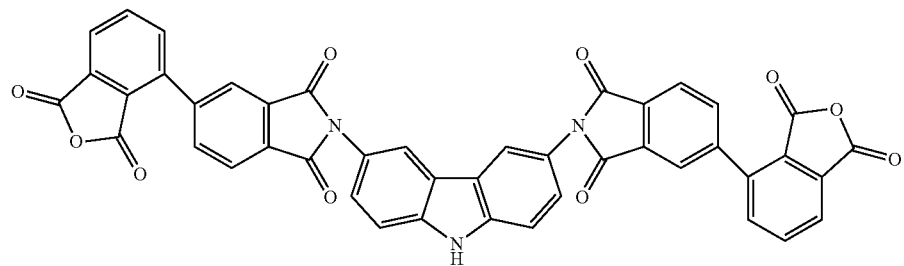
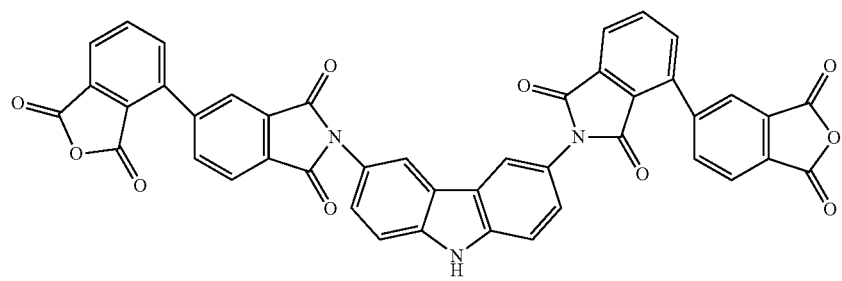
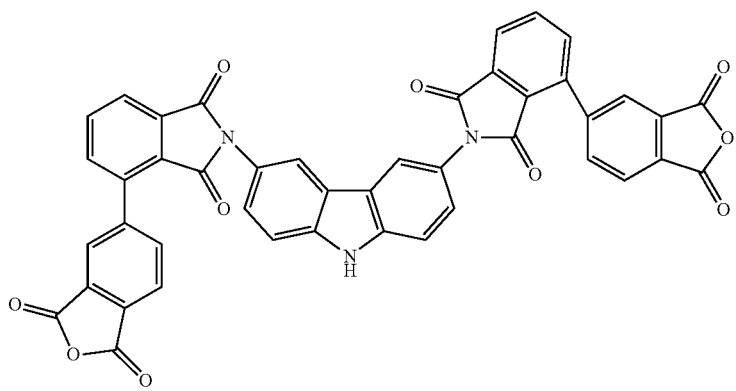
(Asymmetric-Isomeric Bisanhydride Imides 4: Carbazole based)
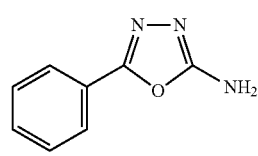
(1 mole equivalent)
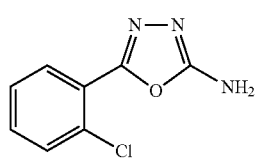
(1 mole equivalent)

141 142
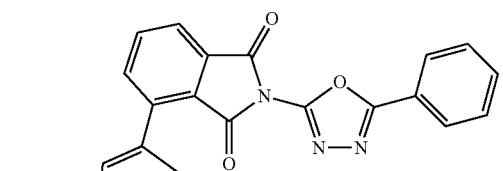
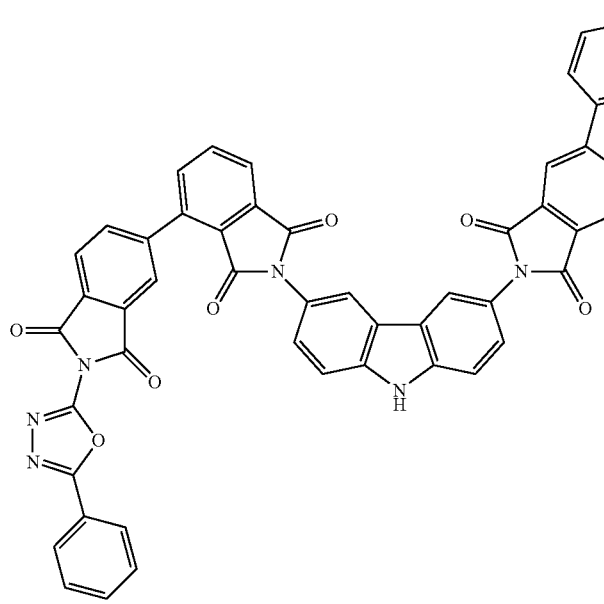
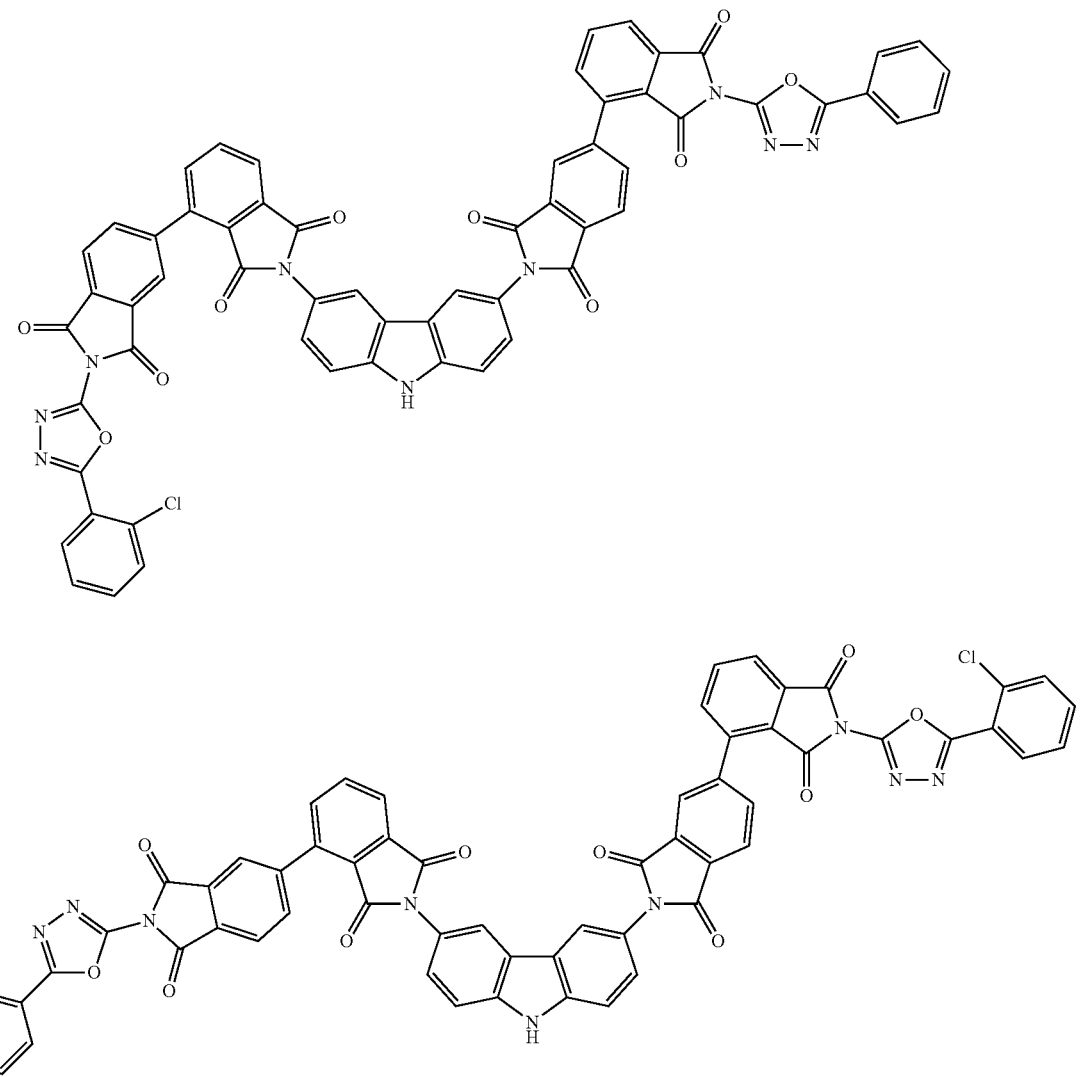

-continued
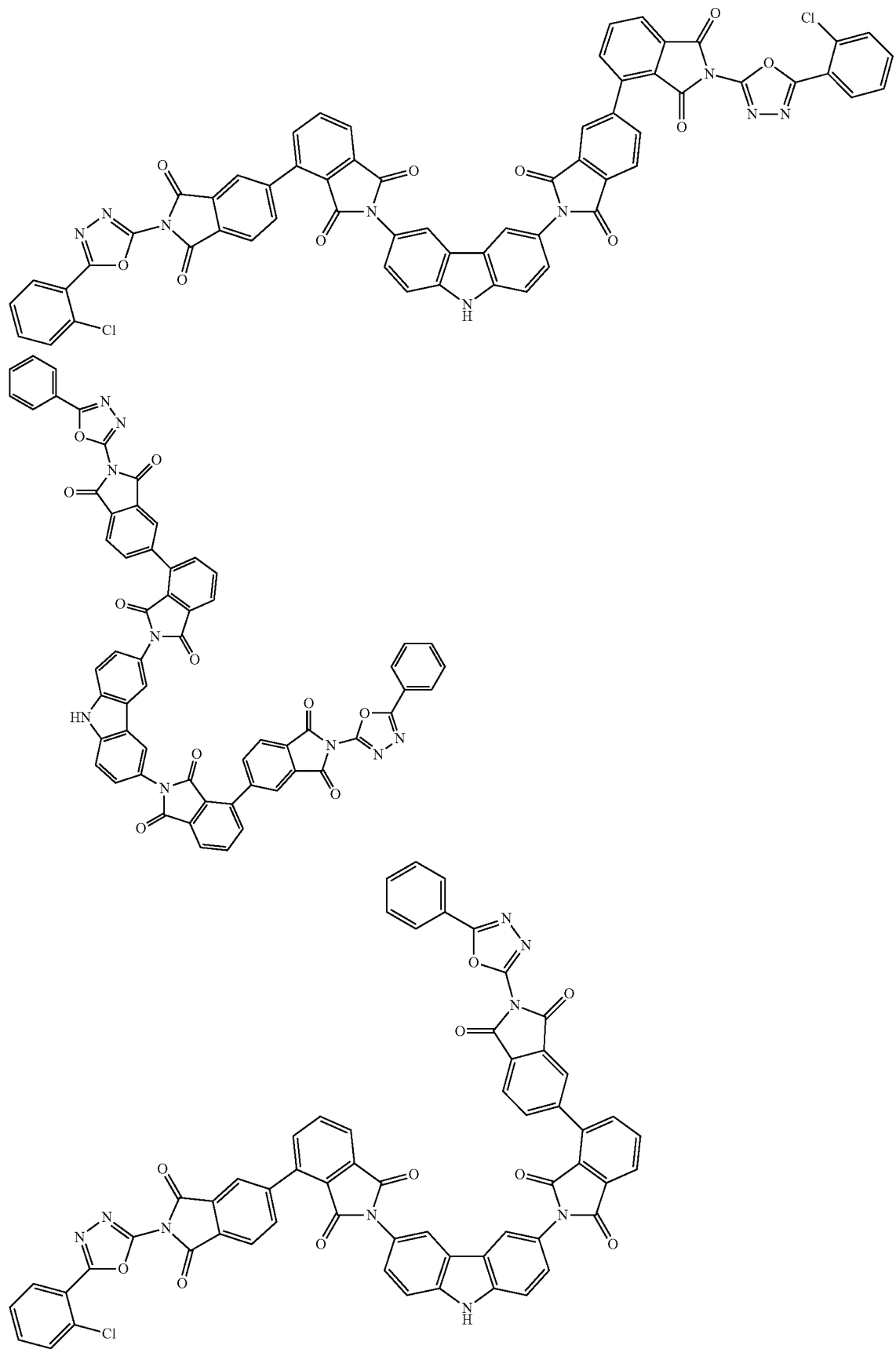

-continued
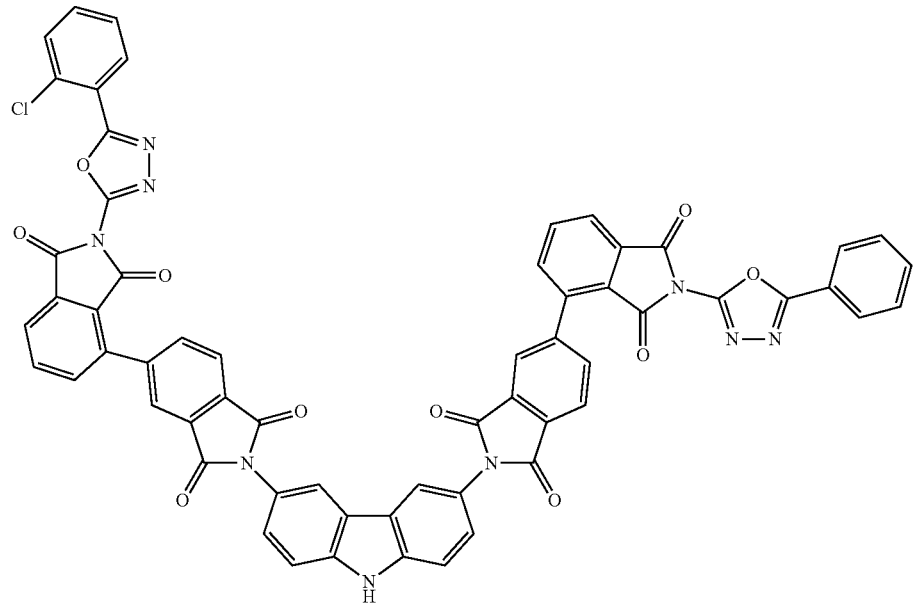
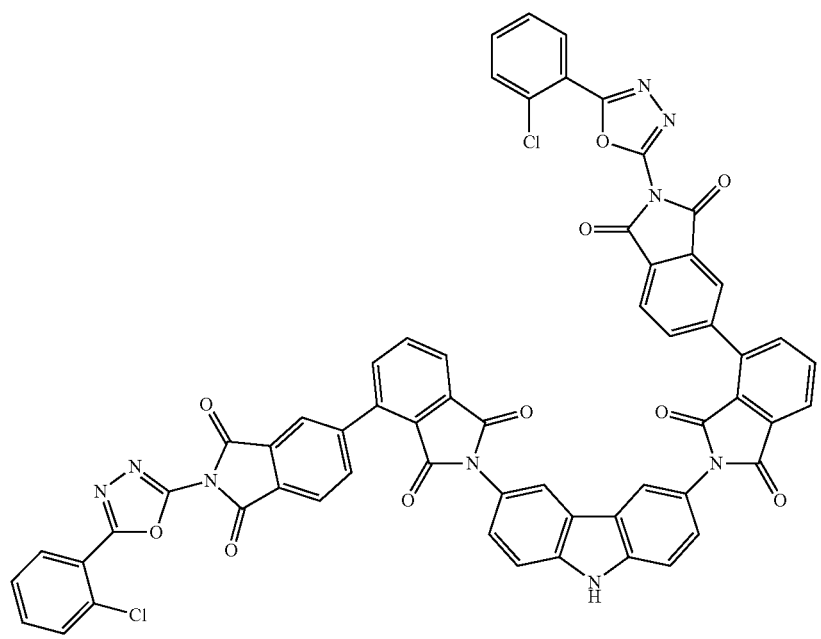

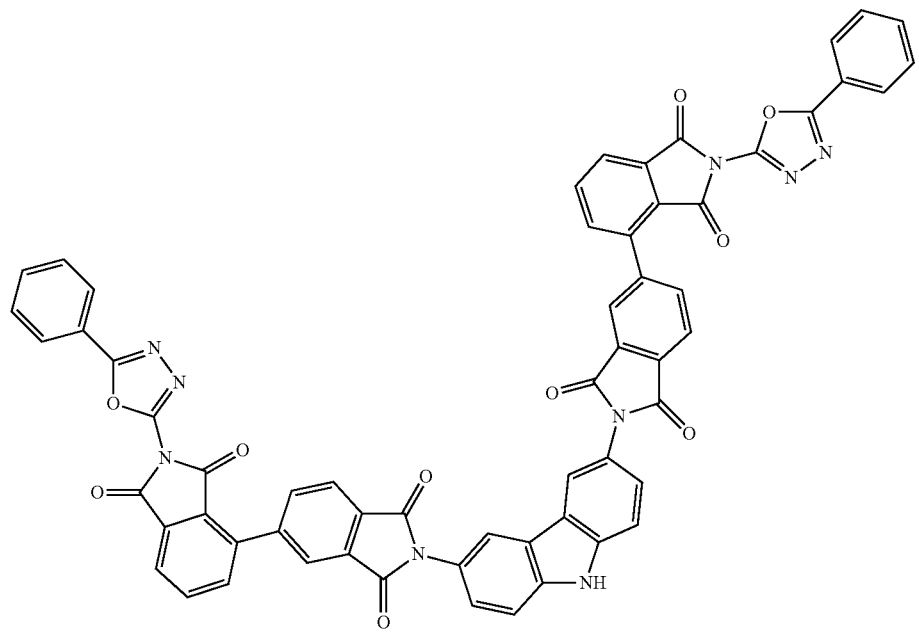
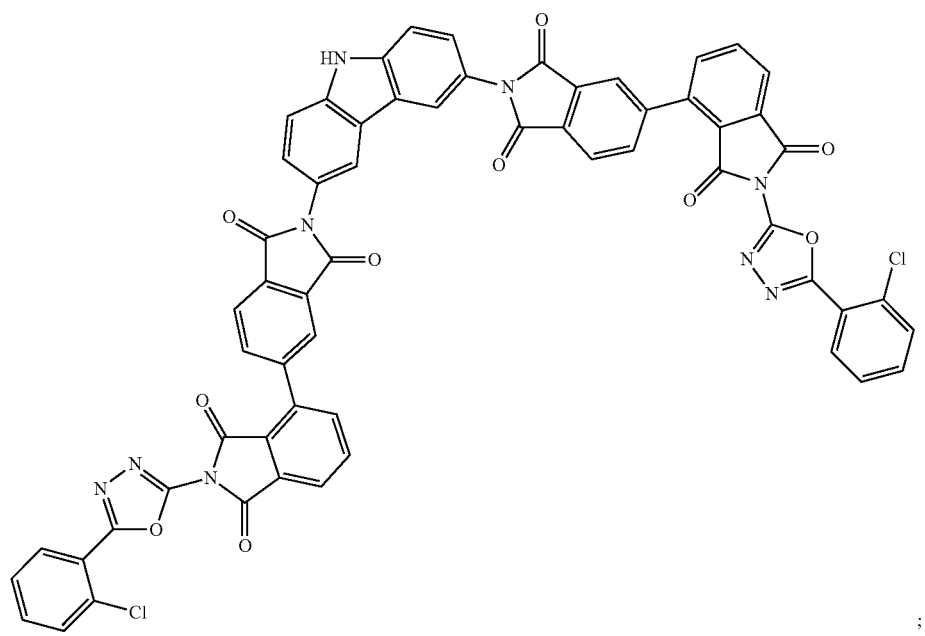
(Glass Mixture 26)
B. Asymmetric-Isomeric Bisanhydride Imides 5: Pyrene based via the following reaction which produces Glass Mixture 27: which is a bipolar oxadiazole-carbazole luminescent molecular glass mixture comprising the following ten reaction products):

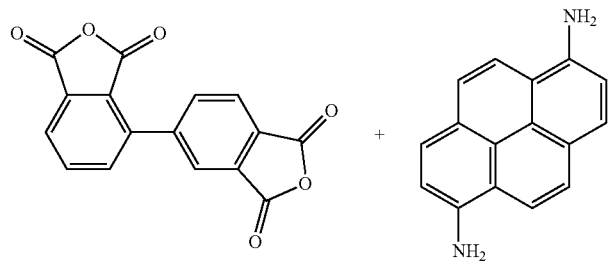
(2 moles equivalent)   (1 mole equivalent)
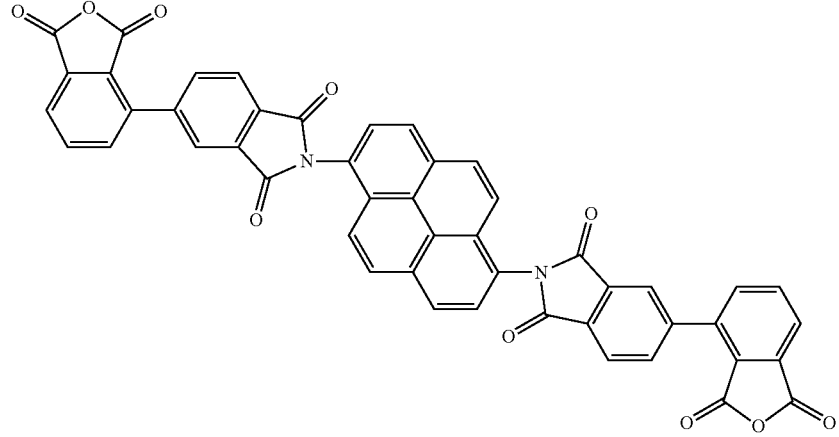
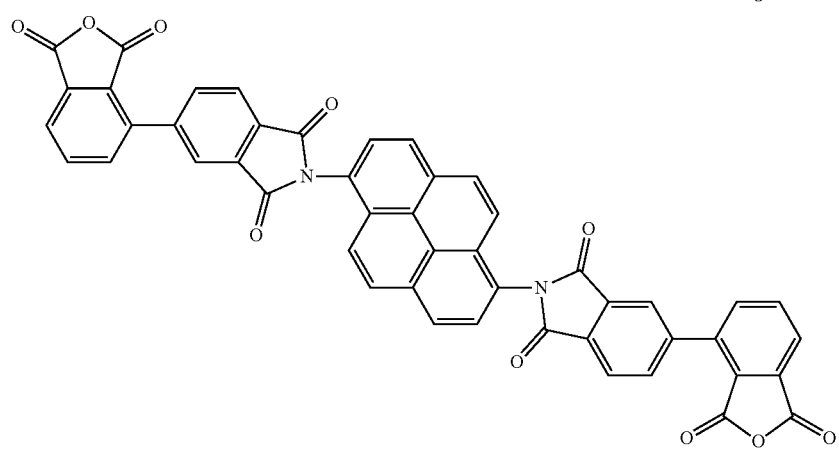
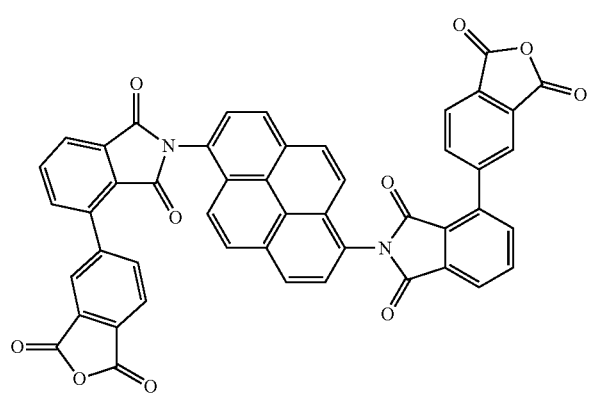
(Asymmetric-Isomeric Bisanhydride Imides 5: Pyrene based)

-continued
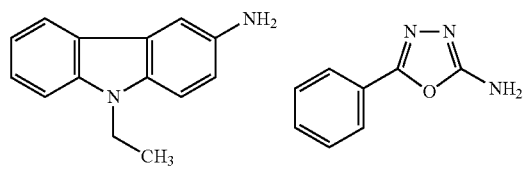
(1 mole equivalent)　　　(1 mole equivalent)
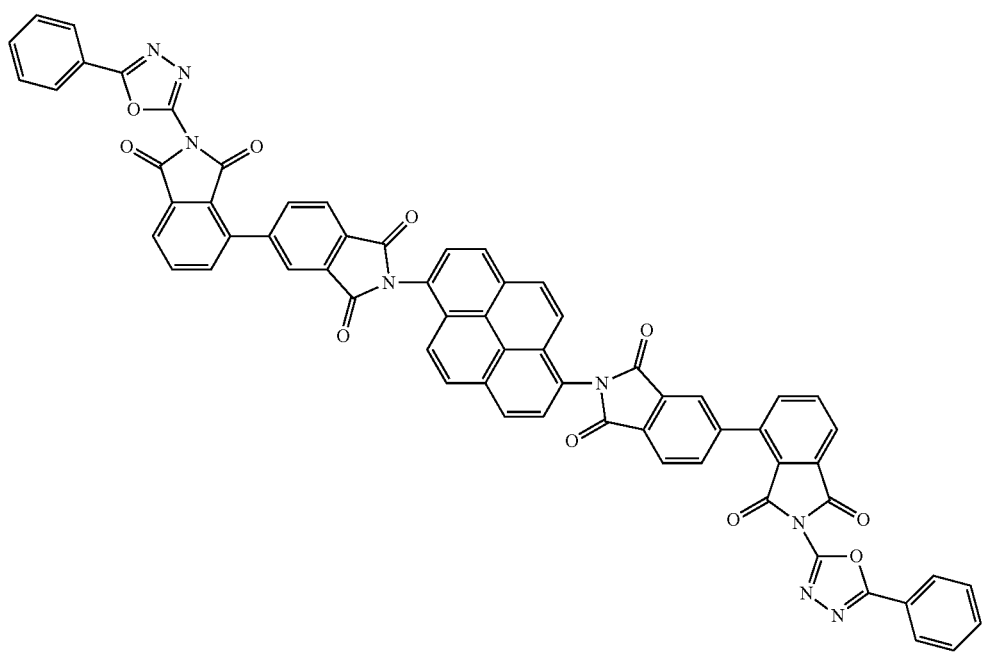
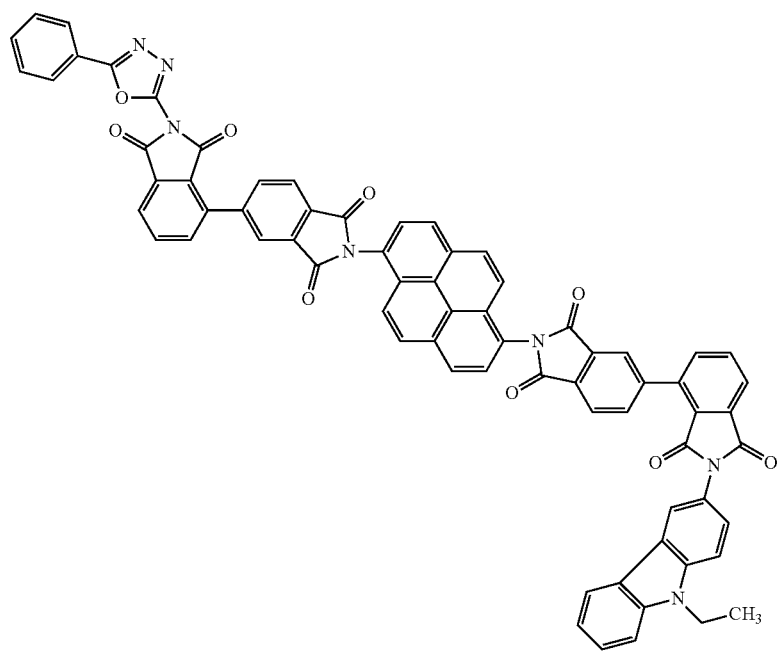

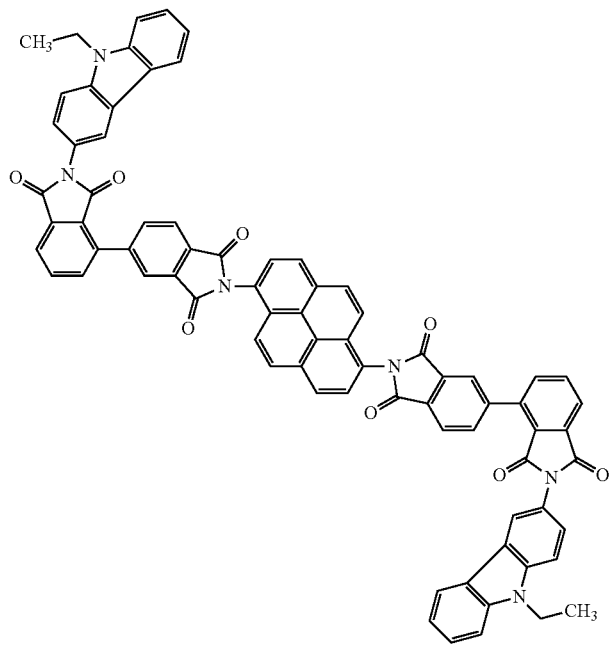
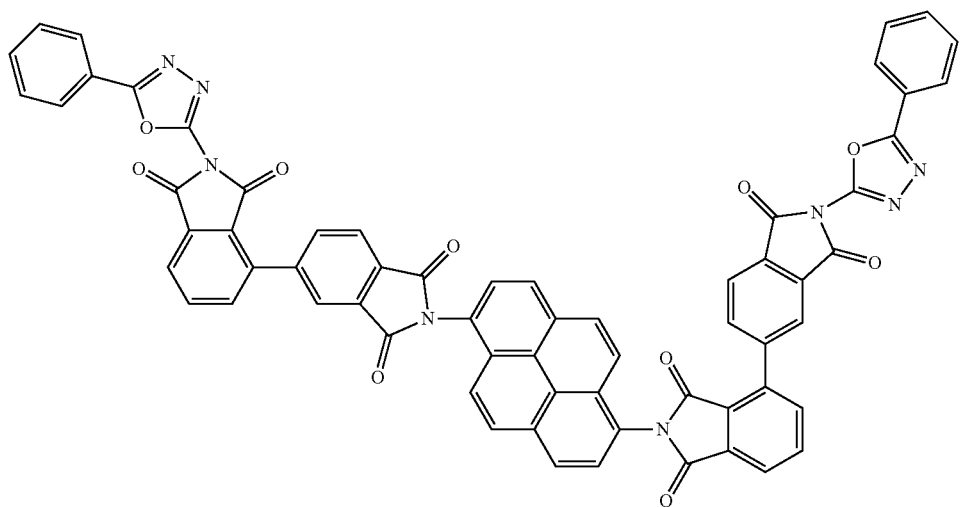
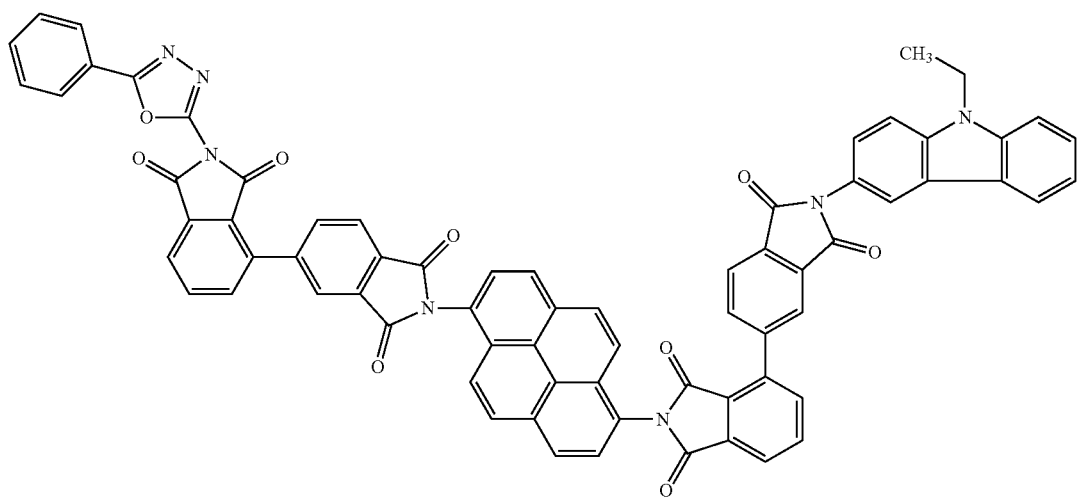

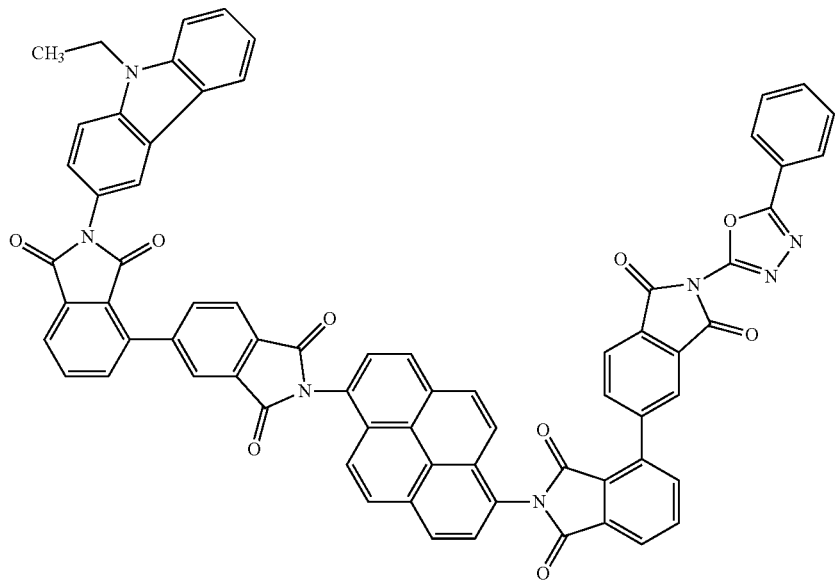

-continued
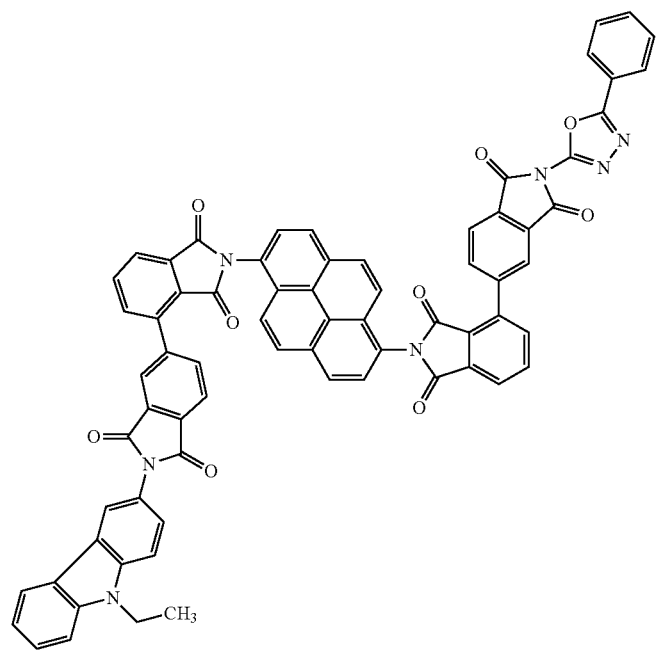
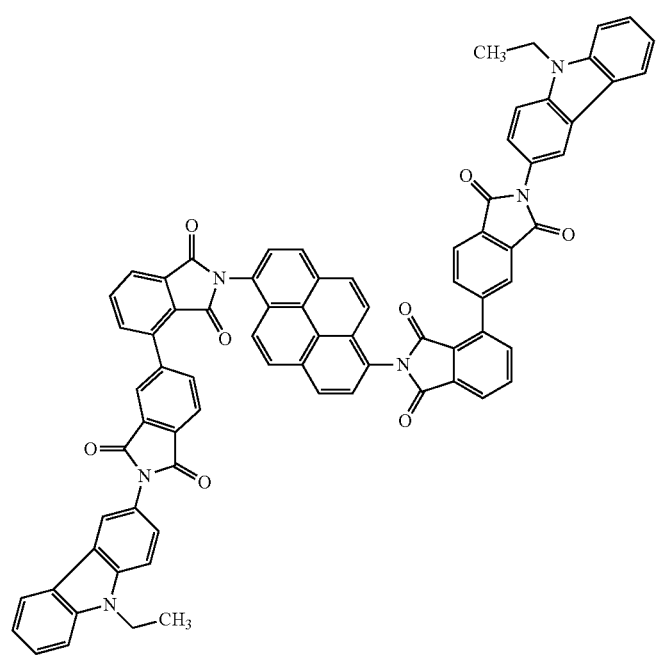

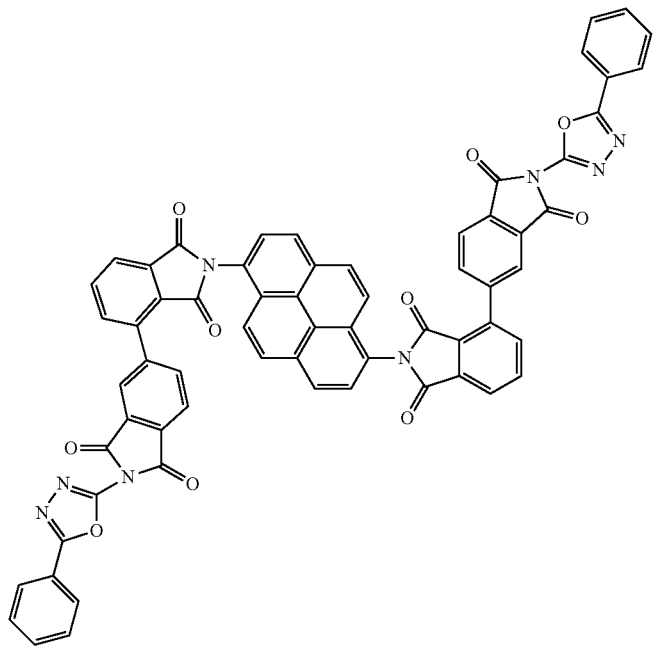

EXAMPLES

The following examples illustrate the preparation of the mixtures of the invention. Though any readily available means of determining physical properties of chemicals may be used, as a matter of representation, for the examples provided glass transition temperatures are determined by differential scanning calorimetric analysis at a heating rate of 10° C./min. or 20° C./min. as specified; characterization of the components composition is determined by HPLC analysis; photophysical and electrophysical properties are measured using various techniques, including ultraviolet-visible light (UV-Vis) spectroscopy, photoluminescence, fluorescence and phosphorescence spectra, cyclic voltammetry, and time-of-flight mobility measurements.

Example 1

Preparation of Bipolar Oxadiazole-Carbazole 4,4'-(4,4'-Isopropylidenediphenoxy)bis(phthalic anhydride)diimide Molecular Glass Mixture

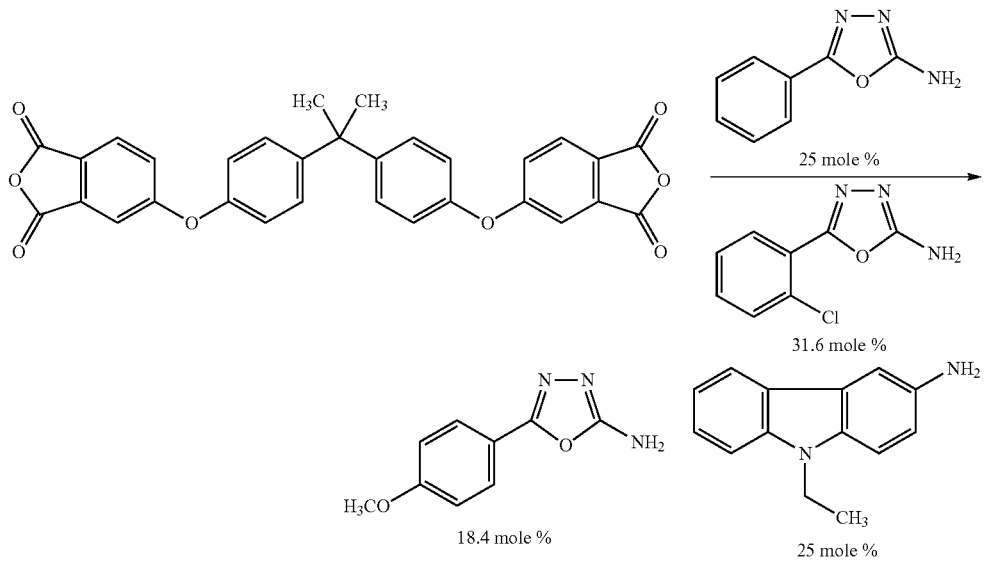

In a 500 milliliter three-necked round-bottomed flask, fitted with a condenser were added 300 ml of anhydrous NMP solvent. Then 2.91 g (0. 0.0149 mole) of recrystallized 2-Amino-5-(2-chlorophenyl)-1,3,4-oxadiazole, 2.48 g (0. 0.0118 mole) of recrystallized 3-amino-9-ethylcarbazole, 1.90 g (0. 0.0118 mole) of recrystallized 2-Amino-5-phenyl-1,3,4-oxadiazole, 1.66 g (0.0087 mole) of recrystallized 2-Amino-5(4-methoxyphenyl)-1,3,4-oxadiazole, 12.02 g (0.023264 mole) of recrystallized 4,4'-(4,4'-'Isopropylidene-diphenoxy)bis(phthalic anhydride), and 12.02 g (0.09306 mole) of isoquinoline (catalyst) were added.

The mixture was gently heated to 70° C. under stirring for 2 hours, followed by refluxing for 5 hours. Thereafter, the reaction solution was poured into a mixture of methanol and dilute hydrochloric acid under vigorous stirring, giving a molecular glass powder. The molecular glass was filtered, re-dissolved in dichloromethane and re-precipitated into heptane. Finally the dried solid was dried under vacuum. The ten components of the molecular glass mixtures are shown in FIG. 1.

Solubility

The pale tan solid was very soluble in acetone (preferred green solvent), dichloromethane, tetrahydrofuran, N-methyl pyrrolidone (NMP) and toluene.

Photophysical Propertels

Figure 2:
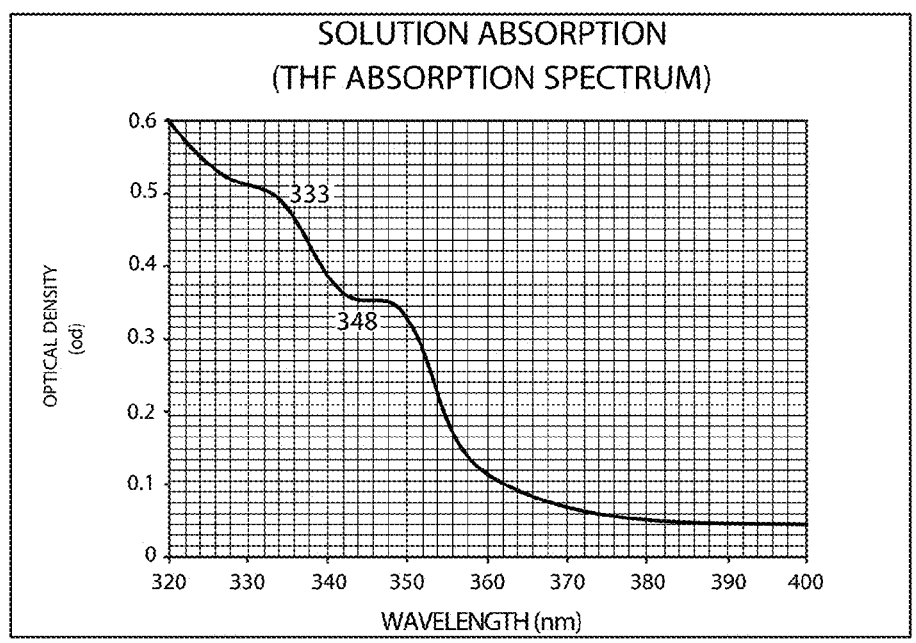
FIG. 2 depicts an ultraviolet absorption of the molecular glass mixture of example 1 in tetrahydrofuran (THF)
Figure 3:
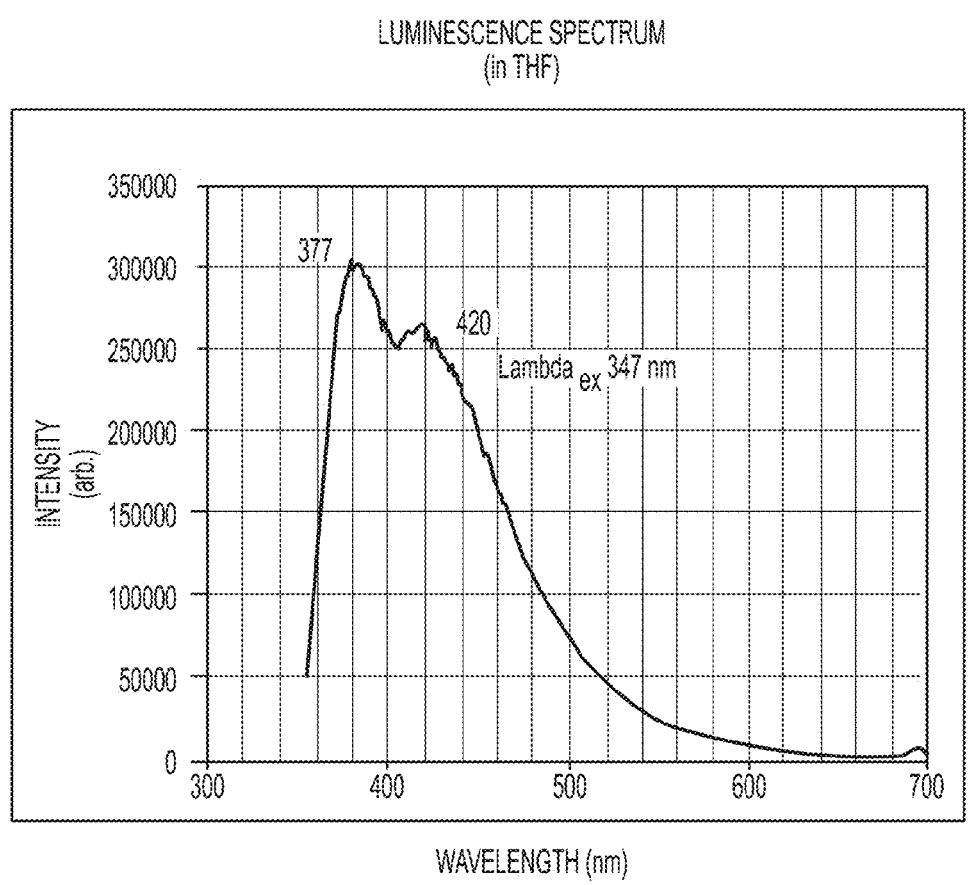
FIG. 3 depicts a photo fluorescence emission of the molecular glass mixture of example 1 excited at 347 nanometers (nm) in THF.

Referring to the graph depicted in FIG. 2, the UV/Vis spectrum in THF has two peaks at 333 nanometers (nm) and 348 nm respectively. The optical band gap ($E_g$) was calculated from the threshold of THF solution optical absorption at 3.43 electron volts (eV). Referring to the graph depicted in FIG. 3, the fluorescence emission spectrum in THF ($E_{ext}$, 347 nm) shows two peaks at 377 nm and 420 nm respectively. These are depicted in Table 2, and Table 3 depicts thermal properties of the glass mixture.

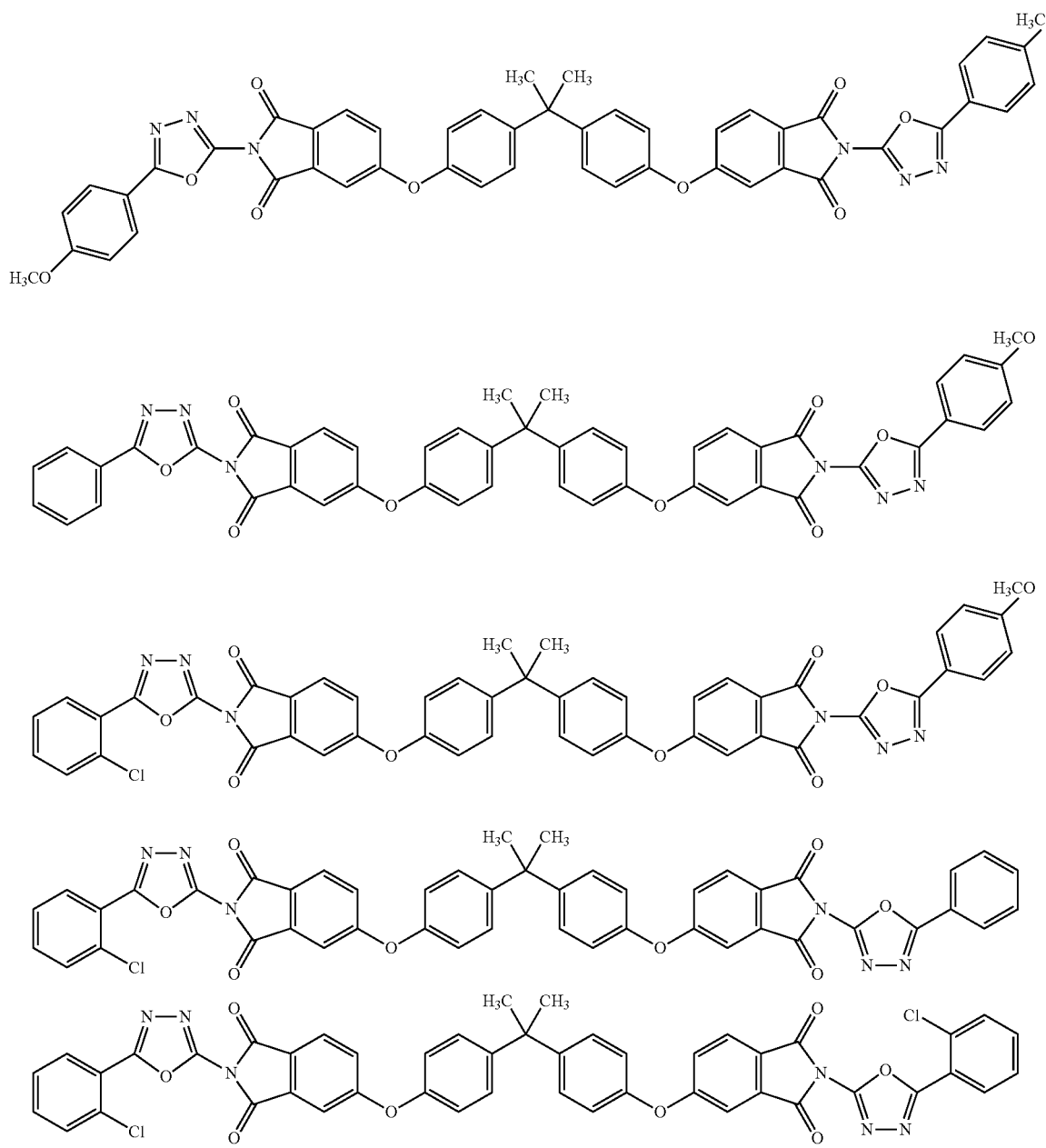

-continued

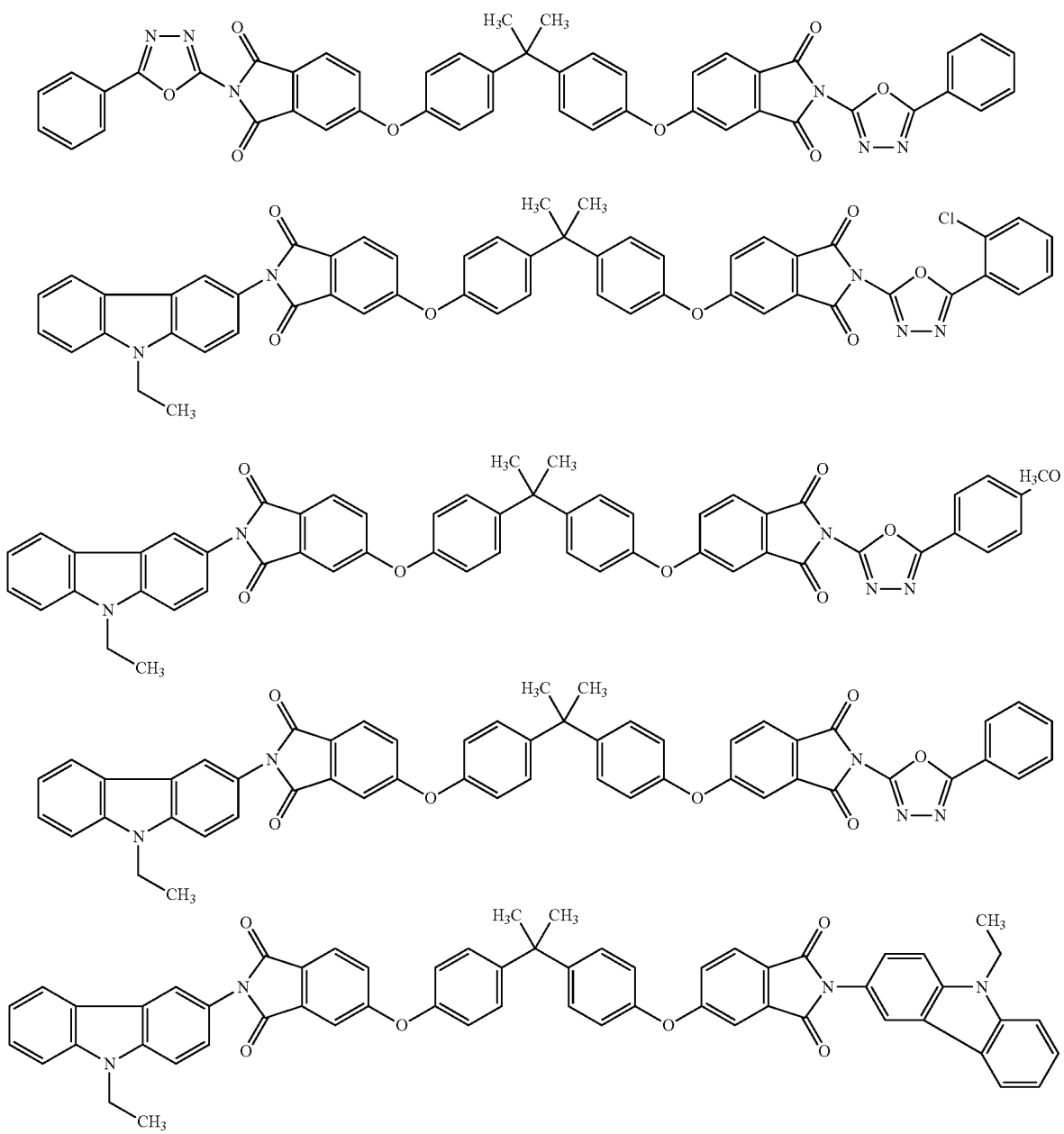

Example 1: Bipolar Carbazole-Oxadiazole Molecular Glass Mixture

TABLE 2

| Molecular Glass Mixture | Optical, Photophysical Properties ||||||
|---|---|---|---|---|---|---|
| | $\lambda_{abs}{}^a/nm$ | $\lambda_{abs}{}^b/nm$ | $\lambda_{em}{}^c/nm$ | $E_g^c$/ev | $E_g^d$/ev | $\mu_{electron}$ cm$^2$/Vsec $\quad \mu_{hole}$ cm$^2$/Vsec |
| Example 1 | 333/348 | | 377/420 (347 ex) | 3.43 | | |
| Example 2 | 238/265/296 | 240/285/320 | 368 (295 ex) | 3.43 | 3.29 | $4.8 \times 10^{-4} \quad 4.8 \times 10^{-4}$ |

$^a$In THF
$^b$Neat Film
$^c$in THF
$^d$Neat Film

TABLE 3

Thermal Properties

| Molecular Glass Mixture | $T_g^e/°C.$ | $T_{sch}/°C.$ | $T_m/°C.$ | $Td/°C.$ |
|---|---|---|---|---|
| Example 1 | 80 | none | none | 275 |
| Example 2 | 150 | 202.7 | 291.6 | 320 |

$^e$) @ 10°/min

Thermal Properties

Figure 4:
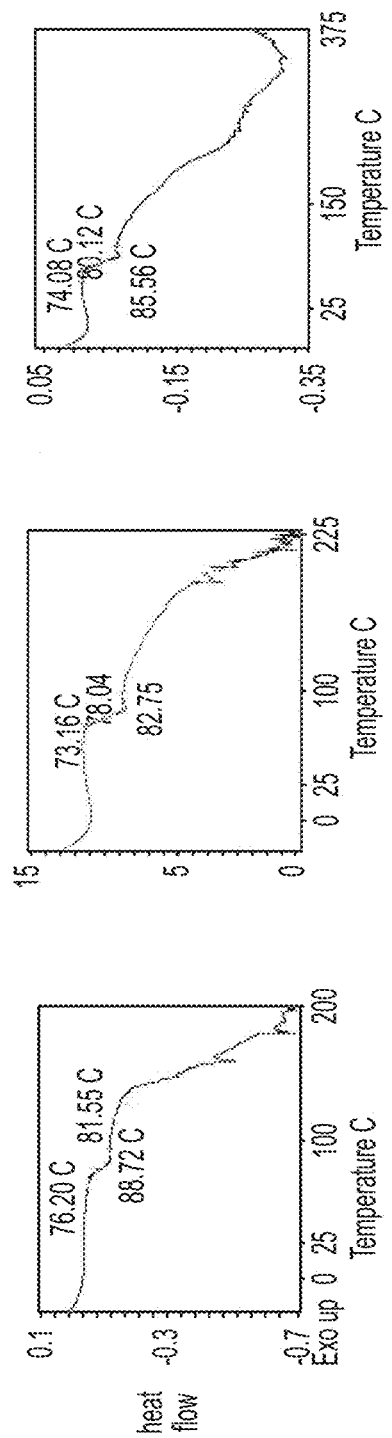
FIG. 4 shows a differential scanning calorimetry (DSC) scans for the molecular glass mixture of example 1.

Referring to the graph depicted in FIG. 4, differential scanning calorimetry (DSC), shows no crystallization peak ($T_{sch}$), no melting point peak ($T_m$), and a well defined glass transition temperature ($T_g$) at 80° C. even after four heating cycles up to 200° C. above the glass transition temperature. This clearly shows that the molecular glass mixture is noncystallizable. The $T_g$ of this molecular glass mixture (80° C.) is 15° C. above that of TPD (N,N'-diphenyl-N,N'-bis-3-methylphenyl[1,1'-biphenyl]-4,4'-diamine, and 15° C. below that of NPD (N,N'-di-1-naphthalenyl-N,N'-diphenyl-1.1' biphenyl-4,4'-diamine), two of the most used hole-transporting small molecules in OLED devices, specially vacuum coated. This proves that materials crystallize not because they have low glass transition temperature (as reported frequently in the literature), but because they are crystallizable. The non-crystallizable molecular glass mixtures of this invention remain amorphous regardless of their glass transition temperatures. These are depicted in Table 3.

Compatibility with Coumarin 6

Coumarin 6 is one of a set of fluorescent dyes widely used in OLED (Table 4). It has a very sharp melting point and does not show a glass transition temperature. Typically coumarin 6 is used as a dopant in a host matrix to suppress fluorescent quenching. However phase separation has been a concern. The molecular glass mixtures of this invention can prevent this problem given their inherent high entropy of mixing values.

TABLE 4

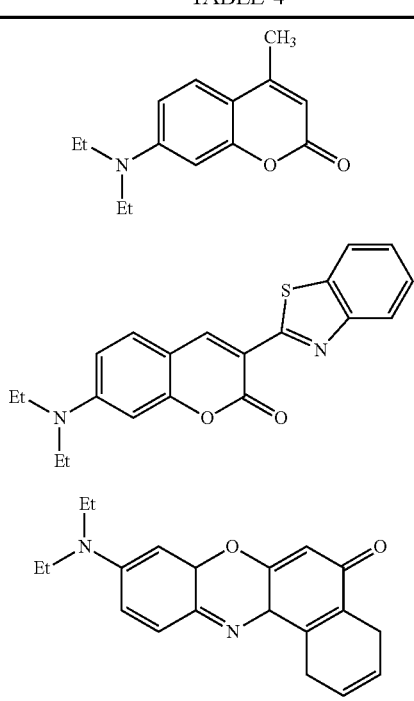

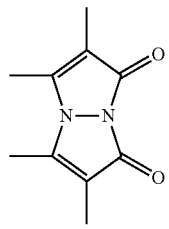

Figure 5:
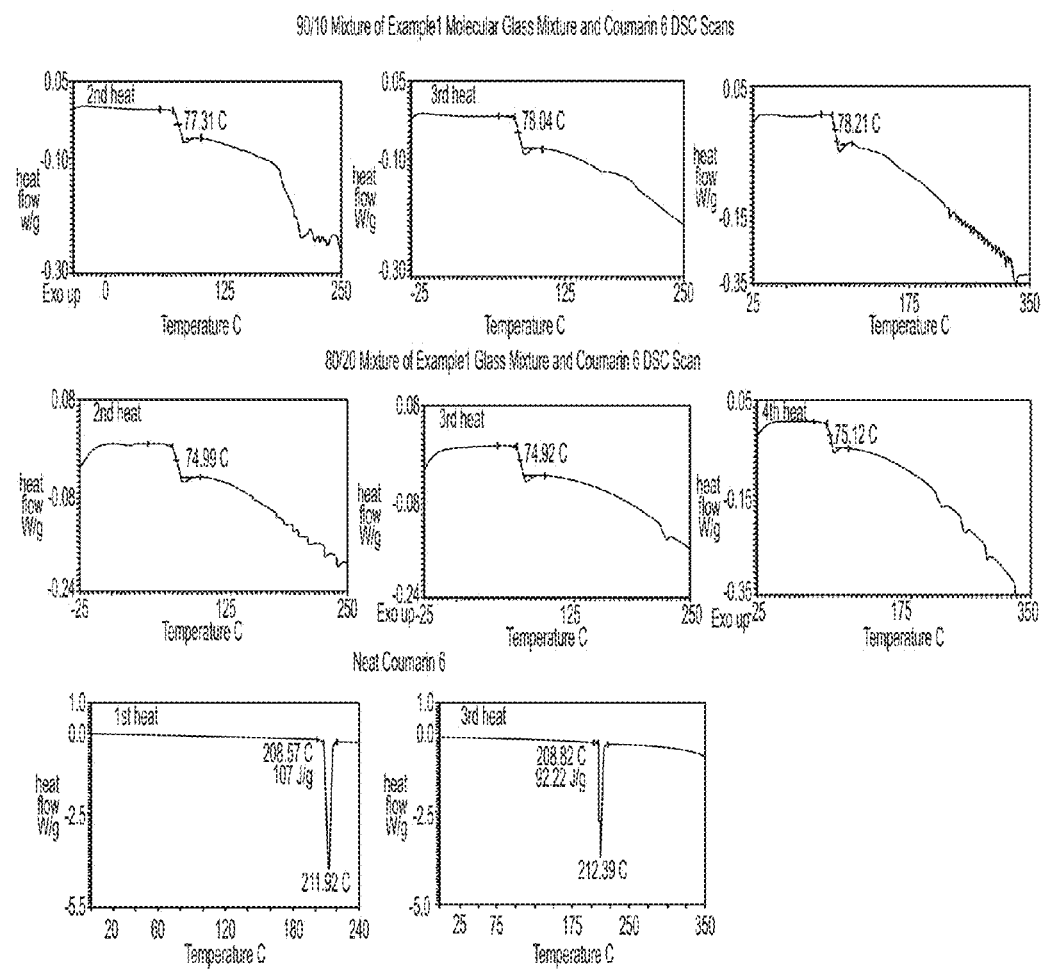
FIG. 5 shows a DSC scans for two mixtures of the molecular glass mixture of example 1 and coumarin 6.

Chemical structure of (a) Coumarin 47, (b) Coumarin 6, (c) Nile red, and (d) bimane To demonstrate this, the compatibility of coumarin 6 with the molecular glass mixture of example 1 at two different concentrations 10 wt % and 20 wt % was evaluated by differential scanning calorimetry, DSC. FIG. 5 shows the scans for neat Coumarin 6. In all three scans, no glass transition temperature is seen; but a very sharp melting transition is present.

It can be clearly be seen that the molecular glass mixture of example 1 both at the 10 wt % and 20 wt % level is fully compatible with the coumarin 6, completely eliminating the melting transition, and showing a single decreasing glass transition temperature with the concentration of coumarin 6. It appears that even higher concentration of coumarin 6 will stay compatible.

The concentration of coumarin 6 and of the other dyes used as a dopant is 5 to 10 times lower than the concentrations used for the DSC compatibility test. Thus we expect a device utilizing the molecular glass mixture of this invention to be very stable and free of phase separation.

Comparative Compatibility Example

The same DSC evaluation was repeated at the 10 w % level using 4,4'-cyclohexylidene bis[N,N-bis(4-methylphenyl)benzamine (TAPC),

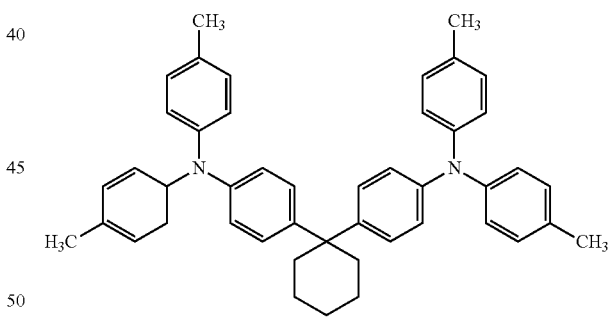

a widely used hole-transporting material in OLED

Figure 6:
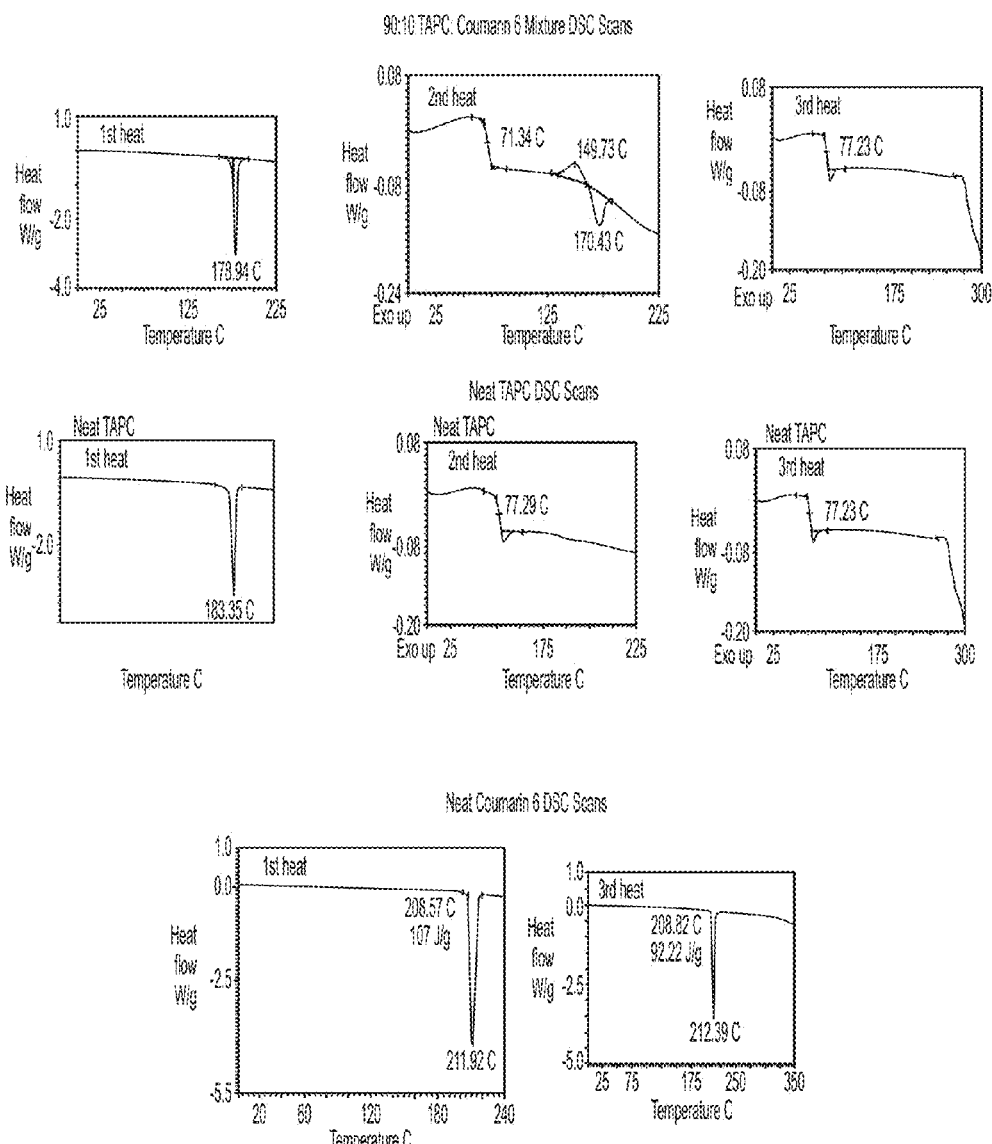
FIG. 6 shows a DSC scans for a 90:10 weight per weight (wt./wt.) of 4,4'-cyclohexylidene bis[N,N-bis(4-methyl phenyl)benzamine (TAPC), and coumarin 6.
Figure 7:
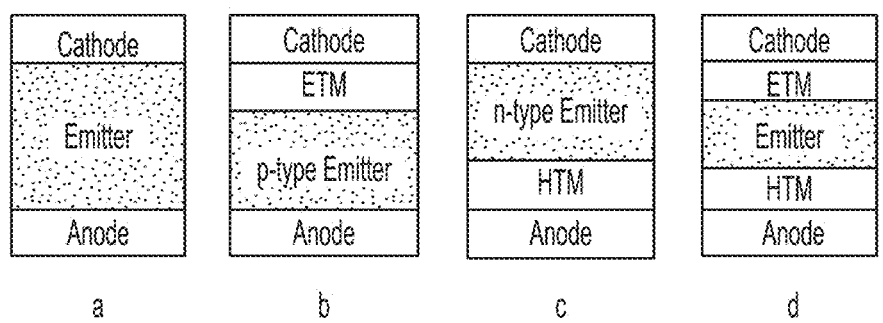
FIGS. 7a, 7b, 7c, 7d depict common OLED architectures with a hole-transporting material (HTM), and an electron-transport material (ETM) of the invention.

FIG. 6 shows the scans for both neat TAPC, and the 90:10 TAPC mixture with coumarin 6. A glass transition temperature around 71° C., a little lower than the 75° C. of the neat TAPC; However a crystallization peak is seen at 149.7° C., as well as a melting point at 170.4° C. at both the second and third scans. This illustrates the problem with non-equilibrium molecular glasses.

Solvent Spin-Coating

The molecular glass mixture of example 1 was dissolved in acetone (a green solvent) to generate coatings for time of flight mobility measurements. The solutions were spin-coated at 1000 rpm until dry. A coating of 4.5 microns was obtained from a solution of 0.058 g/ml. The thickness was 10.8 microns for a solution of 0.118 g/ml. This clearly demonstrated the solvent coatability of the molecular glass of example 1.

Example 2. Preparation of Bipolar Oxadiazole-Carbazole 3,3',4,4'-Biphenyltetracarboxilic Bisimide Molecular Glass Mixture

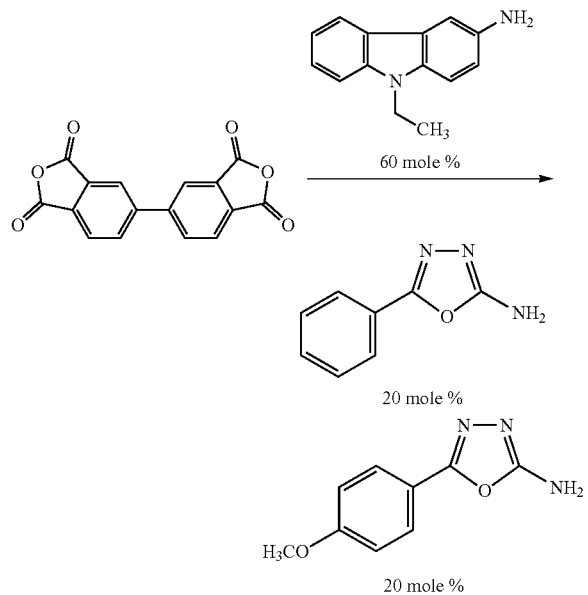

In a 250 milliliter three-necked round-bottomed flask, fitted with a condenser were added 150 ml of anhydrous NMP solvent. Then 2.22 g (0.01163 mole) of recrystallized 2-Amino-5(4-methoxyphenyl)-1,3,4-oxadiazole, 7.34 g (0.0349 mole) of recrystallized 3-amino-9-ethylcarbazole, and 1.87 g (0.011636 mole) of recrystallized 2-Amino-5-phenyl-1,3,4-oxadiazole, 8.56 g (0.02908 mole) of recrystallized 3,3',4,4'-Biphenyltetracarboxilic di-anhydride, and 7.51 g (0.05816 mole) of isoquinoline (catalyst) were added.

The mixture was gently heated to 70° C. under stirring for 2 hours, followed by refluxing for 5 hours. Thereafter, the reaction solution was poured into a mixture of methanol and dilute hydrochloric acid under vigorous stirring, giving a molecular glass powder. The molecular glass was filtered, re-dissolved in NMP and re-precipitated into a mixture of methanol and distilled water twice. The final precipitate was filtered, washed with methanol and dried under vacuum to yield a yellow molecular glass mixture. The six components of the molecular glass mixture produced are shown below:

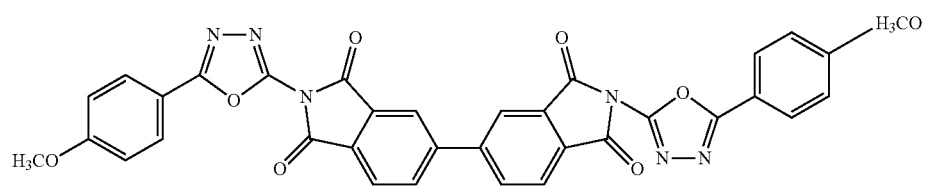

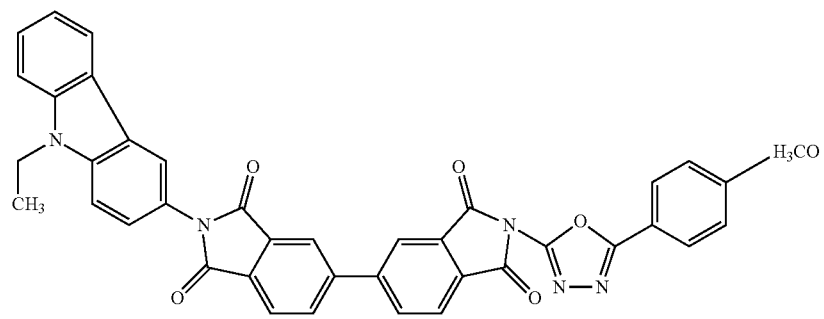

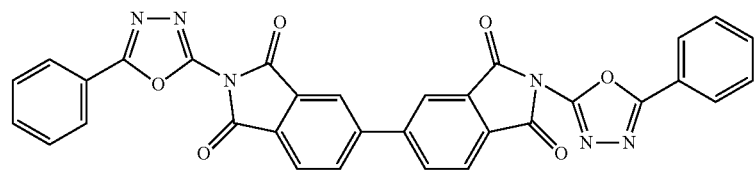

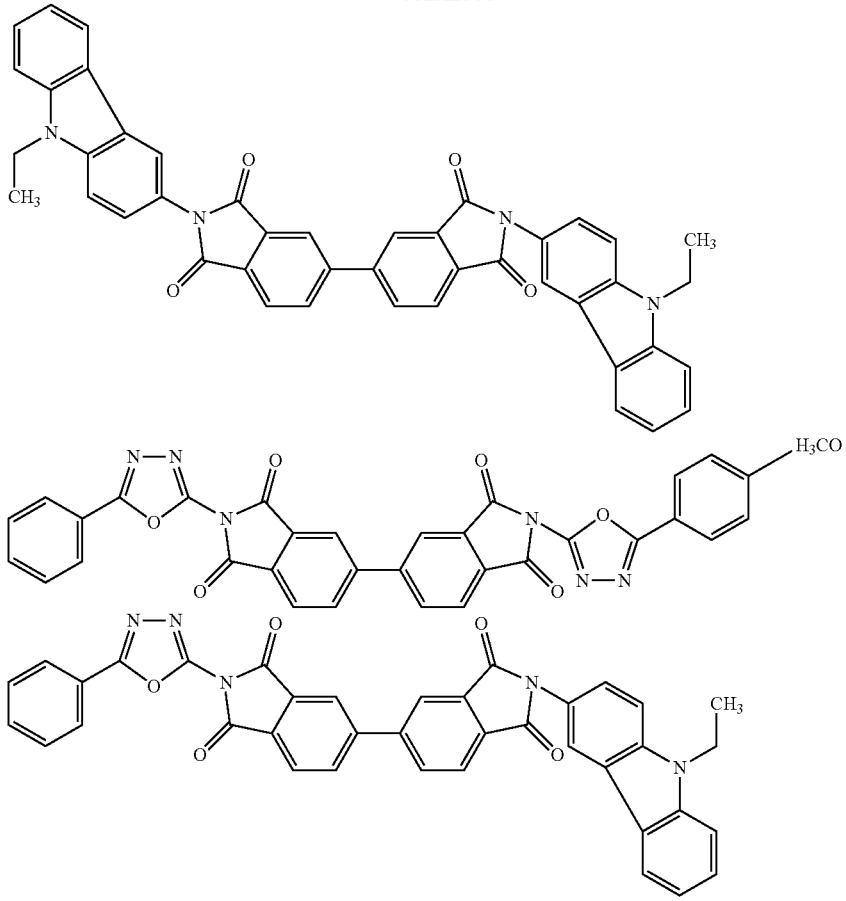

(Example 2: Bipolar Oxadiazole-Carbazole 3,3',4,4'-Biphenyltetracarboxilic Bisimide Molecular Glass Mixture)

Solubility

The molecular glass mixture is soluble in tetrahydrofuran (THF), N-methyl pyrrolidone (NMP) and dichloromethane (DCM), slightly soluble in toluene and insoluble in acetone.

Photophysical Properties

The UV/Vis spectrum in THF has three peaks at 238, 265, and 296 nm. The optical band gap (Eg) was calculated from the threshold of THF solution optical absorption at 3.43 eV. The fluorescence emission spectrum in THF (Eext, 295 nm) shows a lambda max at 368 nm. The optical band gap (Eg) was calculated from the threshold of thin film optical absorption on quartz at 3.29 eV. These are depicted in Table 2.

Charge Transport Mobility

Time-of-flight (TOF) measurements show bipolar charge transport. Electron and hole mobility ($\mu_{electron}$ and $\mu_{hole}$, respectively) was estimated at 4.8×10−4 cm2/Vsec, as depicted in Table 2. The 1.5 micron film used for the TOF measurement was vacuum deposited, demonstrating the thermal stability of the glass mixture. The balance of electron and hole mobility of this molecular glass mixture can be exploited to provide very efficient devices.

Thermal Properties

Differential scanning colorimetry analysis shows a glass transition at 150° C. (10°/min) after a second heating from 25° to 250° C.; a glass transition at 149.7° C. and a melting point at 291° C. after a third heating from 25° to 300° C.; a glass transition at 156° C., a temperature of crystallization peak at 202.7° C., and a melting point at 294.2° C. after a fourth heating from 25° to 375° C. The results suggest that the material is a mixture of an amorphous phase and a crystalline phase. Without being bound by theory, we believe that the crystalline phase consists of the symmetrical carbazole component. We thus predict that the preparation of an asymmetrical mixture will be complete amorphous and non-crystallizable. These are depicted in Table 3.

It should also be noted that the molar concentration of the carbazole moiety was 60%. Thus the concentration of the symmetrical carbazole component would be high, increasing the likelihood of phase separation. Adding another monoamine while adjusting the cabazole concentration will decrease the chance of phase separation.

Example of Applications

The charge-transporting molecular glass mixtures, the luminescent molecular glass mixtures, and combinations thereof of the invention can be used in organic photoactive electronic devices, such as organic light emitting diodes ("OLED") that make up OLED displays. The organic active layer is sandwiched between two electrical contact layers in an OLED display. In an OLED, the organic photoactive layer emits light through the light-transmitting electrical contact layer upon application of a voltage across the electrical contact layers.

It is well known by expert in the art, to use organic luminescent compounds as the active component in light-emitting diodes. Simple organic molecules, conjugated polymers, and organometallic complexes have been used. Devices that use photoactive materials frequently include one or more charge transport layers, which are positioned between a photoactive (e.g., light-emitting) layer and a contact layer (hole-injecting contact layer). A device can contain two or more contact layers. A hole transport layer can be positioned between the photoactive layer and the hole-injecting contact layer. The hole-injecting contact layer may also be called the anode. An electron transport layer can be positioned between the photoactive layer and the electron-injecting contact layer. The electron-injecting contact layer may also be called the cathode. Charge transport materials can also be used as hosts in combination with the photoactive materials.

FIGS. 7A-7D show common OLED architectures, not in scale, with a hole-transport material (HTM) and an electron-transport material (ETM), ("Electron Transport Materials for Organic Light-Emitting Diodes' A. Kulkarni et al, Chem. Mater. 2004,16, 4556-4573).

The luminescent molecular glass mixtures of the invention can be used either as host, dopant or non-doped emitter layers in those structures, depending on the composition, the structure and properties of the luminescent moieties. The charge transport molecular glass mixtures of the invention can also be used in fluorescent as well phosphorescent emitter systems.

It is well understood that these materials have to be optimized for particular device configuration. The hole transport layer materials (HTL) need to have the highest occupied molecular orbital (HOMO) level aligned with the corresponding HOMO level of the host to assure the hole flow into the emissive layer zone with minimal barrier for injection, whereas the HTL lowest occupied molecular orbital (LUMO) has to be sufficiently high to prevent electron leakage from the host into the HTL.

A similar set of rules, but with the opposite sign, exists for the interface of the host with the electron transport layer (ETL): The LUMO levels need to be aligned, and the ETL HOMO sufficiently deep to provide charge confinement. Triplet exciton energies of the materials in both charge transport layers should be significantly higher than the highest triplet level of all the emitters to prevent emissive exciton quenching. The triplet energy constraints also apply to the host materials, but with the requirements less stringent compared to those of hole and electron transport molecules. In addition, the positions of the HOMO of the HTL and LUMO of the ETL will have to match the work functions of both electrodes to minimize charge injection barriers. (E. Polikarpov, A B. Padmaperuna, "Materials Design Concepts for Efficient Blue OLEDs: A Joint Theoretical and Experimental Study", Material Matters, Vol 7, No 1, Aldrich Materials Science).

The materials of this invention provide a facile method to satisfy the set of energy alignment requirements in a given material by combining different molecular moieties that carry the desired electronic properties in one molecular glass mixture. The luminescent molecular glass mixtures of this invention provide many design freedoms to simplify the design of these devices. The true non-crystalline nature of these mixtures, their large entropy of mixing values are expected to contribute significantly to device stability and performance.

These examples of materials and applications are not meant to be exhaustive. Although the invention has been described with reference to specific embodiments, it is not intended to be limited thereto, rather those having ordinary skill in the art will recognize that variations and modifications may be made within the scope of the claims.

What is claimed is:

1. A composition comprising
a molecular glass mixture of non-polymeric compounds exhibiting a single thermal transition free of phase separation wherein said molecular glass mixture is characterized as (a) amorphous, (b) solid at about 20° C., and (c) comprises at least two different compounds each different compound having at least two linking components, each linking component joining one multi-valent organic nucleus with at least two organic nuclei wherein at least one of the multivalent organic nucleus and the organic nuclei is a charge transport, a luminescent moiety, or a combination thereof, wherein the molecular glass mixture is non-crystallizable.

2. The composition of claim 1 wherein
the molecular glass mixture of non-polymeric compounds wherein said molecular glass mixture further comprises at least two different compounds each conforming to the formula $(R^1Y^1)_p[(Z^1Y^2)_mR^2Y^3]_nZ^2Y^4R^3;$ wherein
m is zero or one;
n is the number of recurring units in the compound, and is zero up to, but not including, an integer at which said compound starts to become a polymer;
p is an integer of from one to eight;
$R^1$ and $R^3$ each independently represent a monovalent aliphatic or cycloaliphatic hydrocarbon group having 1 to 20 carbon atoms or an aromatic group;
$R^2$, $Z^1$, and $Z^2$ each independently represent multivalent aliphatic or cycloaliphatic hydrocarbon groups having 1 to 20 carbon atoms or an aromatic group; and
$Y^1$, $Y^2$, $Y^3$, and $Y^4$ each independently represent a linking group;
provided that at least one of $R^1$, $Z^1$, $R^2$, $Z^2$, and $R^3$ is a multicyclic aromatic nucleus.

3. The composition of claim 2 wherein at least one of $R^2$, $Z^1$ and $Z^2$ is a multivalent charge-transport moiety, a luminescent moiety, or a combination thereof.

4. The composition of claim 2 wherein at least one of $R^1$ and $R^3$ is a monovalent charge-transport moiety, a luminescent moiety or a combination thereof.

5. The composition of claim 2 wherein at least one of $R^1$ and $R^3$ is a monovalent charge-transport moiety, a luminescent moiety, or a combination thereof; and
at least one of $R^2$, $Z^1$ and $Z^2$ is a multivalent charge-transport moiety, a luminescent moiety or a combination thereof.

6. The composition of claim 2 wherein at least one of $R^2$, $Z^1$ and $Z^2$ is a multivalent charge-transport moiety, a luminescent moiety, or a combination thereof or at least one of $R^1$ and $R^3$ is a monovalent charge-transport moiety, a luminescent moiety or a combination thereof or at least one of $R^2$, $Z^1$ and $Z^2$ is a multivalent charge-transport moiety, a luminescent moiety, or a combination thereof and at least one of $R^1$ and $R^3$ is a monovalent charge-transport moiety, a luminescent moiety or a combination thereof and the monovalent charge-transport moiety is a hole-transport moiety and the multivalent charge-transport moiety is a hole-transport moiety.

7. The composition of claim 2 wherein at least one of $R^2$, $Z^1$ and $Z^2$ is a multivalent charge-transport moiety, a luminescent moiety, or a combination thereof or at least one of $R^1$ and $R^3$, is a monovalent charge-transport moiety, a luminescent moiety or a combination thereof or at least one of $R^2$, $Z^1$ and $Z^2$ is a multivalent charge-transport moiety, a luminescent moiety, or a combination thereof and at least one of $R^1$ and $R^3$ is a monovalent charge-transport moiety, a luminescent moiety or a combination thereof and the monovalent charge-transport moiety is an electron-transport moiety and the multivalent charge-transport moiety is an electron-transport moiety.

8. The composition of claim 5 wherein the monovalent charge transport moiety is a hole-transport moiety and the multivalent charge transport moiety is an electron transport moiety.

9. The composition of claim 5 wherein the monovalent charge transport moiety is an electron-transport moiety and the multivalent transport moiety is a hole-transport moiety.

10. The composition of claim 5 wherein the monovalent charge transport moiety is a mixture of electron-transport and hole-transport moiety and the multivalent transport moiety is a hole-transport moiety.

11. The composition of claim 5 wherein the monovalent charge transport moiety is a mixture of electron-transport and hole-transport moiety and the multivalent transport moiety is an electron-transport moiety.

12. The composition of claim 2 wherein at least one of $R^1$, $R^2$, $R^3$, $Z^1$, and $Z^2$ is a luminescent moiety.

13. The composition of claim 12 wherein the luminescent moiety is a fluorescent moiety.

14. The composition of claim 2 wherein the luminescent moiety is a phosphorescent moiety.

15. The composition of claim 2 wherein the molecular glass mixture is solvent-coatable.

16. The composition of claim 2 wherein the molecular glass mixture is vacuum-coatable.

17. The composition of claim 2 wherein all the components of the molecular glass mixture are asymmetric.

18. The composition of claim 1 further consisting of mixing a non-equilibrium molecular glass, a crystallizable molecule, or a combination thereof with said noncrystallizable molecular glass mixture in a proper ratio to obtain a new noncrystallizable glass mixture, wherein the non-equilibrium glass, the crystallizable molecule, or a combination thereof is charge transporting, luminescent, or a combination thereof.

19. The composition of claim 2 wherein the molecular glass mixture is soluble in a solvent taken from the group consisting of water, acetone, 1-butanol, ethanol, 2-propanol, ethyl acetate, methanol, isopropyl acetate, acetonitrile, tetrahydrofuran, 2-methyltetrahydrofuran, dimethyl sulfoxide, acetic acid, and xylene.

20. A process of making a composition according to claim 1 comprising a molecular glass mixture whereas all the starting materials are pre-purified by recrystallization, distillation, sublimation, or other purification methods.

21. A process of making a composition according to claim 1 comprising a molecular glass mixture wherein in a first step two moles equivalent of an asymmetric bisanhydride are reacted with one mole equivalent of a diamine to form an isomeric asymmetric mixture; wherein the diamine is electron-transporting, hole-transporting, luminescent, fluorescent, phosphorescent, or a combination thereof; in a second step the thus formed isomeric asymmetric mixture is reacted with a stoichiometric mixture of monoamines; wherein the monoamine mixture contains electron conductive moieties, hole conductive moieties, luminescent moieties, or a combination thereof.

22. The process of claim 21 wherein the asymmetric bisanhydride is 2,3,3',4'-Biphenyltetracarboxylic acid dianhydride

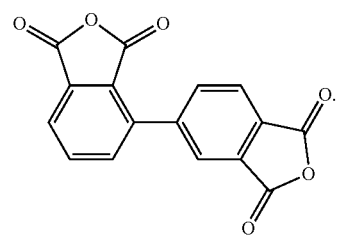 [SMILES: O=C1OC(=O)c2cc(-c3cccc4c3C(=O)OC4=O)ccc21]

23. An organic electronic device wherein at least one of the layers contain a hole-transporting, an electron-transporting, a bipolar, or a luminescent composition, or a combination thereof, wherein the hole-transporting, electron-transporting, bipolar, or luminescent composition is a composition comprising a molecular glass mixture according to claim 1.

24. The organic electronic device of claim 23 wherein the organic electronic device is an organic light emitting diode.

25. The organic electronic device of claim 23 wherein the organic electronic device is a photonic device.

26. The organic electronic device of claim 23 wherein the organic electronic device is a solar cell device.

27. The organic electronic device of claim 23 wherein the organic electronic device is a field-effect transistor.

28. The molecular glass mixture of claim 1 selected from the group consisting of Glass Mixture 1, Glass Mixture 2, Glass Mixture 3, Glass Mixture 4, Glass Mixture 5, Glass Mixture 6, Glass Mixture 7, Glass Mixture 8, Glass Mixture 9, Glass Mixture 10, Glass Mixture 11, Glass Mixture 12, Glass Mixture 13, Glass Mixture 14, Glass Mixture 15, Glass Mixture 16, Glass Mixture 17, Glass Mixture 18, Glass Mixture 19, Glass Mixture 20, Glass Mixture 21, Glass Mixture 22, Glass Mixture 23, Glass Mixture 24, Glass Mixture 25, Glass Mixture 26, Glass Mixture 27, Glass Mixture 28, Molecular Glass Mixture of Example 1, and Molecular Glass Mixture of Example 2.

* * * * *